(12) United States Patent
Inagaki

(10) Patent No.: US 9,956,565 B2
(45) Date of Patent: May 1, 2018

(54) SUBSTRATE TREATING APPARATUS

(71) Applicant: SCREEN Holdings Co., Ltd., Kyoto (JP)

(72) Inventor: Yukihiko Inagaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days. days.

(21) Appl. No.: 15/226,460

(22) Filed: Aug. 2, 2016

(65) Prior Publication Data

US 2017/0053817 A1 Feb. 23, 2017

(30) Foreign Application Priority Data

Aug. 21, 2015 (JP) ................. 2015-163614

(51) Int. Cl.
| | |
|---|---|
| H01L 21/67 | (2006.01) |
| B05B 1/24 | (2006.01) |
| B05C 13/00 | (2006.01) |
| B05C 13/02 | (2006.01) |
| H01L 21/677 | (2006.01) |

(52) U.S. Cl.
CPC ............. B05B 1/24 (2013.01); B05C 13/00 (2013.01); B05C 13/02 (2013.01); H01L 21/67161 (2013.01); H01L 21/67173 (2013.01); H01L 21/67178 (2013.01); H01L 21/67276 (2013.01); H01L 21/67745 (2013.01)

(58) Field of Classification Search
CPC ....... B05C 13/00; B05C 13/02; B05C 13/025; B05C 9/08; B05C 9/10; B05C 9/12; B05C 9/14; B05B 1/24; H01L 21/67161; H01L 21/67745; H01L 21/67178; H01L 21/67276; H01L 21/67173

USPC ............. 118/500, 52, 56, 58, 66, 319, 320; 134/902; 414/222.01, 935; 396/611, 396/571; 355/27

See application file for complete search history.

(56) References Cited

U.S. PATENT DOCUMENTS

| | | | | |
|---|---|---|---|---|
| 7,645,081 | B2 * | 1/2010 | Hara | ................... G03F 7/70525 |
| | | | | 118/66 |
| 2003/0213431 | A1 * | 11/2003 | Fukutomi | ......... H01L 21/67173 |
| | | | | 118/696 |
| 2003/0217695 | A1 * | 11/2003 | Fukutomi | ......... H01L 21/67017 |
| | | | | 118/666 |

(Continued)

FOREIGN PATENT DOCUMENTS

JP 2009-010291 1/2009

OTHER PUBLICATIONS

Office Action and Search Report for Corresponding Taiwan Patent Application No. 105122093 dated Oct. 6, 2017.

*Primary Examiner* — Laura Edwards
(74) *Attorney, Agent, or Firm* — Ostrolenk Faber LLP

(57) ABSTRACT

A substrate treating apparatus includes a front heat-treating block, a front relay block and a solution treating block. The front heat-treating block has heat-treating units and main transport mechanisms. The front relay block has receivers and transport mechanisms. The solution treating block has solution treating units and transport mechanisms for solution treatment. The front heat-treating block and front relay block are connected to be able to transport substrates reciprocally. The front relay block and solution treating block are connected to be able to transport the substrates reciprocally. The front relay block is disposed between the solution treating block and front heat-treating block.

17 Claims, 26 Drawing Sheets

(56) References Cited

U.S. PATENT DOCUMENTS

2009/0169344 A1* 7/2009 Nozawa ............... C23C 16/54
　　　　　　　　　　　　　　　　　　　　　414/221
2012/0015307 A1* 1/2012 Matsuoka ............ G03F 7/162
　　　　　　　　　　　　　　　　　　　　　430/325
2012/0145074 A1 6/2012 Fukutomi et al. ............ 118/58

* cited by examiner

Fig. 30

| 13 | TA1 | TA2 | TBR | TC1 | TC3 | TC5 | TC7 | TDR | TE1 | TE2 | TFR | BHU |
|---|---|---|---|---|---|---|---|---|---|---|---|---|
| C ↓ SPA1R /SPA2R | HPaA1R ↓ HPbA1R | HPaA2R ↓ HPbA2R | SPA1R/SPA2R ↓ AIIPA1R/AIIPA2R ↓ PCPB1 | PCPB1 ↓ SC1 ↓ RPB1 | PCPB3 ↓ SC3 ↓ SPD3 | PCPB5 ↓ SC5 ↓ SPD5 | | SPD3 ↓ HPaE1R/HPaE2R ↓ PCPD5 | HPbE1R ↓ CPE1R ↓ EEWE1R | HPbE2R ↓ CPE2R ↓ EEWE2R | EEWE1R/ EEWE2R ↓ SPF1 ↓ BSFR ↓ PCPF | PCPF ↓ EXP ↓ RPFB |
| | | | RPB1 ↓ HPaA1R/HPaA2R | | | | | SPD5 ↓ HPbE1R/HPbE2R | | | | |
| RPA1R /RPA2R ↓ C | HPcA1R ↓ CPB4 ↓ RPA1R | HPcA2R ↓ CPB5 ↓ RPA2R | HPbA1R/HPbA2R ↓ PCPB3 | | | | PCPD7 ↓ SC7 ↓ RPB7 | RPE1 ↓ PCPD7 | | | RPFB ↓ SOR ↓ PEBR ↓ RPE1 | |
| | | | RPB7 ↓ HPcA1R/HPcA2R | | | | | | | | | |
| C ↓ SPA1L /SPA2L | HPaA1L ↓ HPbA1L | HPaA2L ↓ HPbA2L | SPA1L/SPA2L ↓ AHPA1L/AHPA2L ↓ PCPB2 | PCPB2 ↓ SC2 ↓ RPB2 | PCPB4 ↓ SC4 ↓ SPD4 | PCPB6 ↓ SC6 ↓ SPD6 | TC8 | TDL ↓ SPD4 ↓ HPaE1L/HPaE2L ↓ PCPD6 | HPbE1L ↓ CPE1L ↓ EEWE1L | HPbE2L ↓ CPE2L ↓ EEWE2L | TFL EEWE1L/ EEWE2L ↓ SPF2 ↓ BSFL ↓ PCPF | |
| | | | RPB2 ↓ HPaA1L/HPaA2L | | | | | SPD6 ↓ HPbE1L/HPbE2L | | | | |
| RPA1L /RPA2L ↓ C | HPcA1L ↓ CPB4 ↓ RPA1L | HPcA2L ↓ CPB5 ↓ RPA2L | HPbA1L/HPbA2L ↓ PCPB4 | | | | PCPD8 ↓ SC8 ↓ RPB8 | RPE2 ↓ PCPD8 | | | RPFB ↓ SOL ↓ PEBL ↓ RPE2 | |
| | | | RPB8 ↓ HPcA1L/HPcA2L | | | | | | | | | |

SUBSTRATE TREATING APPARATUS

CROSS-REFERENCE TO RELATED APPLICATIONS

This application claims priority to Japanese Patent Application No. 2015-163614 filed Aug. 21, 2015, the disclosure of which is hereby incorporated herein by reference in its entirety for all-purposes.

BACKGROUND OF THE INVENTION (1) Field of the Invention

This invention relates to a substrate treating apparatus for treating semiconductor wafers, glass substrates for photomasks, glass substrates for liquid crystal displays, substrates for optical disks and so on (hereinafter called simply substrates).

(2) Description of the Related Art

Conventionally, this type of apparatus includes a substrate treating apparatus having solution treating units for performing solution treatment of substrates, and heat-treating units for heat-treating the substrates. This substrate treating apparatus can carry out a series of treatments including the solution treatment and heat treatment for the substrates (as disclosed in Japanese Unexamined Patent Publication No. 2009-010291, for example). Here, the solution treatment includes, for example, treatment for applying a resist film material to the substrates, and treatment for supplying a developer to the substrate.

The conventional apparatus with such a construction has the following drawbacks.

The conventional apparatus has the solution treating units and heat-treating units arranged in a high density. For example, the solution treating units and heat-treating units are arranged in the same block. For example, the solution treating units and heat-treating units are opposed to each other across a transporting space. There is therefore a possibility that the solution treating units are influenced by the heat-treating units. Specifically, a treating temperature in the solution treating units can vary under the influence of the heat-treating units. There is also a possibility that the cleanliness of atmosphere in the solution treating units may be lowered by the atmosphere emitted from the heat-treating units to the transporting space.

SUMMARY OF THE INVENTION

This invention has been made having regard to the state of the art noted above, and its object is to provide a substrate treating apparatus which can reduce influences of heat-treating units on solution treating units.

The above object is fulfilled, according to this invention, by a substrate treating apparatus comprising a front heat-treating block; a front relay block; and a solution treating block; the front heat-treating block including heat-treating units for heat-treating substrates, and main transport mechanisms for transporting the substrates to the heat-treating units of the front heat-treating block; the front relay block including receivers for receiving the substrates, and transport mechanisms for transporting the substrates to the receivers of the front relay block; the solution treating block including solution treating units for performing solution treatment of the substrates, and transport mechanisms for solution treatment for transporting the substrates to the solution treating units; wherein the front heat-treating block and the front relay block are connected to be able to transport the substrates reciprocally; the front relay block and the solution treating block are connected to be able to transport the substrates reciprocally; and the front relay block is disposed between the solution treating block and the front heat-treating block.

In the substrate treating apparatus according to this invention, the front relay block is disposed between the solution treating block and the front heat-treating block. The front relay block includes the receivers and transport mechanisms. Therefore, the receivers and transport mechanisms of the front relay block are arranged between the solution treating units of the solution treating block and the heat-treating units of the front heat-treating block. The receivers and transport mechanisms of the front relay block effectively prevent heat and atmosphere emitted from the heat-treating units of the front heat-treating block from reaching the solution treating units. This arrangement can therefore reduce the influence of the heat-treating units of the front heat-treating block exerted on the solution treating units. That is, the solution treating units are hardly influenced by the heat-treating units.

In the above invention, it is preferred that, in plan view, the front heat-treating block, the front relay block and the solution treating block are aligned in this order. Such arrangement is effective for increasing a separating distance between the heat-treating units of the front heat-treating block and the solution treating units.

In the above invention, it is preferred that the front heat-treating block has a transporting space in which the main transport mechanisms of the front heat-treating block are installed; the solution treating block has a transporting space in which the transport mechanisms for solution treatment are installed; and the receivers of the front relay block are arranged between the transporting space of the front heat-treating block and the transporting space of the solution treating block. The receivers of the front relay block can effectively prevent the atmosphere in the transporting space of the front heat-treating block from flowing into the transporting space of the solution treatment block.

In the above invention, it is preferred that the main transport mechanisms of the front heat-treating block include a first main transport mechanism for transporting the substrates to the heat-treating units of the front heat-treating block, and a second main transport mechanism for transporting the substrates to the heat-treating units of the front heat-treating block; the transport mechanisms of the front relay block include a first transport mechanism for transporting the substrates to the receivers of the front relay block, and a second transport mechanism for transporting the substrates to the receivers of the front relay block; the transport mechanisms for solution treatment of the solution treating block include a first transport mechanism for solution treatment for transporting the substrates to the solution treating units, and a second transport mechanism for solution treatment for transporting the substrates to the solution treating units; the first main transport mechanism of the front heat-treating block, the first transport mechanism of the front relay block and the first transport mechanism for solution treatment of the solution treating block transport first substrates; and the second main transport mechanism of the front heat-treating block, the second transport mechanism of the front relay block and the second transport mechanism for solution treatment of the solution treating block transport second substrates different from the first substrates. Assuming that the transport mechanisms which transport the first substrates are called "first transport mechanism group", the first main transport mechanism of the front heat-treating block, the first transport mechanism of the front relay block and the first transport mechanism for solution treatment of the solution treating block belong to the first transport mechanism group. Assuming that the transport mechanisms which transport the second substrates are called "second transport mechanism group", the second main transport mechanism of the front heat-treating block, the second transport mechanism of the front relay block and the second transport mechanism for solution treatment of the solution treating block belong to the second transport mechanism group. Here, since there is no transport mechanism included in both the first transport mechanism group and the second transport mechanism group, substrate transportation by the first transport mechanism group and substrate transportation by the second transport mechanism group are independent of each other. It is therefore possible to carry out in parallel the substrate transportation by the first transport mechanism group and substrate transportation by the second transport mechanism group. This can promote the operating rate of the substrate treating apparatus. Further, the first transport mechanism group and the second transport mechanism group can be prevented from influencing each other. For example, even when a trouble occurs with the substrate transportation by the first transport mechanism group, the substrate transportation by the second transport mechanism group can proceed without delay.

In the above invention, it is preferred that the heat-treating units of the front heat-treating block include a plurality of first heat-treating units for heat-treating first substrates, and a plurality of second heat-treating units for heat-treating second substrates different from the first substrates; the receivers of the front relay block include at least one first receiver for receiving the first substrates, and at least one second receiver for receiving the second substrates; and the solution treating units include a plurality of first solution treating units for performing solution treatment of the first substrates; and a plurality of second solution treating units for performing solution treatment of the second substrates. The first heat-treating units, the first receiver and the first solution treating units receive only the first substrates, and the second heat-treating units, the second receiver and the second solution treating units receive only the second substrates. The first substrates are transported along a first route which connects the first heat-treating units, the first receiver and the first solution treating units. On the other hand, the second substrates are transported along a second route which connects the second heat-treating units, the second receiver and the second solution treating units. Note here that there is no treating unit or receiver that is common to the first route and second route, and the first route and second route are completely separated. Therefore, even when a trouble occurs with substrate transportation along the first route, for example, substrate transportation along the second route can proceed without delay. Further, the front heat-treating block includes a plurality of first heat-treating units, and the solution treating block includes a plurality of first solution treating units. Therefore, even when part of the first heat-treating units or part of the first solution treating units break down, the substrate transportation along the first route can be continued by transporting the substrates to the other first heat-treating units or the other first solution treating units. Similarly, the substrate transportation along the second route is not easily influenced by trouble occurring with the second heat-treating units or the second solution treating units.

In another aspect of this invention, a substrate treating apparatus comprises a front heat-treating block; a front relay block; a solution treating block; a rear relay block; and a rear heat-treating block; the front heat-treating block including heat-treating units for heat-treating substrates, and main transport mechanisms for transporting the substrates to the heat-treating units of the front heat-treating block; the front relay block including receivers for receiving the substrates, and transport mechanisms for transporting the substrates to the receivers of the front relay block; the solution treating block including solution treating units for performing solution treatment of the substrates, and transport mechanisms for solution treatment for transporting the substrates to the solution treating units; the rear relay block including receivers for receiving the substrates, and transport mechanisms for transporting the substrates to the receivers of the rear relay block; the rear heat-treating block including heat-treating units for heat-treating the substrates, and main transport mechanisms for transporting the substrates to the heat-treating units of the rear heat-treating block; wherein the front heat-treating block and the front relay block are connected to be able to transport the substrates reciprocally; the front relay block and the solution treating block are connected to be able to transport the substrates reciprocally; the solution treating block and the rear relay block are connected to be able to transport the substrates reciprocally; the rear relay block and the rear heat-treating block are connected to be able to transport the substrates reciprocally; the front relay block is disposed between the solution treating block and the front heat-treating block; and the rear relay block is disposed between the solution treating block and the rear heat-treating block.

In the substrate treating apparatus according to this invention, the front relay block is disposed between the solution treating block and the front heat-treating block. The front relay block includes the receivers and transport mechanisms. Therefore, the receivers and transport mechanisms of the front relay block are arranged between the solution treating units of the solution treating block and the heat-treating units of the front heat-treating block. The receivers and transport mechanisms of the front relay block effectively prevent heat and atmosphere emitted from the heat-treating units of the front heat-treating block from reaching the solution treating units. This arrangement can therefore reduce the influence of the heat-treating units of the front heat-treating block exerted on the solution treating units.

The rear relay block is disposed between the solution treating block and the rear heat-treating block. The rear relay block is a block that includes the receivers and transport mechanisms. Therefore, the receivers and transport mechanisms of the rear relay block are arranged between the solution treating units of the solution treating block and the heat-treating units of the rear heat-treating block. The receivers and transport mechanisms of the rear relay block effectively prevent heat and atmosphere emitted from the heat-treating units of the rear heat-treating block from reaching the solution treating units. This arrangement can therefore reduce the influence of the heat-treating units of the rear heat-treating block exerted on the solution treating units. That is, the solution treating units are hardly influenced by the heat-treating units.

In the above invention, it is preferred that, in plan view, the front heat-treating block, the front relay block, the solution treating block, the rear relay block and the rear heat-treating block are aligned in this order. Such arrangement is effective for increasing a separating distance between the heat-treating units of the front heat-treating block and the solution treating units of the solution treating block. Further, the heat-treating units of the rear heat-treating block can effectively be kept away from the solution treating units.

In the above invention, it is preferred that the front heat-treating block has a transporting space in which the main transport mechanisms of the front heat-treating block are installed; the solution treating block has a transporting space in which the transport mechanisms for solution treatment are installed; the rear heat-treating block has a transporting space in which the main transport mechanisms of the rear heat-treating block are installed; the receivers of the front relay block are arranged between the transporting space of the front heat-treating block and the transporting space of the solution treating block; and the receivers of the rear relay block are arranged between the transporting space of the solution treating block and the transporting space of the rear heat-treating block. The receivers of the front relay block can effectively prevent the atmosphere in the transporting space of the front heat-treating block from flowing into the transporting space of the solution treatment block. Further, the receivers of the rear relay block can effectively prevent the atmosphere in the transporting space of the rear heat-treating block from flowing into the transporting space of the solution treatment block.

In the above invention, it is preferred that the main transport mechanisms of the front heat-treating block include a first main transport mechanism for transporting the substrates to the heat-treating units of the front heat-treating block, and a second main transport mechanism for transporting the substrates to the heat-treating units of the front heat-treating block; the transport mechanisms of the front relay block include a first transport mechanism for transporting the substrates to the receivers of the front relay block, and a second transport mechanism for transporting the substrates to the receivers of the front relay block; the transport mechanisms for solution treatment of the solution treating block include a first transport mechanism for solution treatment for transporting the substrates to the solution treating units, and a second transport mechanism for solution treatment for transporting the substrates to the solution treating units; the transport mechanisms of the rear relay block include a first transport mechanism for transporting the substrates to the receivers of the rear relay block, and a second transport mechanism for transporting the substrates to the receivers of the rear relay block; the main transport mechanisms of the rear heat-treating block include a first main transport mechanism for transporting the substrates to the heat-treating units of the rear heat-treating block, and a second main transport mechanism for transporting the substrates to the heat-treating units of the rear heat-treating block; the first main transport mechanism of the front heat-treating block, the first transport mechanism of the front relay block, the first transport mechanism for solution treatment of the solution treating block, the first transport mechanism of the rear relay block and the first main transport mechanism of the rear heat-treating block transport first substrates; and the second main transport mechanism of the front heat-treating block, the second transport mechanism of the front relay block, the second transport mechanism for solution treatment of the solution treating block, the second transport mechanism of the rear relay block and the second main transport mechanism of the rear heat-treating block transport second substrates different from the first substrates. Assuming that the transport mechanisms which transport the first substrates are called "first transport mechanism group", the first main transport mechanism of the front heat-treating block, the first transport mechanism of the front relay block, the first transport mechanism for solution treatment of the solution treating block, the first transport mechanism of the rear relay block and the first main transport mechanism of the rear heat-treating block belong to the first transport mechanism group. Assuming that the transport mechanisms which transport the second substrates are called "second transport mechanism group", the second main transport mechanism of the front heat-treating block, the second transport mechanism of the front relay block, the second transport mechanism for solution treatment of the solution treating block, the second transport mechanism of the rear relay block and the second main transport mechanism of the rear heat-treating block belong to the second transport mechanism group. Here, since there is no transport mechanism included in both the first transport mechanism group and the second transport mechanism group, substrate transportation by the first transport mechanism group and substrate transportation by the second transport mechanism group are independent of each other. It is therefore possible to carry out in parallel the substrate transportation by the first transport mechanism group and substrate transportation by the second transport mechanism group. This can promote the operating rate of the substrate treating apparatus. Further, the first transport mechanism group and the second transport mechanism group can be prevented from influencing each other. For example, even when a trouble occurs with the substrate transportation by the first transport mechanism group, the substrate transportation by the second transport mechanism group can proceed without delay.

In the above invention, it is preferred that the heat-treating units of the front heat-treating block include a plurality of first heat-treating units for heat-treating first substrates, and a plurality of second heat-treating units for heat-treating second substrates; the receivers of the front relay block include at least one first receiver for receiving the first substrates, and at least one second receiver for receiving the second substrates; the solution treating units include a plurality of first solution treating units for performing solution treatment of the first substrates, and a plurality of second solution treating units for performing solution treatment of the second substrates; the receivers of the rear relay block include at least one first receiver for receiving the first substrates, and at least one second receiver for receiving the second substrates; and the heat-treating units of the rear heat-treating block include a plurality of first heat-treating units for heat-treating the first substrates, and a plurality of second heat-treating units for heat-treating the second substrates. The first heat-treating units of the front/rear heat treating blocks, the first receivers of the front/rear relay blocks and the first solution treating units of the solution treating block receive only the first substrates. On the other hand, the second heat-treating units of the front/rear heat treating blocks, the second receivers of the front/rear relay blocks and the second solution treating units of the solution treating block receive only the second substrates. The first substrates are transported along a first route which connects the first heat-treating units of the front/rear heat treating blocks, the first receivers of the front/rear relay blocks and the first solution treating units of the solution treating block. On the other hand, the second substrates are transported along a second route which connects the second heat-treating units of the front/rear heat treating blocks, the second receivers of the front/rear relay blocks and the second solution treating units of the solution treating block. Note here that there is no treating unit or receiver that is common to the first route and second route, and the first route and second route are completely separated. Therefore, even when a trouble occurs with substrate transportation along the first route, for example, substrate transportation along the second route can proceed without delay. Further, each of the front/rear heat-treating blocks includes a plurality of first heat-treating units, and the solution treating block includes a plurality of first solution treating units. Therefore, even when part of the first heat-treating units or part of the first solution treating units break down, the substrate transportation along the first route can be continued by transporting the substrates to the other first heat-treating units or the other first solution treating units. Similarly, the substrate transportation along the second route is not easily influenced by trouble occurring with the second heat-treating units or the second solution treating units.

In the above invention, it is preferred that the plurality of receivers of the front relay block are arranged in an up-down direction; the plurality of transport mechanisms of the front relay block are arranged laterally of the receivers of the front relay block; the plurality of transport mechanisms for solution treatment are arranged in the up-down direction; and the receivers of the front relay block are arranged so that each of the transport mechanisms for solution treatment is opposed to at least one of the receivers of the front relay block. With this construction, the transport mechanisms for solution treatment arranged in the up-down direction, respectively, can transfer substrates to the transport mechanisms of the front relay block, and can receive substrates from the transport mechanisms of the front relay block.

In the above invention, it is preferred that the plurality of main transport mechanisms of the front heat-treating block are arranged in one of the up-down direction and a transverse direction; and the receivers of the front relay block are arranged so that each of the main transport mechanisms of the front heat-treating block is opposed to at least one of the receivers of the front relay block. With this construction, whether the plurality of main transport mechanisms of the front heat-treating block are arranged in the up-down direction or in the transverse direction, the main transport mechanisms of the front heat-treating block, respectively, can transfer substrates to the transport mechanisms of the front relay block, and can receive substrates from the transport mechanisms of the front relay block.

In the above invention, it is preferred that at least one of the receivers of the front relay block is disposed in a position opposed to both of at least one of the main transport mechanisms of the front heat-treating block and at least one of the transport mechanisms for solution treatment of the solution treating block. The main transport mechanisms of the front heat-treating block and the transport mechanisms for solution treatment of the solution treating block can transport the substrates reciprocally through the receivers of the front relay block which are opposed to both of the main transport mechanisms of the front heat-treating block and the transport mechanisms for solution treatment of the solution treating block. That is, the main transport mechanisms of the front heat-treating block and the transport mechanisms for solution treatment of the solution treating block can transport the substrates reciprocally without using the transport mechanisms of the front relay block. The substrates can therefore be transported efficiently between the front heat-treating block and the solution treating block.

In the above invention, it is preferred that the front heat-treating block includes a plurality of receivers for receiving the substrates; the plurality of receivers of the front heat-treating block are arranged in the up-down direction laterally of the main transport mechanisms of the front heat-treating block; and the receivers of the front heat-treating block are arranged so that each of the transport mechanisms of the front relay block is opposed to at least one of the receivers of the front heat-treating block. The main transport mechanisms of the front heat-treating block and the transport mechanisms of the front relay block not only can transport the substrates reciprocally through the receivers of the front relay block, but can transport the substrates reciprocally through the receivers of the front heat-treating block. This can promote the reliability of substrate transportation between the front heat-treating block and the front relay block.

In the above invention, it is preferred that the receivers of the front heat-treating block are open to an indexer section connected to the front heat-treating block; and the main transport mechanisms of the front heat-treating block and the indexer section transport the substrates reciprocally through the receivers of the front heat-treating block. Thus, the substrates can be transported conveniently between the front heat-treating block and the indexer section.

In the above invention, it is preferred that at least one of the receivers of the front heat-treating block is opposed to at least one of transport mechanisms of the front relay block, and is open to an indexer section connected to the front heat-treating block. The transport mechanisms of the front relay block and the indexer section can transport the substrates reciprocally through the receivers of the front heat-treating block. That is, the transport mechanisms of the front relay block and the indexer section can transport the substrates reciprocally without using the main transport mechanisms of the front heat-treating block. The substrates can therefore be transported efficiently between the front relay block and the indexer section.

In the above invention, it is preferred that the solution treating units include coating units for coating the substrates with a coating film material, and developing units for supplying a developer to the substrates. This can form coating film on the substrates, and can also develop the substrates.

In the above invention, it is preferred that the front relay block includes an in-buffer for accumulating substrates to be treated in the substrate treating apparatus, and an out-buffer for accumulating substrates having undergone a series of treatments in the substrate treating apparatus. The substrate treating apparatus can treat the substrates to be treated which are accumulated in the in-buffer, and can accumulate treated substrates in the out-buffer. This can inhibit a reduction in production capacity of the substrate treating apparatus even when there occurs a stoppage in supply of the substrates to the substrate treating apparatus or collection of the substrates from the substrate treating apparatus.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 30 is a view schematically showing examples of operation repeatedly carried out by the respective transport mechanisms;

DESCRIPTION OF THE PREFERRED EMBODIMENTS

Embodiment 1 of this invention will be described hereinafter with reference to the drawings.
<Outline of Substrate Treating Apparatus>

Figure 1:
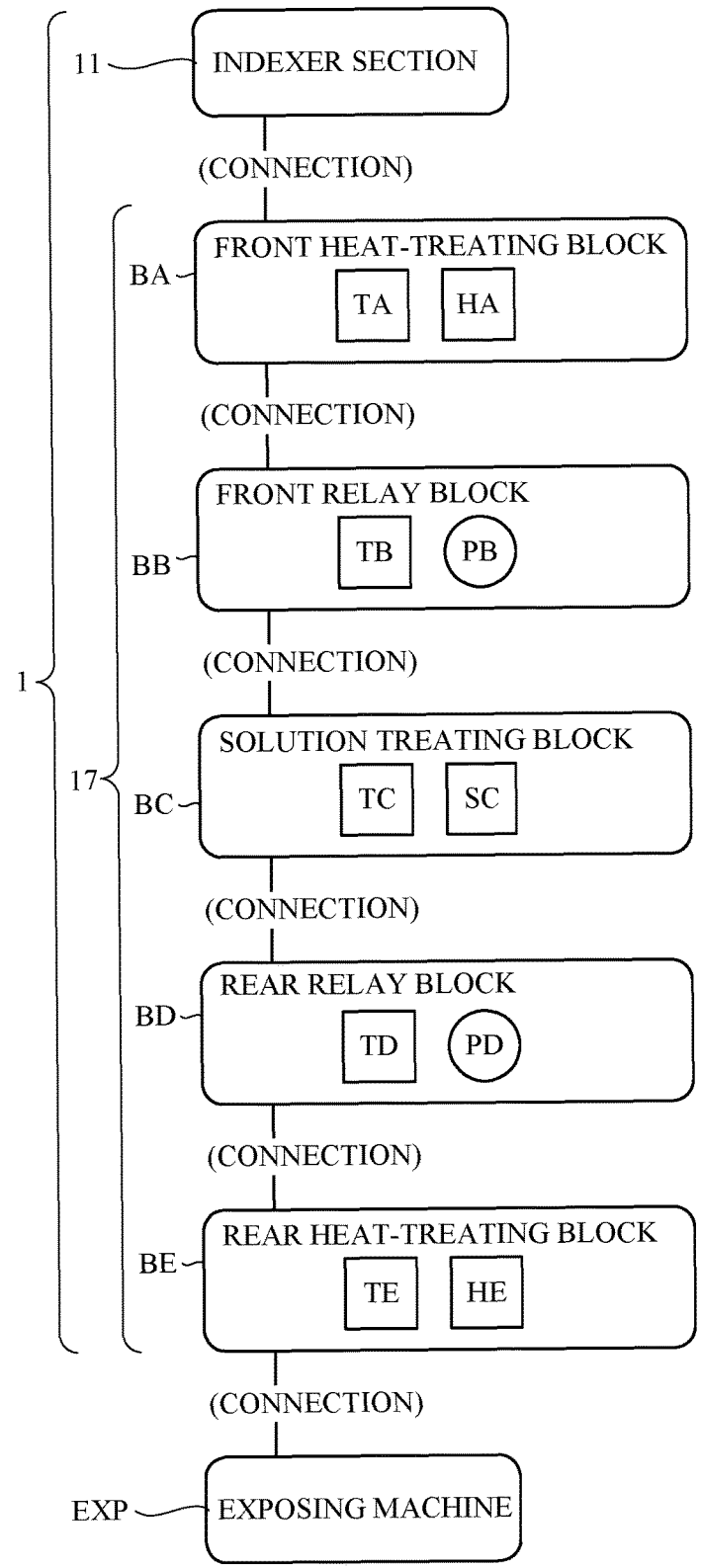
FIG. 1 is a conceptual diagram of a substrate treating apparatus according to Embodiment 1.

FIG. 1 is a conceptual diagram of a substrate treating apparatus according to Embodiment 1. Embodiment 1 provides a substrate treating apparatus for carrying out a series of treatments including solution treatment and heat treatment for substrates (e.g. semiconductor wafers) W. The wafers W will be depicted in FIG. 2 et seq. described hereinafter.

The substrate treating apparatus 1 includes an indexer section 11 and a treating section 17. The indexer section 11 transports the wafers W to the treating section 17. The treating section 17 performs treatment of the wafers W. The indexer section 11 and treating section 17 are connected directly and can transport the wafers W reciprocally. The term "transport reciprocally" means both cases where the wafers W are transported from one to the other, and where the wafers W are transported from the other to the one.

Further, the substrate treating apparatus 1 is connected to an exposing machine EXP. More particularly, the treating section 17 and exposing machine EXP are directly connected, and can transport the wafers W reciprocally. The exposing machine EXP is an external device of the substrate treating apparatus 1. The exposing machine EXP performs exposing treatment of the wafers W.

The treating section 17 includes a heat-treating block BA, a relay block BB, a solution treating block BC, a relay block BD and a heat-treating block BE. The heat-treating blocks BA and BE perform heat treatment of the wafers W, respectively. The relay blocks BB and BD relay the wafers W, respectively. The solution treating block BC performs solution treatment of the wafers W.

Blocks BA, BB, BC, BD and BE are linked together in this order. Blocks BA-BB are directly connected and can transport the wafers W reciprocally. Similarly, each pair of blocks BB-BC, BC-BD and BD-BE is directly connected and can transport the wafers W reciprocally to each other. However, block BA is not directly connected to block BC, BD or BE. Block BB is not directly connected to block BD or BE. Block BC is not directly connected to block BA or BE.

With regard to the functions of the blocks, the array of the functions from block BA to block BE is as follows:

Array of functions: heat treatment→relay→solution treatment→relay→heat treatment This array of functions is the same as a reversed array of functions (that is, from block BE to block BA).

The front heat-treating block BA is further connected directly to the indexer section 11. The rear heat-treating block BE is further connected directly to the exposing machine EXP.

In the following description, the heat-treating block BA will be called "front heat-treating block BA", and the heat-treating block BE "rear heat-treating block BA." Similarly, the relay block BB will be called "front relay block BB", and the relay block BD "rear relay block BD."

The front heat-treating block BA has heat-treating units HA and main transport mechanisms TA. The heat-treating units HA perform heat treatment of the wafers W. The heat treatment is heating treatment or cooling treatment, for example. The main transport mechanisms TA transport the wafers W to the heat-treating units HA. The main transport mechanism TA does not mean what is called a local transport mechanism (which is a mechanism provided for each heat-treating unit exclusively for loading and unloading the substrates into/out of one heat-treating unit).

The front relay block BB has receivers PB and transport mechanisms TB. The receivers PB receive and hold the wafers W. The transport mechanisms TB transport the wafers W to the receivers PB.

The solution treating block BC has solution treating units SC and transport mechanisms for solution treatment TC. The solution treating units SC perform solution treatment of the wafers W. The solution treatment is treatment for supplying treating solutions to the wafers W. The treating solutions are a coating film material and a developer, for example. That is, the solution treatment includes coating treatment and developing treatment, for example. The transport mechanisms for solution treatment TC transport the wafers W to the solution treating units SC.

The rear relay block BD has receivers PD and transport mechanisms TD. The receivers PD receive and hold the wafers W. The transport mechanisms TD transport the wafers W to the receivers PD.

The rear heat-treating block BE has heat-treating units HE and main transport mechanisms TE. The heat-treating units HE perform heat treatment of the wafers W. The main transport mechanisms TE transport the wafers W to the heat-treating units HE. The main transport mechanism TE does not mean what is called a local transport mechanism.

For example, a simple reference to the "heat-treating units HA" means the heat-treating units of the front heat-treating block BA, and does not mean the heat-treating units of the rear heat-treating block BE. Note that the other members given the same names are similarly distinguished by the signs affixed thereto.

The transport mechanisms adjacent each other transport the wafers W reciprocally. Specifically, the transport mechanisms TA-TB transport the wafers W reciprocally. Similarly, each pair of transport mechanisms TB-TC, TC-TD and TD-TE transport the wafers W reciprocally. Further, the main transport mechanisms TA and the indexer section 11 transport the wafers W reciprocally. The main transport mechanisms TE and the exposing machine EXP transport the wafers W reciprocally.

The substrate treating apparatus 1 operates as follows, for example. It transports wafers W from the indexer section 11 to the treating section 17. The treating section 17 treats the wafers W. Specifically, the solution treating units SC perform solution treatment (e.g. coating treatment) of the wafers W, and the heat-treating units HE perform heat treatment of the wafers W. Consequently, coating film is formed on the wafers W. The wafers W with the coating film formed thereon are transported from the treating section 17 to the exposing machine EXP. The exposing machine EXP exposes the wafers W. The exposed wafers W are transported from the exposing machine EXP to the treating section 17. The treating section 17 treats the exposed wafers W. Specifically, the solution treating units SC perform solution treatment (e.g. developing treatment) of the wafers W, and the heat-treating units HA perform heat treatment of the wafers W. Consequently, the wafers W are developed. The developed wafers W are transported from the treating section 17 to the indexer section 11.

In the substrate treating apparatus 1 constructed in this way, the front relay block BB is disposed between the front heat-treating block BA and solution treating block BC. That is, the front heat-treating block BA and solution treating block BC are not connected directly. The front relay block BB includes the receivers PB and transport mechanisms TB. Therefore, the receivers PB and transport mechanisms TB are arranged between the solution treating units SC and heat-treating units HA. The receivers PB and transport mechanisms TB effectively prevent heat and atmosphere emitted from the heat-treating units HA from reaching the solution treating units SC. That is, this arrangement can reduce the influence of the heat-treating units HA exerted on the solution treating units SC. In other words, the solution treating units SC are hardly influenced by the heat-treating units HA. As a result, the solution treating units SC can perform solution treatment with high quality.

The rear relay block BD is disposed between the solution treating block BC and rear heat-treating block BE. That is, the solution treating block BC and rear heat-treating block BE are not connected directly. Here, the rear relay block BD has the receiver PD and transport mechanisms TD. Therefore, the receivers PD and transport mechanisms TD are arranged between the solution treating units SC and heat-treating units HE. The receivers PD and transport mechanisms TD effectively prevent heat and atmosphere emitted from the heat-treating units HE from reaching the solution treating units SC. That is, this arrangement can reduce the influence of the heat-treating units HE exerted on the solution treating units SC. As a result, the solution treating units SC can perform solution treatment with further improved quality.

The construction of the substrate treating apparatus 1 will be described in greater detail hereinafter.

<Overall Construction of Substrate Treating Apparatus 1>

Figure 2:
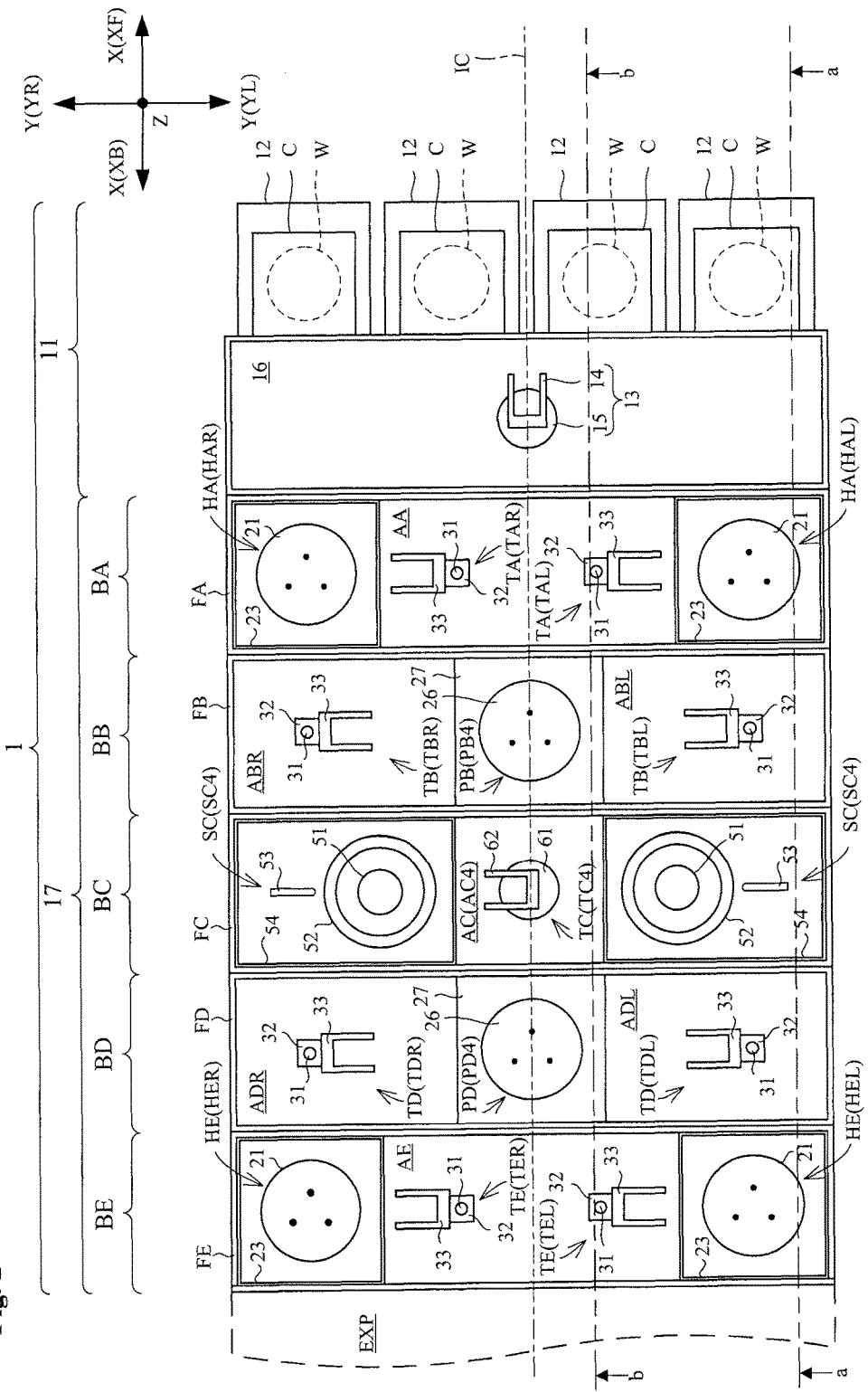
FIG. 2 is a plan view of the substrate treating apparatus according to Embodiment 1.

FIG. 2 is a plan view of the substrate treating apparatus 1 according to Embodiment 1.

The blocks BA, BB, BC, BD and BE are arranged in a row. The direction of arrangement of the blocks BA, BB, BC, BD and BE is horizontal.

Here, the direction of arrangement of the blocks BA, BB, BC, BD and BE will be called "fore-and-aft direction X". In particular, the direction from block BE toward block BA will be called "forward XF", and the direction opposite to forward XF will be called "backward or rearward XB". A horizontal direction perpendicular to the fore-and-aft direction X will be called "transverse direction Y", or simply "lateral(ly) or side(s)". Further, one direction in the "transverse direction Y" will be called "right side YR" and the other, opposite direction "left side YL", as appropriate. The vertical direction will be called "up-down direction Z".

Each of the blocks BA, BB, BC, BD and BE is shaped substantially rectangular in plan view. The blocks BA, BB, BC, BD and BE have substantially the same length in the transverse direction Y. The entire treating section 17 is also shaped substantially rectangular in plan view.

The indexer section 11, treating section 17 and exposing machine EXP are also aligned in this order in the fore-and-aft direction X. The indexer section 11 is connected to a front face of the front heat-treating block BA. The exposing machine EXP is connected to a back face of the rear heat-treating block BE.

<Indexer Section 11>

Figure 3:
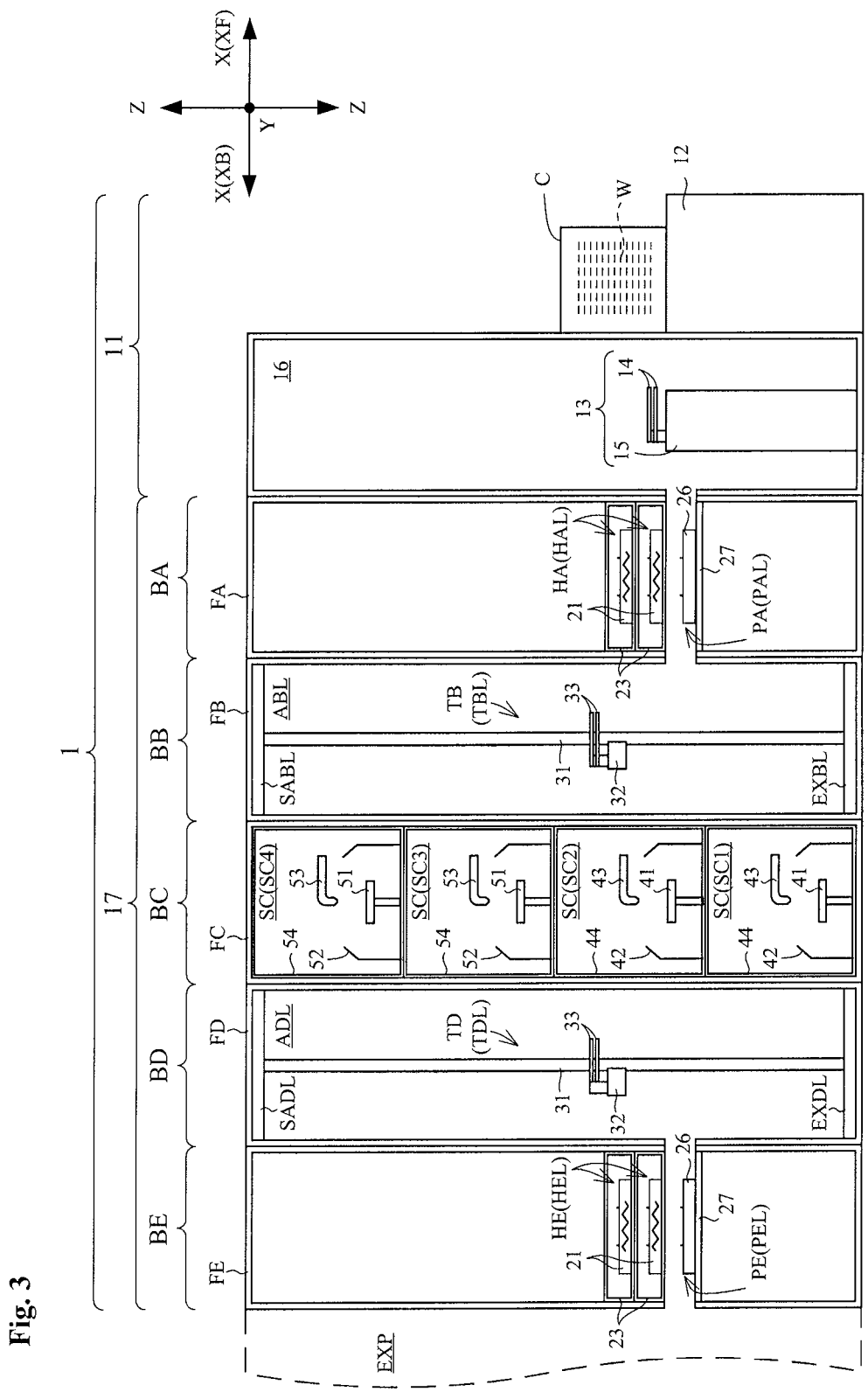
FIG. 3 is a side view taken on line a-a of FIG. 2.
Figure 4:
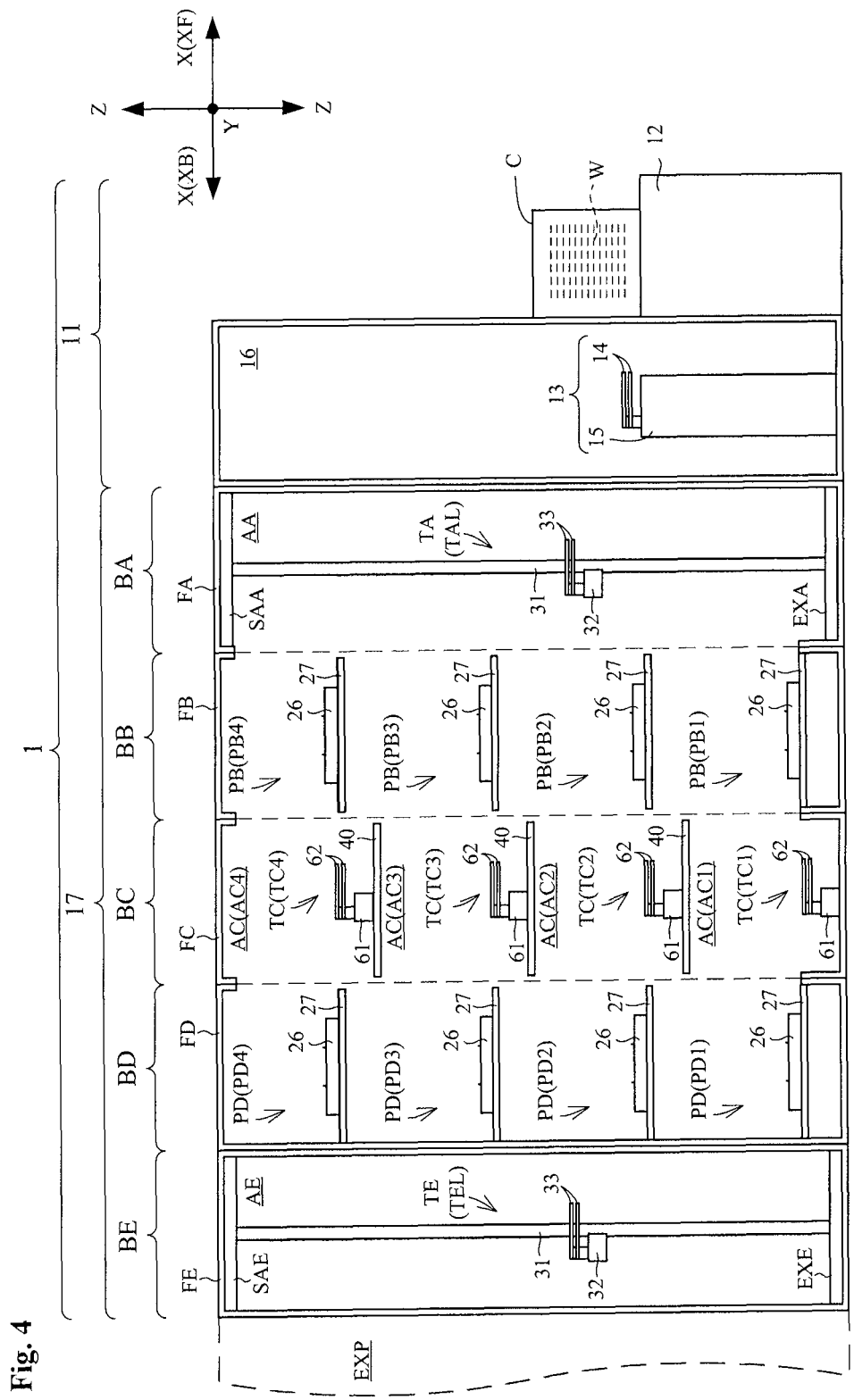
FIG. 4 is a side view taken on line b-b of FIG. 2.

Reference is made to FIGS. 2 through 4. FIG. 3 is a side view taken on line a-a of FIG. 2. FIG. 4 is a side view taken on line b-b of FIG. 2.

The indexer section 11 has carrier tables 12, an indexer's transport mechanism 13 and a transporting space 16.

The carrier tables 12 receive and hold carriers C. Each carrier C can store a plurality of wafers W. The carriers C are FOUPs (front opening unified pods), for example. The carriers C are placed on the carrier tables 12 by an unillustrated external transport mechanism, for example.

The transporting space 16 is provided backward XB of the carrier tables 12. The indexer's transport mechanism 13 is installed in the transporting space 16. The indexer's transport mechanism 13 transports the wafers W to the carriers C. Further, the indexer's transport mechanism 13 can transport the wafers W to the front heat-treating block BA.

For example, the indexer's transport mechanism 13 has two hands 14 for holding wafers W, and a hand drive mechanism 15 for driving each hand 14. The hands 14 hold one wafer W each. The hand drive mechanism 15 moves the hands 14 in the fore-and-aft direction X, transverse direction Y and the up-down direction Z, and rotates the hands 14 about the up-down direction Z. Thus, the indexer's transport mechanism 13 transports wafers W to the carriers C and to the front heat-treating block BA.

<Construction of Front Heat-Treating Block BA>

Figure 5:
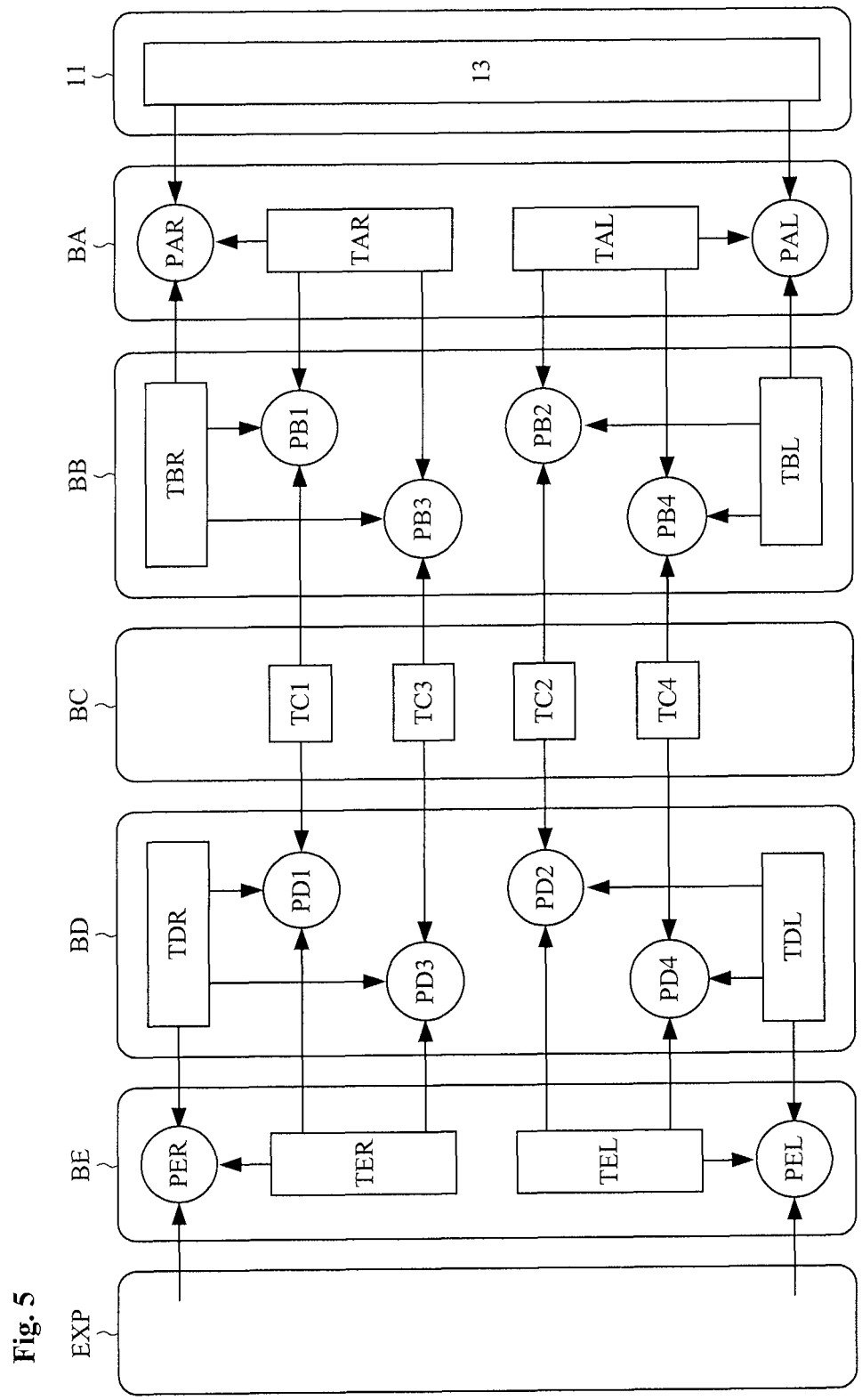
FIG. 5 is a conceptual diagram schematically showing relationships between transport mechanisms and receivers.
Figure 6:
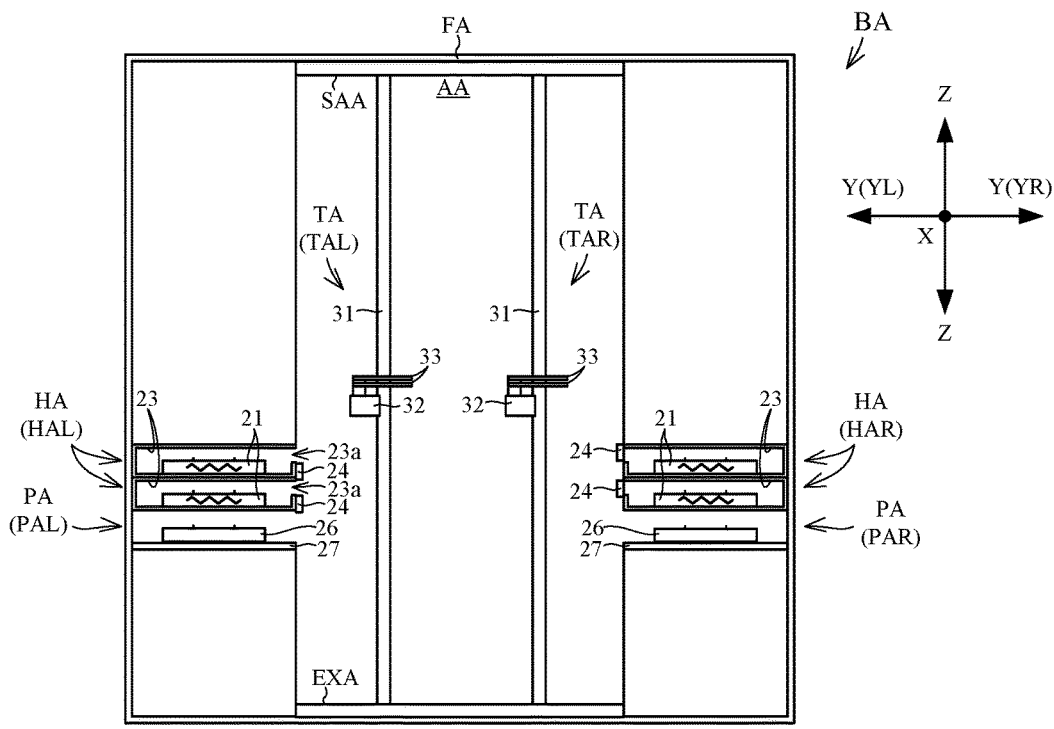
FIG. 6 is a front view of a front heat-treating block seen from an indexer section.

Reference is made to FIGS. 2 through 6. FIG. 5 is a conceptual diagram schematically showing relationships between transport mechanisms and receivers. The lines with arrows indicate receivers accessed by the transport mechanisms. The term "access" signifies that the transport mechanisms move to positions where the transport mechanisms can load or unload wafers W into/from the receivers and treating units. FIG. 6 is a front view of the front heat-treating block BA seen from the indexer section 11.

The front heat-treating block BA has a transporting space AA and receivers PA besides the heat-treating units HA and main transport mechanisms TA.

In plan view, the transporting space AA is disposed at the middle in the transverse direction Y of the front heat-treating block BA. In other words, in plan view, the transporting space AA is located on a center line IC passing through the middle in the transverse direction Y of the substrate treating apparatus 1. The center line IC is an imaginary line parallel to the fore-and-aft direction X. In plan view, the transporting space AA extends in the fore-and-aft direction X.

The front heat-treating block BA further includes an air supply unit SAA for supplying a clean gas into the transporting space AA, and an exhaust unit EXA for exhausting gas from the transporting space AA. The air supply unit SAA is disposed in an upper part of the transporting space AA for blowing out the gas downward. The exhaust unit EXA is disposed in a lower part of the transporting space AA. Consequently, the transporting space AA has downward currents (downflows) of the gas formed therein.

The main transport mechanisms TA are installed in the transporting space AA. The main transport mechanisms TA include a main transport mechanism TAR and a main transport mechanism TAL. The main transport mechanism TAR and main transport mechanism TAL are arranged to line up in the transverse direction Y.

The heat-treating units HA and receivers PA are arranged on opposite sides of the transporting space AA, respectively. The heat-treating units HA include two heat-treating units HAR arranged on the right side YR of the transporting space AA, and two heat-treating units HAL arranged on the left side YL of the transporting space AA. The receivers PA include a receiver PAR disposed on the right side YR of the transporting space AA, and a receiver PAL disposed on the left side YL of the transporting space AA.

The heat-treating units HAR and receivers PAR are located on the right side YR of the main transport mechanism TAR. The main transport mechanism TAR is opposed to the two heat-treating units HAR and one receiver PAR. The two heat-treating units HAR and one receiver PAR are arranged to line up in the up-down direction Z. The main transport mechanism TAR is constructed movable in the up-down direction Z to access the heat-treating units HAR and receiver PAR.

The heat-treating units HAL and receivers PAL are located on the left side YL of the main transport mechanism TAL. The main transport mechanism TAL is opposed to the two heat-treating units HAL and one receiver PAL. The two heat-treating units HAL and one receiver PAL are arranged to line up in the up-down direction Z. The main transport mechanism TAL is constructed movable in the up-down direction Z to access the heat-treating units HAL and receiver PAL.

<Construction of Front Relay Block BB>

Figure 7:
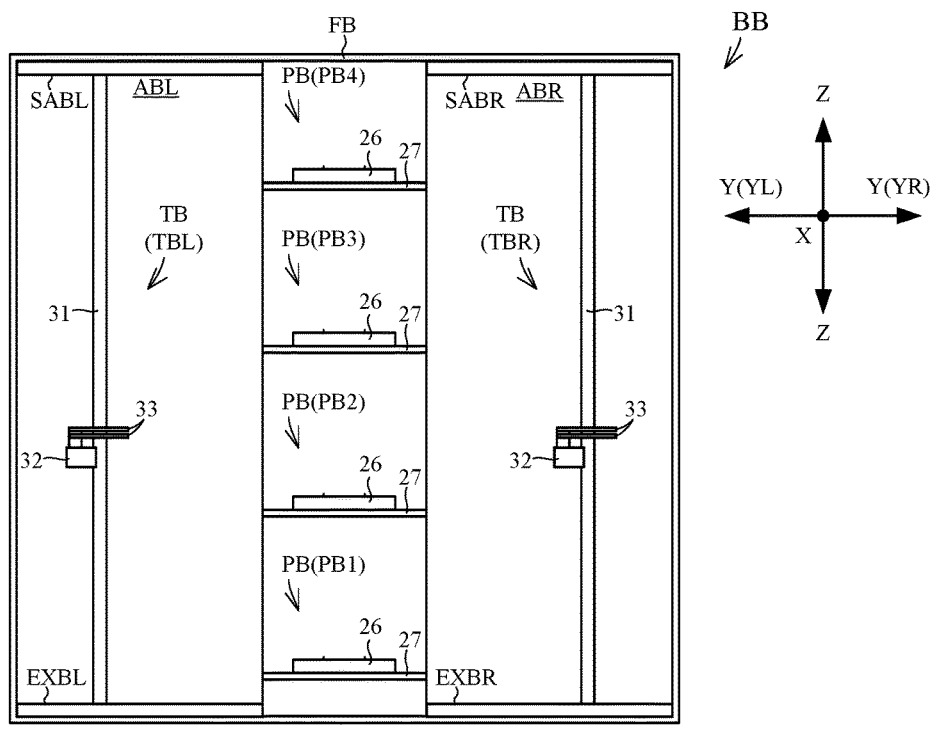
FIG. 7 is a front view of a front relay block seen from the indexer section.

Reference is made to FIGS. 2 through 5 and 7. FIG. 7 is a front view of the front relay block BB seen from the indexer section 11.

The front relay block BB has receivers PB and transport mechanisms TB.

In plan view, the receivers PB are arranged at the middle in the transverse direction Y of the front relay block BB. In other words, in plan view, the receivers PB are arranged on the center line IC of the substrate treating apparatus 1.

The plurality of receivers PB are arranged to line up in the up-down direction Z. More particularly, the receivers PB include receivers PB1, PB2, PB3 and PB4. The receivers PB1, PB2, PB3 and PB4 are arranged in the up-down direction Z. The receivers PB1, PB2, PB3 and PB4 are arranged in this order from bottom upward.

The transport mechanisms TB are arranged on the opposite sides of the receivers PB. Specifically, the transport mechanisms TB include a transport mechanism TBR disposed on the right side YR of the receivers PB, and a transport mechanism TBL disposed on the left side YL of the receivers PB. The transport mechanisms TBR and TBL are opposed to the receivers PB, respectively.

In other words, the front relay block BB includes a transporting space ABR formed on the right side YR of the receivers PB, and a transporting space ABL formed on the left side YL of the receivers PB. The transport mechanism TBR is installed in the transporting space ABR. The transport mechanism TBL is installed in the transporting space ABL.

Air supply units SABR and SABL are installed in upper parts of the transporting spaces ABR and ABL, respectively. Exhaust units EXBR and EXBL are installed in lower parts of the transporting spaces ABR and ABL, respectively.

The transport mechanisms TBR and TBL are opposed to the receivers PB, respectively. The transport mechanism TBR is constructed movable in the up-down direction Z to be able to access the receivers PB. The transport mechanism TBL is constructed movable in the up-down direction Z to be able to access the receivers PB.

<Construction of Solution Treating Block BC>

Figure 8:
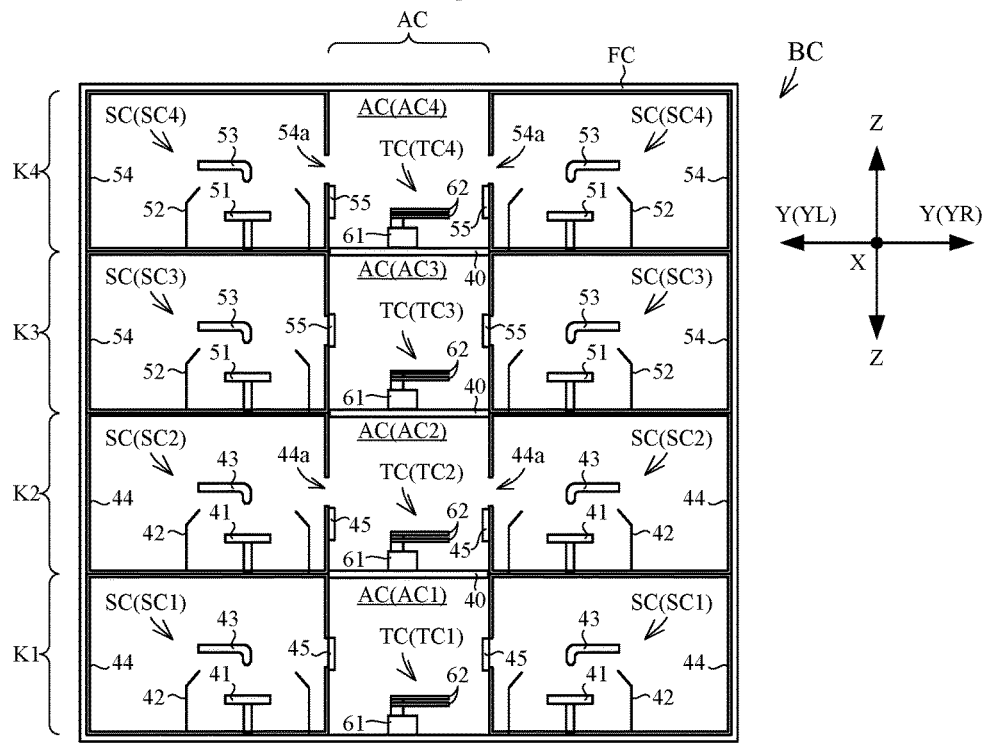
FIG. 8 is a front view of a solution treating block seen from the indexer section.

Reference is made to FIGS. 2 through 5 and 8. FIG. 8 is a front view of the solution treating block BC seen from the indexer section 11.

The solution treating block BC has a multistory structure including a plurality of stories K1, K2, K3 and K4 arranged in the up-down direction Z (see FIG. 8). Each of the stories K1, K2, K3 and K4 has one transport mechanism for solution treatment TC, and at least one solution treating unit SC to which the transport mechanism for solution treatment TC transports wafers W. The stories K1, K2, K3 and K4 are arranged in this order from bottom upward. This construction will be described specifically hereinafter.

The solution treating block BC has a transporting space AC besides the solution treating units SC and transport mechanisms for solution treatment TC. In plan view, the transporting space AC is disposed at the middle in the transverse direction Y of the solution treating block BC. In other words, in plan view, the transporting space AC is disposed on the center line IC of the substrate treating apparatus 1. In plan view, the transporting space AC extends in the fore-and-aft direction X.

The transporting space AC is separated into a plurality of (e.g. four) divided transporting spaces AC1, AC2, AC3 and AC4. The divided transporting spaces AC1, AC2, AC3 and AC4 are arranged in the up-down direction Z. The divided transporting spaces AC1, AC2, AC3 and AC4 are arranged in this order from bottom upward.

Air supply units (not shown) are installed in upper parts of the divided transporting spaces AC1, AC2, AC3 and AC4, respectively. Exhaust units (not shown) are installed in lower parts of the divided transporting spaces AC1, AC2, AC3 and AC4, respectively.

The solution treating block BC may include a plurality of (e.g. three) shielding plates 40. Each shielding plate 40 is installed between two divided transporting spaces adjoining each other in the up-down direction Z for shutting off the atmospheres of the two divided transporting spaces. For example, the shielding plates 40 are installed between the divided transporting space AC1 and divided transporting space AC2, between the divided transporting space AC2 and divided transporting space AC3, and between the divided transporting space AC3 and divided transporting space AC4.

One transport mechanism for solution treatment TC is installed in each of the divided transporting spaces AC1, AC2, AC3 and AC4. The transport mechanisms for solution treatment TC are arranged to line up in the up-down direction Z.

More particularly, the transport mechanisms for solution treatment TC include transport mechanisms for solution treatment TC1, TC2, TC3 and TC4. The transport mechanisms for solution treatment TC1, TC2, TC3 and TC4 are installed in the divided transporting spaces AC1, AC2, AC3 and AC4, respectively. The transport mechanisms for solution treatment TC1, TC2, TC3 and TC4 are arranged in the up-down direction Z. The transport mechanisms for solution treatment TC1, TC2, TC3 and TC4 are arranged in this order from bottom upward. The transport mechanism for solution treatment TC1 moves inside the divided transporting space AC1, and does not extend into the other divided transporting spaces AC2, AC3 and AC4. This is the case also with the other transport mechanisms for solution treatment TC2, TC3 and TC4.

The solution treating units SC are arranged laterally of the divided transporting spaces AC1, AC2, AC3 and AC4, respectively. More particularly, the solution treating units SC include solution treating units SC1, SC2, SC3 and SC4. The solution treating units SC1 are arranged on opposite sides of the divided transporting space AC1. In this Embodiment 1, one solution treating unit SC1 is disposed on the right side YR of the transport mechanism for solution treatment TC1, and one other solution treating unit SC1 is disposed on the left side YL of the transport mechanism for solution treatment TC1. Similarly, the solution treating units SC2 are arranged on opposite sides of the divided transporting space AC2. The solution treating units SC3 are arranged on opposite sides of the divided transporting space AC3. The solution treating units SC4 are arranged on opposite sides of the divided transporting space AC4.

The solution treating units SC1, SC2, SC3 and SC4 arranged on the right side YR of the transporting spaces AC are aligned in the up-down direction Z. The solution treating units SC1, SC2, SC3 and SC4 arranged on the left side YL of the transporting spaces AC are also aligned in the up-down direction Z.

The transport mechanism for solution treatment TC1 is opposed to the two solution treating units SC1 provided on opposite sides thereof. The transport mechanism for solution treatment TC1 is constructed rotatable about the up-down direction Z to access the two solution treating units SC1. However, the transport mechanism for solution treatment TC1 on story K1 does not access the solution treating units SC2, SC3 and SC4 provided on the other stories K2, K3 and K4. Similarly, the transport mechanisms for solution treatment TC2, TC3 and TC4 access the solution treating units SC2, SC3 and SC4, respectively.

The divided transporting space ACi, transport mechanism for solution treatment TCi and solution treating units SCi described above are elements constituting each story Ki (i being 1, 2, 3 or 4).

<Construction of Rear Relay Block BD>

Figure 9:
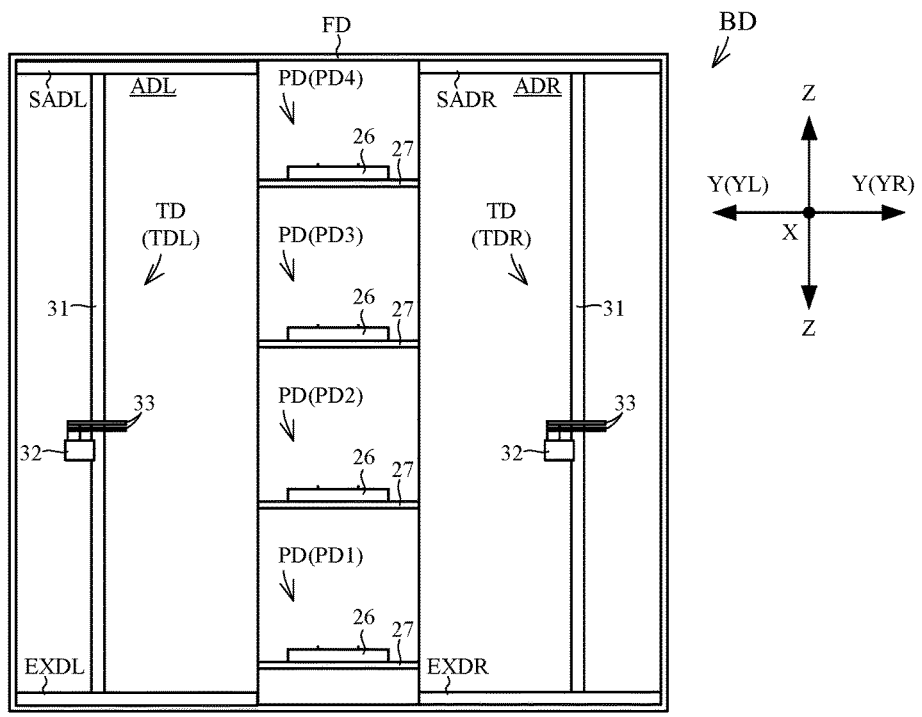
FIG. 9 is a front view of a rear relay block seen from the indexer section.

Reference is made to FIGS. 2 through 5 and 9. FIG. 9 is a front view of the rear relay block BD seen from the indexer section 11.

The rear relay block BD has the same construction as the front relay block BB. That is, the rear relay block BD has transporting spaces ADR and ADL, air supply units SADR and SADL and exhaust units EXDR and EXDL besides the receivers PD and transport mechanisms TD. The receivers PD include receivers PD1, PD2, PD3 and PD4. The transport mechanisms TD include transport mechanisms TDR and TDL. The positional relationship of the elements of the rear relay block BD is the same as the positional relationship of the elements of the front relay block BB.

Specifically, about the construction of the rear relay block BD, and in the foregoing description of <Construction of front relay block BB>, the front relay block BB is to be read as rear relay block BD, the transport mechanisms TB, TBR and TBL are to be read as transport mechanisms TD, TDR and TDL, respectively, the receivers PB, PB1, PB2, PB3 and PB4 are to be read as receivers PD, PD1, PD2, PD3 and PD4, respectively, the transporting spaces ABR and ABL are to be read as transporting spaces ADR and ADL, the air supply units SABR and SABL are to be read as air supply units SADR and SADL, and the exhaust units EXBR and EXBL are to be read as exhaust units EXDR and EXDL.

<Construction of Rear Heat-Treating Block BE>

Figure 10:
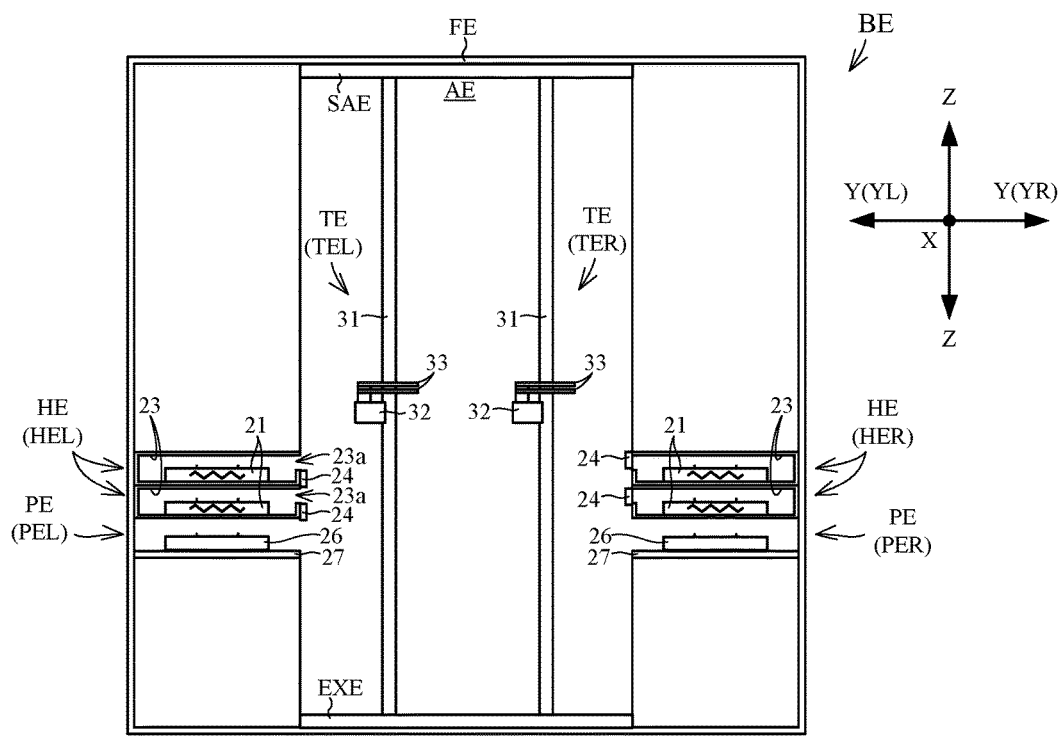
FIG. 10 is a front view of a rear heat-treating block seen from the indexer section.

Reference is made to FIGS. 2 through 5 and 10. FIG. 10 is a front view of the rear heat-treating block BE seen from the indexer section 11.

The rear heat-treating block BE has the same construction as the front heat-treating block BA. That is, the rear heat-treating block BE has a transporting space AE, receivers PE, an air supply unit SAE and an exhaust unit EXE besides the heat-treating units HE and main transport mechanisms TE. The heat-treating units HE include a heat-treating unit HER and a heat-treating unit HEL. The receivers PE include a receiver PER and a receiver PEL. The main transport mechanisms TE include a main transport mechanism TER and a main transport mechanism TEL. The positional relationship of the elements of the rear heat-treating block BE is the same as the positional relationship of the elements of the front heat-treating block BA.

Specifically, about the construction of the heat-treating block BE, and in the foregoing description of <Construction of front heat-treating block BA>, the front heat-treating block BA is to be read as rear heat-treating block BE, the main transport mechanisms TA, TAR and TAL to be read as main transport mechanisms TE, TER and TEL, respectively, the heat-treating units HA, HAR and HAL to be read as heat-treating units HE, HER and HEL, respectively, the receivers PA, PAR and PAL to be read as receivers PE, PER and PEL, respectively, the transporting space AA to be read as transporting space AE, the air supply unit SAA to be read as air supply unit SAE, and the exhaust unit EXA to be read as exhaust unit EXE.

<Relationship Between Indexer Section 11 and Block BA>

Reference is made to FIGS. 2 through 5. The receivers PA (receiver PAR and receiver PAL) are open to the indexer section 11 (transporting space 16). The indexer's transport mechanism 13 accesses the receivers PA. Consequently, the indexer's transport mechanism 13 and the main transport mechanism TAR transport wafers W reciprocally through the receiver PAR. The indexer's transport mechanism 13 and the main transport mechanism TAL transport wafers W reciprocally through the receiver PAL.

<Relationship Between Front Heat-Treating Block BA and Front Relay Block BB>

The main transport mechanisms TA and the transport mechanisms TB transport wafers W reciprocally through the receivers PA of the front heat-treating block BA.

Specifically, the transport mechanism TBR and receiver PAR are aligned in the fore-and-aft direction X. The receiver PAR is open to the transporting space ABR. The transport mechanism TBR and receiver PAR are opposed to each other. The transport mechanism TBR is constructed rotatable about the up-down direction Z to access the receiver PAR. Consequently, the main transport mechanism TAR and the transport mechanism TBR can transport wafers W reciprocally through the receiver PAR.

Similarly, the transport mechanism TBL and receiver PAL are aligned in the fore-and-aft direction X. The receiver PAL is open to the transporting space ABL. The transport mechanism TBL and receiver PAL are opposed to each other. The transport mechanism TBL is constructed rotatable about the up-down direction Z to access the receiver PAL. Consequently, the main transport mechanism TAL and the transport mechanism TBL can transport wafers W reciprocally through the receiver PAL.

Further, the main transport mechanisms TA and transport mechanism TB transport wafers W reciprocally through the receivers PB of the front relay block BB.

Specifically, the receivers PB and transporting space AA are arranged in the fore-and-aft direction X. That is, the main transport mechanism TAR and receivers PB are arranged substantially in the fore-and-aft direction X, and the main transport mechanism TAL and receivers PB are arranged substantially in the fore-and-aft direction X. Each receiver PB is open to the transporting space AA. The main transport mechanism TAR is opposed to the receivers PB. The main transport mechanism TAL is also opposed to the receivers PB. The main transport mechanism TAR can access the receivers PB by moving vertically in the up-down direction Z and rotating about the up-down direction Z. Consequently, the main transport mechanism TAR and the transport mechanism TBR can transport wafers W reciprocally through the receivers PB. In this embodiment, the main transport mechanism TAR and the transport mechanism TBR transport wafers W reciprocally through the receivers PB1 and PB3. The main transport mechanism TAL can access the receivers PB by moving vertically in the up-down direction Z and rotating about the up-down direction Z. Consequently, the main transport mechanism TAL and the transport mechanism TBL can transport wafers W reciprocally through the receivers PB. In this embodiment, the main transport mechanism TAL and the transport mechanism TBL can transport wafers W reciprocally through the receivers PB2 and PB4.

<Relationship Between Indexer Section 11, Block BA, and Block BB>

The indexer's transport mechanism 13 and the transport mechanisms TB can transport wafers W reciprocally without using the main transport mechanisms TA.

Specifically, the receiver PAR is opposed to both the indexer's transport mechanism 13 and transport mechanism TBR. The indexer's transport mechanism 13 and the transport mechanism TBR can transport wafers W reciprocally through the receiver PAR. That is, the indexer's transport mechanism 13 and the transport mechanism TBR can transport wafers W reciprocally, skipping the main transport mechanisms TA.

Similarly, the receiver PAL is opposed to both the indexer's transport mechanism 13 and the transport mechanism TBL. The indexer's transport mechanism 13 and the transport mechanism TBL can transport wafers W reciprocally through the receiver PAL. That is, the indexer's transport mechanism 13 and the transport mechanism TBL can transport wafers W reciprocally, skipping the main transport mechanisms TA.

<Relationship Between Block BB and Block BC>

The transporting space AC and receivers PB are arranged in the fore-and-aft direction X. The receivers PB1, PB2, PB3 and PB4 are arranged in positions opposed to the divided transporting spaces AC1, AC2, AC3 and AC4, respectively. The receivers PB1, PB2, PB3 and PB4 are open to the divided transporting spaces AC1, AC2, AC3 and AC4, respectively. The transport mechanisms for solution treatment TC1, TC2, TC3 and TC4 are opposed to the receivers PB1, PB2, PB3 and PB4, respectively.

The transport mechanisms for solution treatment TC1, TC2, TC3 and TC4 are constructed movable in the fore-and-aft direction X to access the receivers PB1, PB2, PB3 and PB4, respectively. Consequently, the transport mechanism for solution treatment TC1 and the transport mechanism TBR transport wafers W reciprocally through the receiver PB1. The transport mechanism for solution treatment TC2 and the transport mechanism TBL transport wafers W reciprocally through the receiver PB2. The transport mechanism for solution treatment TC3 and the transport mechanism TBR transport wafers W reciprocally through the receiver PB3. The transport mechanism for solution treatment TC4 and the transport mechanism TBL transport wafers W reciprocally through the receiver PB4.

<Relationship Between Block BA, Block BB and Block BC>

The main transport mechanisms TA and the transport mechanisms for solution treatment TC can transport wafers W reciprocally without using the transport mechanisms TB.

Specifically, the receiver PB1 is opposed to both the transport mechanism for solution treatment TC1 and the main transport mechanism TAR. The transport mechanism for solution treatment TC1 and the main transport mechanism TAR can transport wafers W reciprocally through the receiver PB1. That is, the transport mechanism for solution treatment TC1 and the main transport mechanism TAR can transport wafers W reciprocally, skipping the transport mechanisms TB.

The receiver PB2 is opposed to both the transport mechanism for solution treatment TC2 and the main transport mechanism TAL. The transport mechanism for solution treatment TC1 and the main transport mechanism TAL can transport wafers W reciprocally through the receiver PB2. That is, the transport mechanism for solution treatment TC2 and the main transport mechanism TAL can transport wafers W reciprocally, skipping the transport mechanisms TB.

The receiver PB3 is opposed to both the transport mechanism for solution treatment TC3 and the main transport mechanism TAR. The transport mechanism for solution treatment TC3 and the main transport mechanism TAR can transport wafers W reciprocally through the receiver PB3.

That is, the transport mechanism for solution treatment TC3 and the main transport mechanism TAR can transport wafers W reciprocally, skipping the transport mechanisms TB.

The receiver PB4 is opposed to both the transport mechanism for solution treatment TC4 and the main transport mechanism TAL. The transport mechanism for solution treatment TC4 and the main transport mechanism TAL can transport wafers W reciprocally through the receiver PB4. That is, the transport mechanism for solution treatment TC4 and the main transport mechanism TAL can transport wafers W reciprocally, skipping the transport mechanisms TB.

<Relationship Between Block BC and Block BD>

The relationship between the solution treating block BC and rear relay block BD is the same as the relationship between the front relay block BB and solution treating block BC. That is, the transport mechanisms for solution treatment TC and the transport mechanisms TD transport wafers W reciprocally through the receivers PD. Specifically, the transport mechanism for solution treatment TC1 and the transport mechanism TDR transport wafers W reciprocally through the receiver PD1. The transport mechanism for solution treatment TC2 and the transport mechanism TDL transport wafers W reciprocally through the receiver PD2. The transport mechanism for solution treatment TC3 and the transport mechanism TDR transport wafers W reciprocally through the receiver PD3. The transport mechanism for solution treatment TC4 and the transport mechanism TDL transport wafers W reciprocally through the receiver PD4.

<Relationship Between Block BD and Block BE>

The relationship between the rear relay block BD and rear heat-treating block BE is the same as the relationship between the front relay block BB and front heat-treating block BA.

That is, the transport mechanisms TD and the main transport mechanisms TE transport wafers W reciprocally through the receivers PD of the rear relay block BD. In this embodiment, the transport mechanism TDR and the main transport mechanism TER transport wafers W reciprocally through the receivers PD1 and PD3. The transport mechanism TDL and the main transport mechanism TEL transport wafers W reciprocally through the receivers PD2 and PD4.

Further, the transport mechanisms TD and the main transport mechanisms TE transport wafers W reciprocally through the receivers PE of the rear heat-treating block BE. Specifically, the transport mechanism TDR and the main transport mechanism TER transport wafers W reciprocally through the receiver PER. The transport mechanism TDL and the main transport mechanism TEL transport wafers W reciprocally through the receiver PEL.

<Relationship Between Block BC, Block BD and Block BE>

The relationship between the solution treating block BC, rear relay block BD and rear heat-treating block BE is the same as the relationship between the solution treating block BC, front relay block BB and front heat-treating block BA. That is, the transport mechanisms for solution treatment TC and the main transport mechanisms TE can transport wafers W reciprocally without using the transport mechanisms TD.

In this embodiment, the transport mechanism for solution treatment TC1 and the main transport mechanism TER transport wafers W reciprocally through the receiver PD1. The transport mechanism for solution treatment TC2 and the main transport mechanism TEL transport wafers W reciprocally through the receiver PD2. The transport mechanism for solution treatment TC3 and the main transport mechanism TER transport wafers W reciprocally through the receiver PD3. The transport mechanism for solution treatment TC4 and the main transport mechanism TEL transport wafers W reciprocally through the receiver PD4.

<Relationship Between Rear Heat-Treating Block BE and Exposing Machine EXP>

Each receiver PE is open to the exposing machine EXP. The exposing machine EXP accesses the receiver PER and receiver PEL. Consequently, the main transport mechanism TER and the exposing machine EXP transport wafers W reciprocally through the receiver PER. The main transport mechanism TEL and the exposing machine EXP transport wafers W reciprocally through the receiver PEL.

<Construction of Each Element of Front Heat-Treating Block BA>

A construction of each element will be described by way of example. Here, when different elements (e.g. heat-treating units HA and heat-treating units HE) have members of the same type, a common sign will be affixed to such members and their detailed description will be omitted. For example, when each heat-treating unit HA has a plate 21 and each heat-treating unit HE has a plate of the same type as plate 21, the plate of each heat-treating unit HE will be written "plate 21".

Reference is made to FIGS. 2 through 4 and 6. Each heat-treating unit HA has a plate 21, a chamber 23 and a shutter 24. The heat-treating plate 21 holds a wafer W. The plate 21 has, mounted inside or outside, a temperature control device (e.g. a heat-generating device such as a heater or a heat-absorbing device such as a heatsink) for adjusting temperature of the plate 21. The plate 21 adjusts the wafer W to a predetermined temperature (that is, it performs heat treatment) by giving heat to the wafer W on the plate 21, or taking heat away from the wafer W on the plate 21. The chamber 23 houses the plate 21. The chamber 23 has a substrate transport opening 23a formed in a surface of the chamber 23. The substrate transport opening 23a is disposed in a position opposed to the main transport mechanism TA. In other words, the substrate transport opening 23a is disposed in a position communicating with the transporting space AA. The shutter 24 opens and closes the substrate transport opening 23a. In FIG. 6, the chambers 23 of the heat-treating units HAR are closed, while the chambers 23 of the heat-treating units HAL are opened.

Each receiver PA has a plate 26 for receiving a wafer W. The plate 26 is installed on a rack 27. The plate 26 is not closed in a chamber or the like, but basically is open in horizontal directions (in the fore-and-aft direction X and transverse direction Y). The receiver PA is therefore easily accessible to not only the main transport mechanism TA but the indexer's transport mechanism 13 and the transport mechanism TB.

Each main transport mechanism TA has a guide shaft 31, a drive mechanism 32 and a pair of hands 33. The guide shaft 31 extends in the up-down direction Z. The drive mechanism 32 is attached to the guide shaft 31. The drive mechanism 32 is movable up and down along the guide shaft 31 and is rotatable about the guide shaft 31. Further, the drive mechanism 32 horizontally movable (extendible and contractible) toward and away from the guide shaft 31. For example, the drive mechanism 32 may have a flexible link mechanism (not shown). The pair of hands 33 are attached to the drive mechanism 32. Each hand 33 holds one wafer W in a horizontal position.

<Construction of Each Element of Front Relay Block BB>

Reference is made to FIGS. 2 through 4 and 7. The receivers PB have substantially the same construction as the receivers PA. That is, each receiver PB has a plate 26 mounted on a rack 27.

The transport mechanisms TB have substantially the same construction as the main transport mechanisms TA. That is, each transport mechanism TB has a guide shaft 31, a drive mechanism 32 and hands 33.

<Construction of Each Element of Solution Treating Block BC>

Reference is made to FIGS. 2 through 4 and 8. The solution treating units SC1 and SC2 perform coating treatment of wafers W. The solution treating units SC1 and SC2 have substantially the same construction. Specifically, each of the solution treating units SC1 and SC2 has a spin holder 41, a cup 42, a nozzle 43, a chamber 44 and a shutter 45. The spin holder 41 rotatably holds a wafer W. The cup 42 is formed around the spin holder 41 to collect a treating solution scattered. The nozzle 43 discharges a coating film material as the treating solution to the wafer W. The coating film material is a resist film material, for example. The nozzle 43 is movable between a treating position above the spin holder 41 and a withdrawn position away from above the cup 42. The chamber 44 houses the spin holder 41, cup 42 and nozzle 43. The chamber 44 has a substrate transport opening 44a formed in a surface of the chamber 44. The substrate transport opening 44a of the solution treating unit SC1 is disposed in a position opposed to the transport mechanism for solution treatment TC1. In other words, the substrate transport opening 44a of the solution treating unit SC1 is disposed in a position communicating with the divided transporting space AC1. Similarly, the substrate transport opening 44a of each solution treating unit SC2 is disposed in a position opposed to the transport mechanism for solution treatment TC2. The shutter 45 opens and closes the substrate transport opening 44a. In FIG. 8, the chambers 44 of the solution treating units SC1 are closed, while the chambers 44 of the solution treating units SC2 are opened.

The solution treating units SC3 and SC4 perform developing treatment of wafers W. The solution treating units SC3 and SC4 have substantially the same construction. Each of the solution treating units SC3 and SC4 has a spin holder 51, a cup 52, a nozzle 53, a chamber 54 and a shutter 55. The spin holder 51 rotatably holds a wafer W. The cup 52 is formed around the spin holder 51 to collect a treating solution scattered. The nozzle 53 discharges a developer (treating solution) to the wafer W. The nozzle 53 is movable between a treating position above the spin holder 51 and a withdrawn position away from above the cup 52. The chamber 54 houses the spin holder 51, cup 52 and nozzle 53. The chamber 54 has a substrate transport opening 54a formed in a surface of the chamber 54. The substrate transport opening 54a of the solution treating unit SC3 is disposed in a position opposed to the transport mechanism for solution treatment TC3. The substrate transport opening 54a of the solution treating unit SC4 is disposed in a position opposed to the transport mechanism for solution treatment TC4. The shutter 55 opens and closes the substrate transport opening 54a. In FIG. 8, the chambers 54 of the solution treating units SC3 are closed, while the chambers 54 of the solution treating units SC4 are opened.

Each transport mechanism for solution treatment TC has a drive mechanism 61 and a pair of hands 62. The drive mechanism 61 is mounted on the shielding plate 40, for example. The hands 62 are attached to the drive mechanism 61. The drive mechanism 61 moves each hand 62 in various directions X, Y and Z, and rotates each hand 62 about the up-down direction Z. Each hand 62 holds a wafer W.

<Construction of Each Element of Rear Relay Block BD>

Reference is made to FIGS. 2 through 4 and 9. The receivers PD have substantially the same construction as the receivers PA. That is, each receiver PD has a plate 26 mounted on a rack 27.

The transport mechanisms TD have substantially the same construction as the main transport mechanisms TA. That is, each transport mechanism TD has a guide shaft 31, a drive mechanism 32 and hands 33.

<Construction of Each Element of Rear Heat-Treating Block BE>

Reference is made to FIGS. 2 through 4 and 10. The heat-treating units HE have substantially the same construction as the heat-treating units HA. That is, each heat-treating unit HE has a plate 21, a chamber 23 and a shutter 24.

The receivers PE have substantially the same construction as the receivers PA. That is, each receiver PE has a plate 26 mounted on a rack 27.

The main transport mechanisms TE have substantially the same construction as the main transport mechanisms TA. That is, each main transport mechanism TE has a guide shaft 31, a drive mechanism 32 and hands 33.

<Block Coupling Structure>

Reference is made to FIGS. 2 through 4 and 6 through 10. The front heat-treating block BA further includes a frame FA. The frame FA supports the heat-treating units HA, main transport mechanisms TA and receivers PA. The frame FA is substantially box-shaped, and houses the heat-treating units HA, receivers PA and main transport mechanisms TA. The frame FA has apertures (not shown) for opening the receivers PA to the indexer section 11 and front relay block BB.

Similarly, the other blocks BB, BC, BD and BE have frames FB, FC, FD and FE, respectively. The frames FB-FE support the treating units, receivers and transport mechanisms of the blocks BB-BE, respectively. The frames FB-FE are substantially box-shaped, and houses the elements of the blocks BB-BE. Each of the frames FB, FC, FD and FE has apertures (not shown) for opening the receivers PB, PD and PE to the adjoining blocks.

A connection between the blocks BA-BB is realized by coupling the frames FA-FB. Connections between the blocks BB-BC, BC-BD and BD-BE are realized by coupling the frames FB-FC, FC-FD and FD-FE, respectively.

When manufacturing the substrate treating apparatus 1, the block BA is assembled first. For example, the heat-treating units HA, main transport mechanisms TA and receivers PA are mounted in the frame FA. Similarly, the blocks BB, BC, BD and BE are assembled separately. Then, the blocks BA, BB, BC, BD and BE are connected together, and the indexer section 11 is connected to the block BA.

<Construction of Control System>

Figure 11:
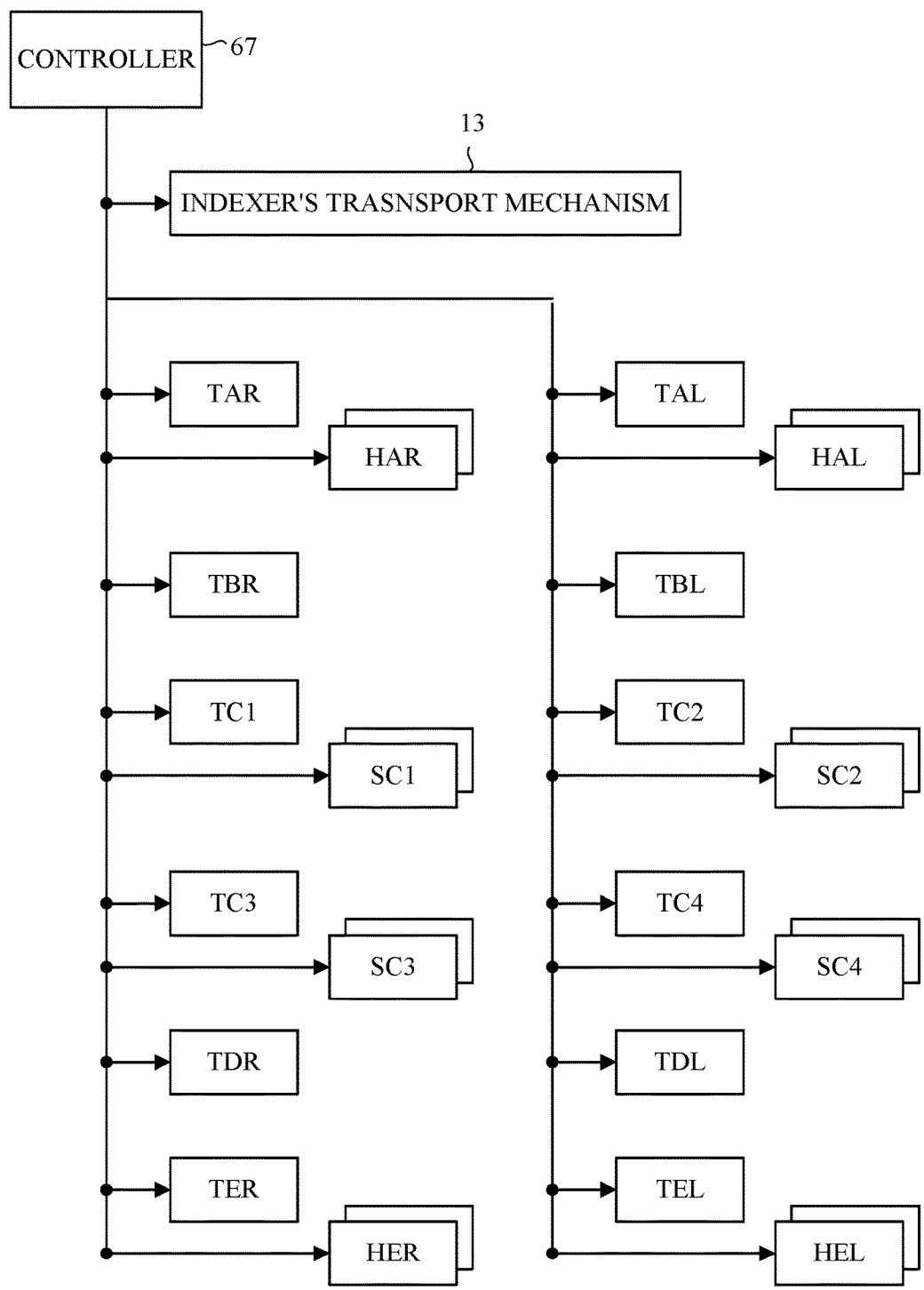
FIG. 11 is a control block diagram of the substrate treating apparatus according to Embodiment 1.

FIG. 11 is a control block diagram of the substrate treating apparatus 1. The substrate treating apparatus 1 further includes a controller 67.

The controller 67 is installed in the treating section 17, for example. The controller 67 performs overall control of the indexer section 11 and treating section 17. Specifically, the controller 67 controls operation of the indexer's transport mechanism 13 in the indexer section 11, and operation of each transport mechanism provided for the blocks BA-BE and each treating unit provided for the blocks BA, BC and BE.

The controller 67 is realized by a central processing unit (CPU) which performs various processes, a RAM (Random- Access Memory) which provides a working space for arithmetic processing, and a storage medium such as a fixed disk. The storage medium stores various information such as treatment recipes (processing programs) for treating wafers W and information for identifying each wafer W.

<Substrate Transport Routes in Treating Section 17>

Figure 12:
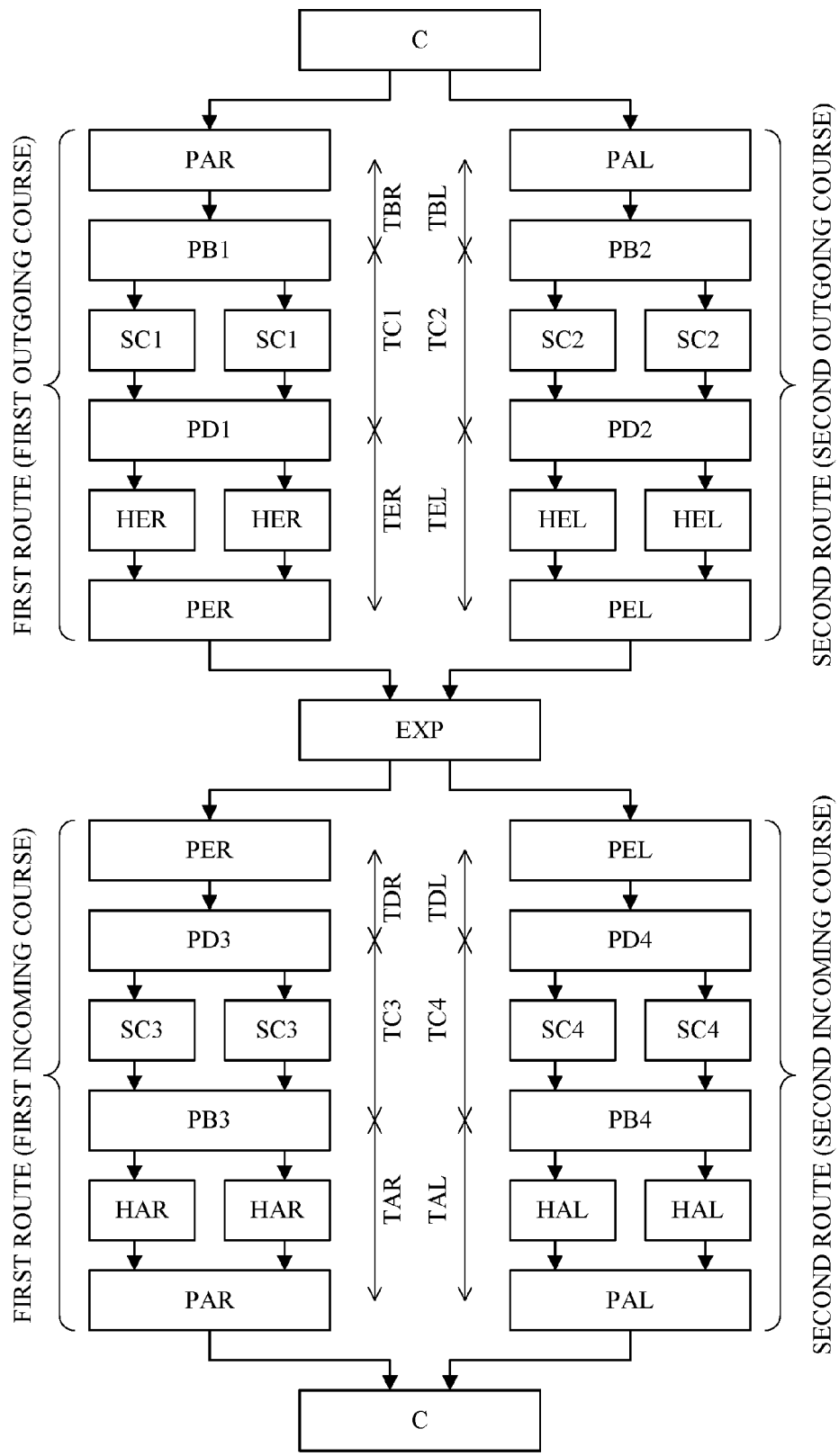
FIG. 12 is a view schematically showing substrate transport routes.

FIG. 12 is a view schematically showing transport routes of wafers W. As shown in FIG. 12, the number of routes for moving wafers W in the treating section 17 is two. Specifically, the treating section 17 has a first route and a second route. For expediency of description, the transport routes of wafers W in the treating section 17 are divided into outgoing courses and incoming courses. The outgoing courses are courses of wafers W extending from a position where the wafers W move from the indexer section 11 into the treating section 17, to a position where the wafers W move from the treating section 17 into the exposing machine EXP. The incoming courses are courses of wafers W extending from a position where the wafers W move from the exposing machine EXP into the treating section 17, to a position where the wafers W move from the treating section 17 into the indexer section 11. The first route includes a first outgoing course and a first incoming course. The second route includes a second outgoing course and a second incoming course.

(First Route)

The first outgoing course passes through the following elements in this order:

Receiver PAR→receiver PB1→solution treating unit SC1→receiver PD1→heat-treating unit HER→receiver PER.

The first incoming course passes through the following elements in this order:

Receiver PER→receiver PD3→solution treating unit SC3→receiver PB3→heat-treating unit HAR→receiver PAR.

(Second Route)

The second outgoing course passes through the following elements in this order:

Receiver PAL→receiver PB2→solution treating unit SC2→receiver PD2→heat-treating unit HEL→receiver PEL.

The second incoming course passes through the following elements in this order:

Receiver PEL→receiver PD4→solution treating unit SC4→receiver PB4→heat-treating unit HAL→receiver PAL.

Here, there is no treating unit or receiver included in both the first route and the second route. That is, the first route and the second route are completely different (i.e. completely separated).

The receivers PAR, PB1, PB3, PD1, PD3 and PER included in the first route are examples of the first receiver in this invention. The receivers PAL, PB2, PB4, PD2, PD4 and PEL included in the second route are examples of the second receiver in this invention. The solution treating units SC1 and SC3 included in the first route are examples of the first solution treating unit in this invention. The solution treating units SC2 and SC4 included in the second route are examples of the second solution treating unit in this invention. The heat-treating units HAR and HER included in the first route are examples of the first heat-treating unit in this invention. The heat-treating units HAL and HEL included in the second route are examples of the second heat-treating unit in this invention.

Further, the first route includes a plurality of treating units SC1 connected in parallel. The treating units HER, SC3 and HAR are also installed in parallel on the first route, respectively. Similarly, on the second route, the treating units SC2, HEL, SC4 and HAL are connected in parallel, respectively.

Wafers W which move along the first route and wafers W which move along the second route are different. In the following description, the wafers W which move along the first route will be called the "first wafers W" as appropriate, and the wafers W which move along the second route the "second wafers W" as appropriate.

Wafers W transported by the transport mechanisms TAR, TBR, TC1, TC3, TDR and TER, and wafers W transported by the transport mechanisms TAL, TBL, TC2, TC4, TDL and TEL, are different. Assuming that the transport mechanisms TAR, TBR, TC1, TC3, TDR and TER are called a first transport mechanism group, the first transport mechanism group transports the above-noted first wafers W along the first route. Assuming that the transport mechanisms TAL, TBL, TC2, TC4, TDL and TEL are called a second transport mechanism group, the second transport mechanism group transports the above-noted second wafers W along the second route. Here, there is no transport mechanism included in both the first transport mechanism group and the second transport mechanism group. That is, the first transport mechanism group and the second transport mechanism group are independent of each other.

The main transport mechanisms TAR and TER are examples of the first main transport mechanism in this invention, The main transport mechanisms TAL and TEL are examples of the second main transport mechanism in this invention. The transport mechanisms TBR and TDR are examples of the first transport mechanism in this invention. The transport mechanisms TBL and TDL are examples of the second transport mechanism in this invention. The transport mechanisms for solution treatment TC1 and TC3 are examples of the first transport mechanism for solution treatment in this invention. The transport mechanisms for solution treatment TC2 and TC4 are examples of the second transport mechanism for solution treatment in this invention.

<Examples of Operation of Substrate Treating Apparatus 1>

Figure 13:
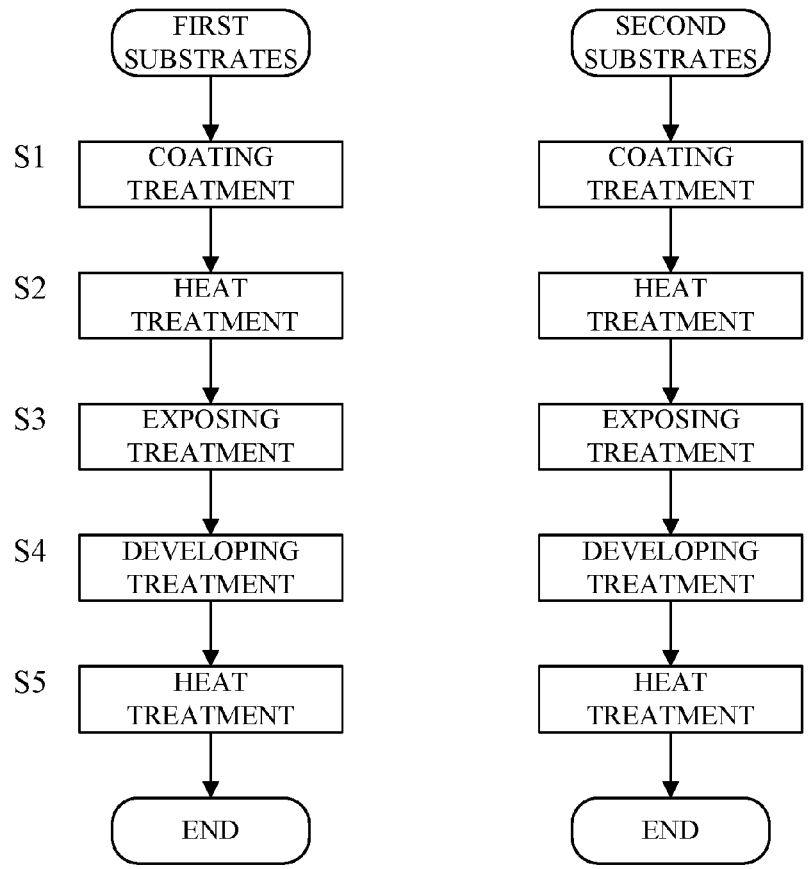
FIG. 13 is a flow chart showing a sequence of treatments given to substrates.
Figure 14:
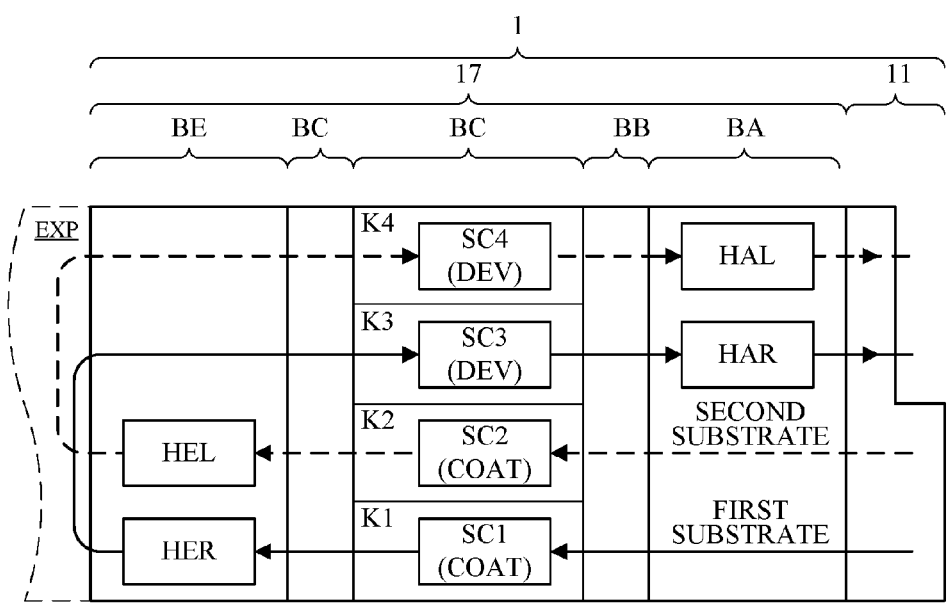
FIG. 14 is a conceptual diagram schematically showing how a first substrate and a second substrate move between the blocks.
Figure 15:
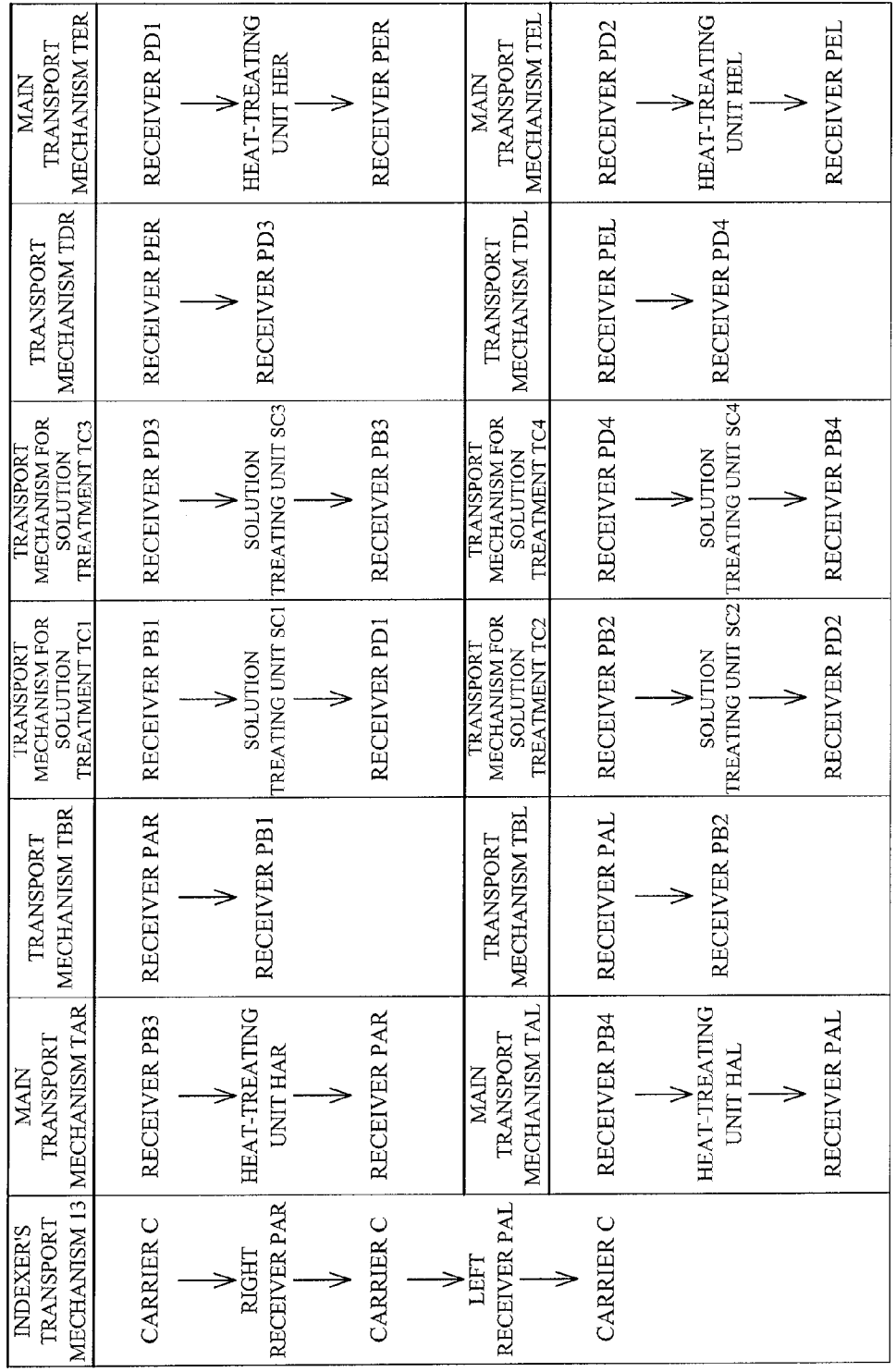
FIG. 15 is a view schematically showing examples of operation repeatedly carried out by the respective transport mechanisms.

Examples of operation of the substrate treating apparatus 1 will be described with reference to FIGS. 12 through 15. FIG. 13 is a flow chart showing a sequence of treatments given to substrates. FIG. 14 is a conceptual diagram schematically showing how a first substrate and a second substrate move between the blocks BA-BE. In FIG. 14, for expediency of description, the solution treating units SC1 and SC2 are affixed with "COAT" which means coating treatment, and the solution treating units SC3 and SC4 with "DEV" which means developing treatment. FIG. 15 is a view schematically showing examples of operation repeatedly carried out by the respective transport mechanisms.

<Operation of Indexer Section 11 for Feeding Wafers W to Treating Section 17>

The indexer's transport mechanism 13 takes one wafer W out of a carrier C, and places the wafer W on the receiver PAR. Then, the indexer's transport mechanism 13 takes one wafer W out of the carrier C, and places the wafer W on the receiver PAL. Subsequently, the indexer's transport mechanism 13 again transports a wafer W from the carrier C to the receiver PAR. In this way, the indexer's transport mechanism 13 transports one wafer W at a time alternately to the receiver PAR and receiver PAL.

<Operation of Treating Section 17 (Outgoing Course)>

Since operation relating to the first outgoing course and operation relating to the second outgoing course are similar, the operation relating to the first outgoing course will be described for expediency. The operation relating to the second outgoing course will correspond, in the following description, to the transport mechanisms TBR, TC1 and TER read as the transport mechanisms TBL, TC2 and TEL, respectively, the receivers PAR, PB1, PD1 and PER read as the receivers PAL, PB2, PD2 and PEL, respectively, and the treating units SC1 and HER read as the treating units SC2 and HEL, The transport mechanism TBR picks up the wafer W on the receiver PAR, and transports the wafer W to the receiver PB1. The transport mechanism for solution treatment TC1 picks up the wafer W on the receiver PB1, and transports the wafer W to one of the solution treating units SC1. Here, the transport mechanism for solution treatment TC1 transports wafers W alternately to the two solution treating units SC1.

When the transport mechanism for solution treatment TC1 transports the wafer W to each solution treating unit SC1, the shutter 45 temporarily opens the substrate transport opening 44a. This permits the hand 62 to advance into the chamber 44. After the hand 62 withdraws out of the chamber 44, the shutter 45 closes the substrate transport opening 44a again. Consequently, the solution treating unit SC1 performs solution treatment in a state that the chamber 44 is closed.

The solution treating unit SC1 applies the film material to the wafer W (step S1). Specifically, the spin holder 41 holds the wafer W. The nozzle 43 moves from the withdrawn position to the treating position. The spin holder 41 spins the wafer W and the nozzle 43 discharges the film material. The film material is applied to the surface of the wafer W. Part of the film material is scattered from the wafer W to be collected by the cup 42.

After the coating treatment is completed, the transport mechanism for solution treatment TC1 unloads the wafer W from the solution treating unit SC1. At this time also, the chamber 44 is opened to the divided transporting space AC1. Then, the transport mechanism for solution treatment TC1 transports the wafer W to the receiver PD1.

The transport mechanism for solution treatment TC1 may, in a state of holding a wafer W to be treated which has been taken from the receiver PB1, unload a treated wafer W from the solution treating unit SC1, and subsequently load the wafer W to be treated into the solution treating unit SC1.

The main transport mechanism TER takes the wafer W from the receiver PD1, and transports it to one of the heat-treating units HER. Here, the main transport mechanism TER transports wafers W alternately to the two heat-treating units HER. When the main transport mechanism TER transports a wafer W to each heat-treating unit HER, the shutter 24 temporarily opens the substrate transport opening 23a. This permits the hand 33 of the main transport mechanism TER to advance into the chamber 23. After the hand 33 withdraws out of the chamber 23, the shutter 24 closes the substrate transport opening 23a again. Consequently, the heat-treating unit HER performs heat treatment in a state that the chamber 23 is closed.

The heat-treating unit HER performs heat treatment of the wafer W (step S2).

After the heat treatment is completed, the main transport mechanism TER unloads the wafer W from the heat-treating unit HER. At this time also, the chamber 23 is opened to the transporting space AE. Then, the main transport mechanism TER transports the wafer W to the receiver PER.

The above is the operation relating to the first outgoing course. The operation relating to the first outgoing course and the operation relating to the second outgoing course may be carried out in parallel.

<Operation of Exposing Machine EXP>

Wafers W on the receiver PER and receiver PEL are transported to the exposing machine EXP. The exposing machine EXP performs exposing treatment of the wafers W (step S3). After the exposing treatment is completed, the wafers W are transported from the exposing machine EXP to the receiver PER and receiver PEL.

<Operation of Treating Section 17 (Incoming Course)>

Since operation relating to the first incoming course and operation relating to the second incoming course are similar, the operation relating to the first incoming course will be described for expediency. The operation relating to the second incoming course will correspond, in the following description, to the transport mechanisms TAR, TC3 and TDR read as the transport mechanisms TAL, TC2 and TDL, respectively, the receivers PAR, PB3, PD3 and PER read as the receivers PAL, PB4, PD4 and PEL, respectively, and the treating units SC3 and HAR read as the treating units SC4 and HAL, The transport mechanism TDR transports the wafer W from the receiver PER to the receiver PD3. The transport mechanism for solution treatment TC3 transports the wafer W from the receiver PD3 to one of the solution treating units SC3. Here, the transport mechanism for solution treatment TC3 transports wafers W alternately to the two solution treating units SC3.

When the transport mechanism for solution treatment TC3 transports the wafer W to each solution treating unit SC3, the shutter 55 temporarily opens the substrate transport opening 54a.

The solution treating unit SC3 supplies the developer to the wafer W (step S4). Specifically, the spin holder 51 holds the wafer W. The nozzle 53 moves from the withdrawn position to the treating position. The nozzle 53 discharges the developer. The developer covers the surface of the wafer W. At this time, the spin holder 51 may spin the wafer W. Upon lapse of a predetermined time, the developer is removed from the wafer W. For example, the spin holder 51 may spin the wafer W to scatter the developer from the wafer W. Alternatively, a nozzle (not shown) other than the nozzle 53 may supply a cleaning liquid to the wafer W to replace the developer on the wafer W with the cleaning liquid. The developer and the like are collected by the cup 52.

After the developing treatment is completed, the transport mechanism for solution treatment TC3 unloads the wafer W from the solution treating unit SC3. At this time also, the chamber 54 is opened to the divided transporting space AC3. Then, the transport mechanism for solution treatment TC3 transports the wafer W to the receiver PB3.

The main transport mechanism TAR transports the wafer W from the receiver PB3 to one of the heat-treating units HAR. Here, the main transport mechanism TAR transports wafers W alternately to the two heat-treating units HAR. When the main transport mechanism TAR transports a wafer W to each heat-treating unit HAR, the shutter 24 opens and closes the chamber 23 of the heat-treating unit HAR.

The heat-treating unit HAR performs heat treatment of the wafer W (step S5).

After the heat treatment is completed, the main transport mechanism TAR unloads the wafer W from the heat-treating unit HAR. At this time also, the chamber 23 is opened to the transporting space AA. Then, the main transport mechanism TAR transports the wafer W to the receiver PAR.

The above is the operation relating to the first incoming course. The operation relating to the first incoming course and the operation relating to the second incoming course may be carried out in parallel.

The above series of treatments in steps S1 through S5 is the series of treatments performed in the substrate treating apparatus 1.

<Operation of Indexer Section 11 for Collecting Wafers W from Treating Section 17>

The indexer's transport mechanism 13 transports a wafer W from the receiver PAR to a carrier C. Then, the indexer's transport mechanism 13 transports a wafer W from the receiver PAL to the carrier C. Subsequently, the indexer's transport mechanism 13 transports a wafer W from the receiver PAR to the carrier C again. Thus, the indexer's transport mechanism 13 unloads one wafer W at a time alternately from the receiver PAR and receiver PAL.

The indexer's transport mechanism 13, following the operation to take the wafer W from the receiver PAR, may place a different wafer W on the receiver PAR. Similarly, the indexer's transport mechanism 13, following the operation to take the wafer W from the receiver PAL, may place a different wafer W on the receiver PAL.

<Effects of Embodiment 1>

As described above, the influence of the heat-treating units HA on the solution treating units SC can be reduced. Further, the influence of the heat-treating units HE on the solution treating units SC can be reduced.

These effects will be illustrated more particularly. When loading a wafer in each heat-treating unit HA, and when unloading a wafer W from each heat-treating unit HA, the chamber 23 is opened to the transporting space AA. It is therefore unavoidable that a treating gas (hereinafter called "heat-treating gas") in the heat-treating unit HA (chamber 23) flows out into the transporting space AA. However, between the transporting space AA and the solution treating units SC, there is provided the front relay block BB (i.e. the receivers PB and transport mechanisms TB). The heat-treating gas in the transporting space AA can therefore be effectively inhibited from reaching the solution treating units SC. Similarly, whenever each heat-treating unit HE is opened, the heat-treating gas flows out of the heat-treating unit HE into the transporting space AE. However, the rear relay block BD can effectively protect the solution treating units SC from the heat-treating gas having flowed out of the heat-treating units HE.

The front heat-treating block BA with the air supply unit SAA and exhaust unit EXA further inhibits the thermal influence of the heat-treating units HA on the solution treating units SC. The front relay block BB with the air supply units SABR and SABL and exhaust units EXBR and EXBL further inhibits the thermal influence of the heat-treating units HA on the solution treating units SC. The solution treating block BC with air supply units (not shown) and exhaust units (not shown) further inhibits the thermal influence of the heat-treating units HA on the solution treating units Sc.

Similarly, the rear relay block BD with the air supply units SADR and SADL and exhaust units EXDR and EXDL further inhibits the thermal influence of the heat-treating units HE on the solution treating units SC. The rear heat-treating block BE with the air supply unit SAE and exhaust unit EXE further inhibits the thermal influence of the heat-treating units HE on the solution treating units SC.

Since the blocks BA, BB and BC are aligned in this order, the heat-treating units HA can effectively be kept away from the solution treating units SC. Similarly, since the blocks BC, BD and BE are aligned in this order, the heat-treating units HE can effectively be kept away from the solution treating units SC.

The receivers PB are arranged between the transporting space AA and transporting spaces AC. More particularly, the receivers PB1, PB2, PB3 and PB4 are arranged between the transporting space AA and divided transporting spaces AC1, AC2, AC3 and AC4, respectively. The receivers PB (PB1, PB2, PB3 and PB4) can therefore effectively prevent the atmosphere in the transporting space AA from flowing into the transporting spaces AC (AC1, AC2, AC3 and AC4).

Similarly, the receivers PD are arranged between the transporting space AE and transporting spaces AC. More particularly, the receivers PD1, PD2, PD3 and PD4 are arranged between the transporting space AE and divided transporting spaces AC1, AC2, AC3 and AC4, respectively. The receivers PD (PD1, PD2, PD3 and PD4) can therefore effectively prevent the atmosphere in the transporting space AE from flowing into the transporting spaces AC (AC1, AC2, AC3 and AC4).

Particularly, since the transporting space AA, receivers PB, and transporting spaces AC are aligned along the center line IC, the atmosphere in the transporting space AA can be prevented from flowing into the transporting spaces AC with increased effect. Similarly, since the transporting space AE, receivers PD and transporting spaces AC are aligned along the center line IC, the atmosphere in the transporting space AE can be prevented from flowing into the transporting spaces AC with increased effect.

The first transport mechanism group and the second transport mechanism group are independent of each other. Therefore, transportation of wafers W by the first transport mechanism group and transportation of wafers W by the second transport mechanism group can be prevented from influencing each other. For example, even when at least one transport mechanism belonging to the first transport mechanism group breaks down, transportation of wafers W by the second transport mechanism group is not delayed or stopped. This can inhibit lowering of the operating rate of the substrate treating apparatus 1.

The first route and the second route are completely separated. That is, the receivers/treating units through which the first wafers W pass are completely different from the receivers/treating units through which the second wafers W pass. Therefore, substrate transportation along the first route and substrate transportation along the second route can be prevented from influencing each other. For example, even when at least one of the receivers/treating units on the first route breaks down, it is unnecessary to stop the substrate transportation along the second route. This can further inhibit lowering of the operating rate of the substrate treating apparatus 1.

The treating units SC1, SC3, HAR and HER are arranged two each on the first route. The two treating units SC1 are connected in parallel with each other. The other treating units SC3, HAR and HER are connected likewise. Therefore, each of the solution treatment and heat treatment can be carried out in parallel. As a result, the throughput of treating wafers W on the first route can be promoted. Even when one of the treating units SC1 breaks down, for example, substrate transportation along the first route can be continued by transporting wafers W to the other treating unit SC1. As a result, the reliability of substrate transportation on the first route can be improved.

Similarly, the treating units SC2, SC4, HAL and HEL are provided two each on the second route. Therefore, the throughput of treating wafers W on the second route can be promoted, and the reliability of substrate transportation along the second route can be improved.

The first wafers W transported along the first route are different from the second wafers W transported along the second route. Therefore, transportation of the first wafers W and transportation of the second wafers W can be prevented from influencing each other. For example, even when the transportation of the first wafers W is stopped, it is unnecessary to stop the transportation of the second wafers W. This can further inhibit lowering of the operating rate of the substrate treating apparatus 1.

The receivers PB1, PB2, PB3 and PB4 are arranged in the up-down direction Z, and the transport mechanisms for solution treatment TC1, TC2, TC3 and TC4 are also arranged in the up-down direction Z. Further, the receiver PB1 is located in a position opposed to the transport mechanism for solution treatment TC1. Therefore, the transport mechanism for solution treatment TC1 and the transport mechanism TBR can transport wafers W reciprocally through the receiver PB1. Similarly, since the receiver PB3 is located in a position opposed to the transport mechanism for solution treatment TC3, the transport mechanism for solution treatment TC3 and the transport mechanism TBR can transport wafers W reciprocally through the receiver PB3. Since the receiver PB2 is located in a position opposed to the transport mechanism for solution treatment TC2, the transport mechanism for solution treatment TC2 and the transport mechanism TBL can transport wafers W reciprocally through the receiver PB2. Similarly, since the receiver PB4 is located in a position opposed to the transport mechanism for solution treatment TC4, the transport mechanism for solution treatment TC4 and the transport mechanism TBL can transport wafers W reciprocally through the receiver PB4.

Similarly, the positional relationship between the receivers PD and transport mechanisms for solution treatment TC is the same as the positional relationship between the receivers PB and transport mechanisms for solution treatment TC. Therefore, each of the transport mechanisms for solution treatment TC1 and TC3 and the transport mechanism TDR can transport wafers W reciprocally, and each of the transport mechanisms for solution treatment TC2 and TC4 and the transport mechanism TDL can conveniently transport wafers W reciprocally.

The main transport mechanisms TAR and TAL are arranged in the transverse direction Y. The receiver PB1 is located in a position opposed to both of the main transport mechanisms TAR and the main transport mechanism TAL. Similarly, each of the receivers PB2-PB4 is located in a position opposed to both of the main transport mechanism TAR and the main transport mechanism TAL. Therefore, the main transport mechanism TAR and the transport mechanism TBR can transport wafers W reciprocally, for example, through the receivers PB1 and PB3. The main transport mechanism TAL and the transport mechanism TBL can conveniently transport wafers W reciprocally, for example, through the receivers PB2 and PB4.

The main transport mechanism TAR and the transport mechanisms for solution treatment TC1 and TC3 can transport wafers W reciprocally without using the transport mechanisms TB. The main transport mechanism TAL and the transport mechanisms for solution treatment TC2 and TC4 can transport wafers W reciprocally without using the transport mechanisms TB. Wafers W can therefore be transported efficiently between the front heat-treating block BA and the solution treating block BC.

Similarly, the main transport mechanism TER and the transport mechanisms for solution treatment TC1 and TC3 can transport wafers W reciprocally without using the transport mechanisms TD. The main transport mechanism TEL and the transport mechanisms for solution treatment TC2 and TC4 can transport wafers W reciprocally without using the transport mechanisms TD. Wafers W can therefore be transported efficiently between the rear heat-treating block BE and the solution treating block BC.

The receiver PAR is located in a position lateral to the main transport mechanism TAR and opposed to the transport mechanism TBR. The main transport mechanism TAR and transport mechanism TBR can therefore transport wafers W reciprocally through the receiver PAR. Putting it all together, the main transport mechanism TAR and transport mechanism TBR can transport wafers W reciprocally through any one of the receivers PAR, PB1 and PB3. Similarly, the receiver PAL is located in a position lateral to the main transport mechanism TAL and opposed to the transport mechanism TBL. The main transport mechanism TAL and transport mechanism TBL can therefore transport wafers W reciprocally through the receiver PAL. Putting it all together, the main transport mechanism TAL and transport mechanism TBL can transport wafers W reciprocally through any one of the receivers PAL, PB2 and PB4. Wafers W can therefore be transported flexibly between the front heat-treating block BA and the front relay block BB.

Similarly, the main transport mechanism TER and transport mechanism TDR can transport wafers W reciprocally through any one of the receivers PD1, PD3 and PER. The main transport mechanism TEL and transport mechanism TDL can transport wafers W reciprocally through any one of the receivers PD2, PD4 and PEL. Wafers W can therefore be transported flexibly between the rear heat-treating block BE and the rear relay block BD.

Since the receiver PAR is open to the indexer section 11, the indexer's transport mechanism 13 and the main transport mechanism TAR can conveniently transport wafers W reciprocally. Since the receiver PAL is open to the indexer section 11, the indexer's transport mechanism 13 and the main transport mechanism TAL can conveniently transport wafers W reciprocally.

The indexer's transport mechanism 13 and transport mechanism TBR can transport wafers W reciprocally without using the main transport mechanisms TA. The indexer's transport mechanism 13 and transport mechanism TBL can transport wafers W reciprocally without using the main transport mechanisms TA. Wafers W can therefore be transported efficiently between the indexer section 11 and the front relay block BB.

The solution treating units SC include the solution treating units SC1 and SC2, and the solution treating units SC1 and SC2 are coating units for coating the wafers W with the coating film material. Therefore, coating treatment can be given to the wafers W conveniently. The solution treating units SC include the solution treating units SC3 and SC4, and the solution treating units C3 and SC4 are developing units for supplying the developer to the wafers W. Therefore, developing treatment can be given to the wafers W conveniently.

The solution treating block BC has more transport mechanisms than the other blocks BA, BB, BD and BE. Specifically, the number of transport mechanisms (i.e. transport mechanisms for solution treatment TC) in the solution treating block BC is four, which is twice the number in the other blocks BA, BB, BD and BE. This can effectively improve the transport capacity for wafers W in the solution treating block BC.

The array of functions from block BA to block BE is the same as the array of functions from block BE to block BA.

It is therefore possible to connect the indexer section 11 to the rear heat-treating block BE instead of connecting the indexer section 11 to the front heat-treating block BA. Similarly, it is possible to connect the exposing machine EXP to the front heat-treating block BA instead of connecting the exposing machine EXP to the rear heat-treating block BE.

Figure 16:
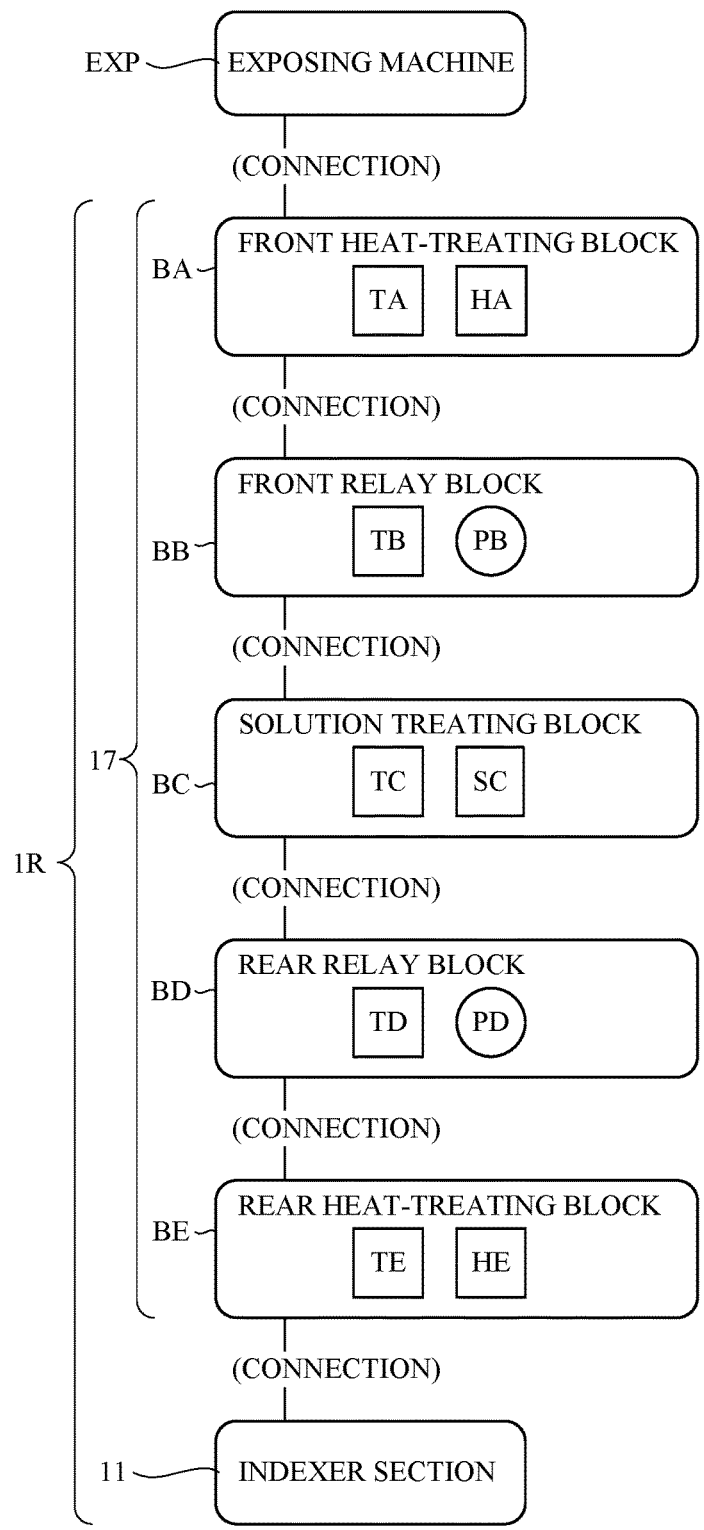
FIG. 16 is a conceptual diagram of the substrate treating apparatus according to Embodiment 1.

Reference is made to FIG. 16. FIG. 16 is a conceptual diagram of a substrate treating apparatus 1R obtained by connecting the indexer section 11 to the block BE. As seen from FIG. 1 and FIG. 16, the substrate treating apparatus 1R performs functions equivalent to the substrate treating apparatus 1 according to Embodiment 1.

Further, the substrate treating apparatus 1 and substrate treating apparatus 1R have basically the same construction. That is, the front heat-treating block BA and rear heat-treating block BE have substantially the same construction, and the front relay block BB and rear relay block BD have substantially the same construction. Therefore, the construction of the treating section 17 seen from the block BA is the same as the construction of the treating section 17 seen from the block BE. The substrate treating apparatus 1R can therefore be identified with the substrate treating apparatus 1. Whichever of the blocks BA and BE the indexer section 11 is connected to, substantially the same apparatus is assembled. In other words, whichever of the blocks BA and BE the indexer section 11 is connected to, it will not constitute an incorrect connection. This can simplify an operation for assembling the substrate treating apparatus 1. No change will be made to the design of blocks BA and BE or to the design of the treating section 17 whichever of the blocks BA and BE the indexer section 11 may be connected to. It is therefore possible to manufacture the treating section 17 even when no decision has been made which of the blocks BA and BE the indexer section 11 is connected to. In this case, after a position of connection between the indexer section 11 and treating section 17 is decided, the substrate treating apparatus 1 will be completed only by an operation to connect the indexer section 11 and the treating section 17. Thus, since the treating section 17 can be manufactured before a position of connection between the indexer section 11 and the treating section 17 is decided, the substrate treating apparatus 1 can be completed in a short period of time once the position of connection between the indexer section 11 and the treating section 17 is decided.

[Embodiment 2]

Next, Embodiment 2 of this invention will be described with reference to the drawings. Components identical to those of Embodiment 1 are shown with the same signs, and will not particularly be described.

<Overall Construction of Substrate Treating Apparatus 1>

Figure 17:
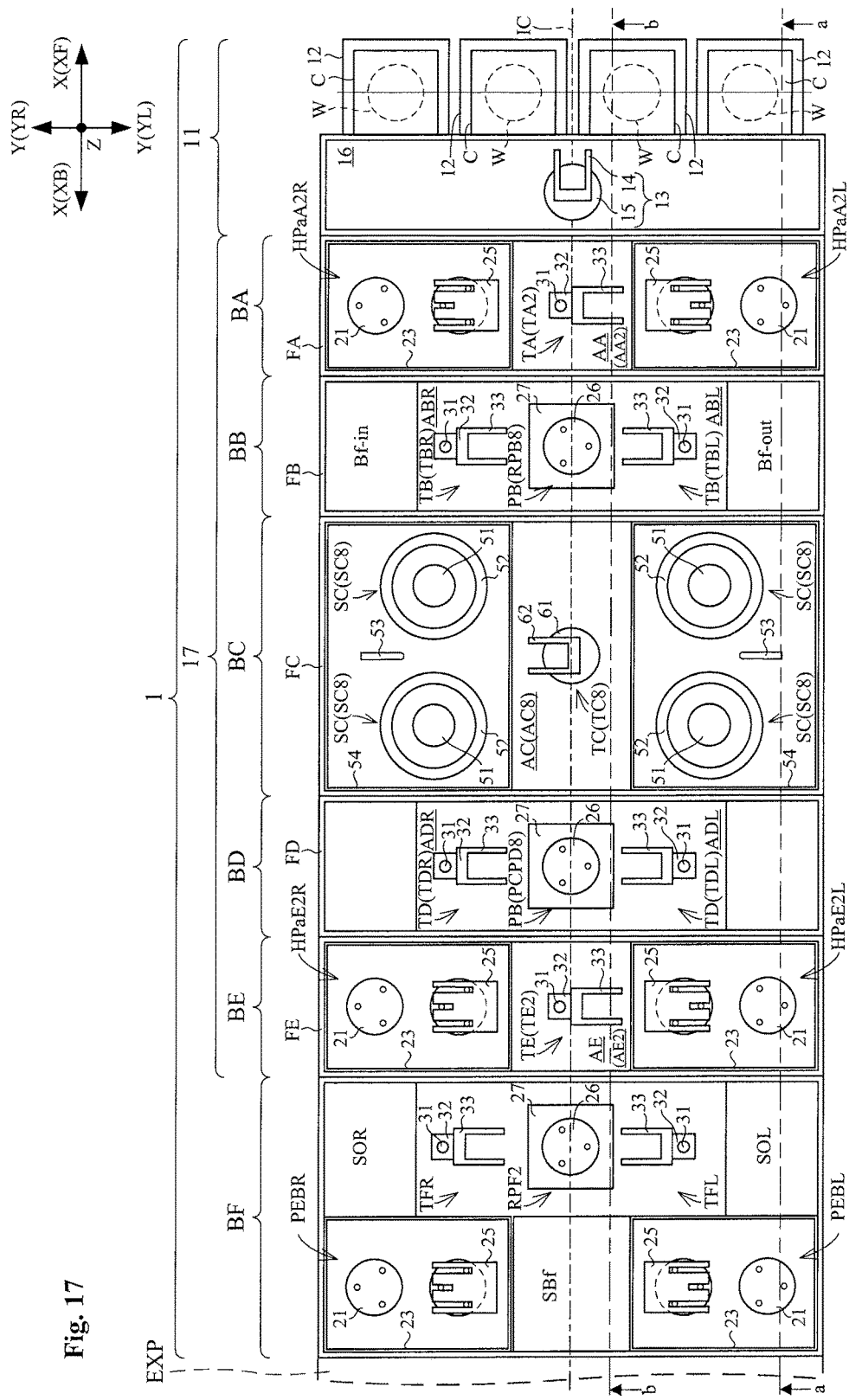
FIG. 17 is a plan view of a substrate treating apparatus according to Embodiment 2.

FIG. 17 is a plan view of a substrate treating apparatus 1 according to Embodiment 2. The substrate treating apparatus 1 according to Embodiment 2 is an apparatus for forming antireflection film, resist film and protective film on wafers W, and for developing the wafers W.

The substrate treating apparatus 1 includes an indexer section 11, a treating section 17 and an interface block BF. The interface block BF transports the wafers W reciprocally to and from an exposing machines EXP. The indexer section 11, treating section 17, interface block BF and exposing machine EXP are aligned in this order in the fore-and-aft direction X. The interface block BF is connected directly to the treating section 17 (rear heat-treating block BE) and is connected directly to the exposing machine EXP. The exposing machine EXP performs exposing treatment of the wafers W by an immersion method, for example.

<Construction of Front Heat-Treating Block BA>

Figure 18:
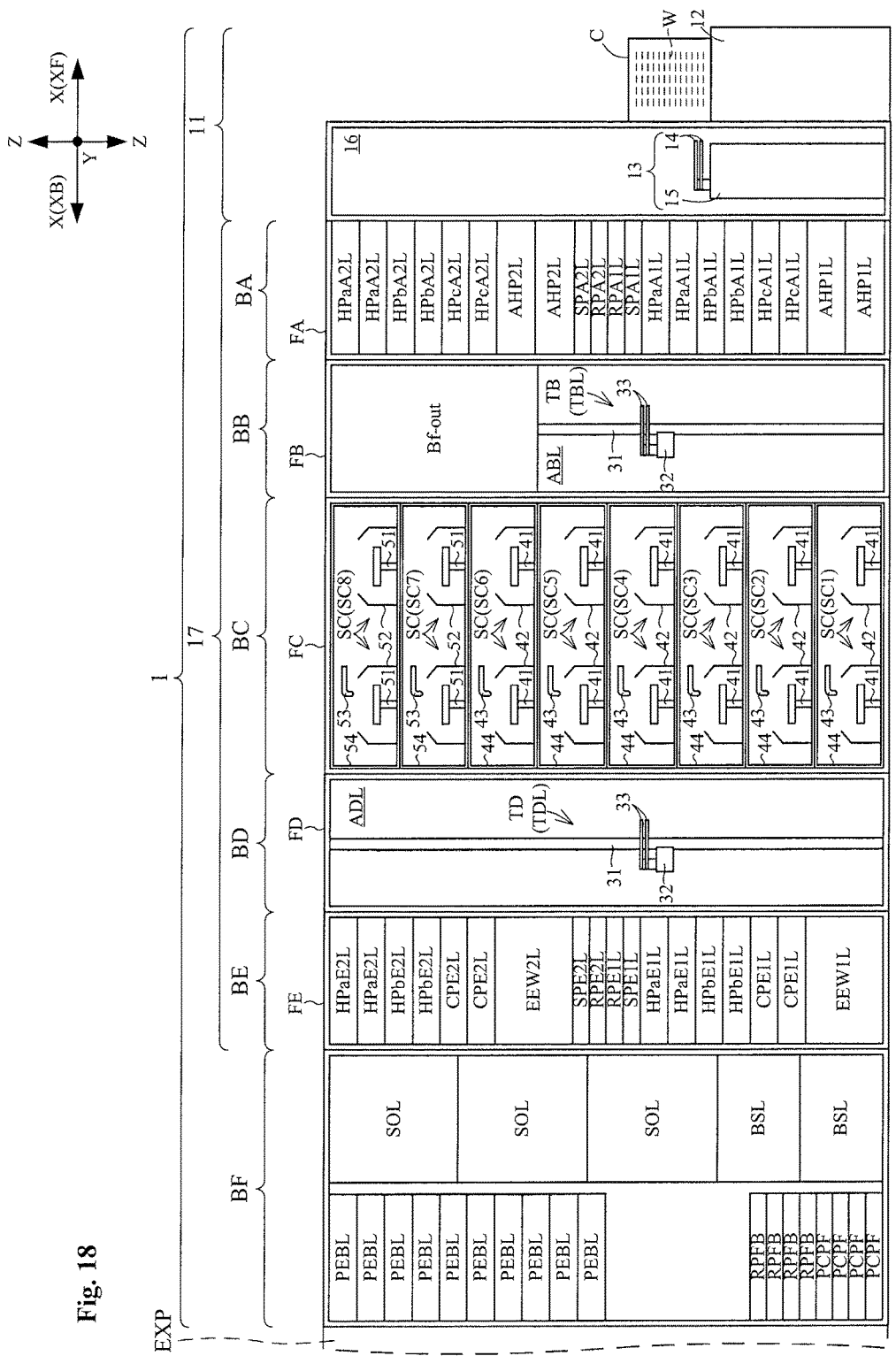
FIG. 18 is a side view taken on line a-a of FIG. 17.
Figure 19:
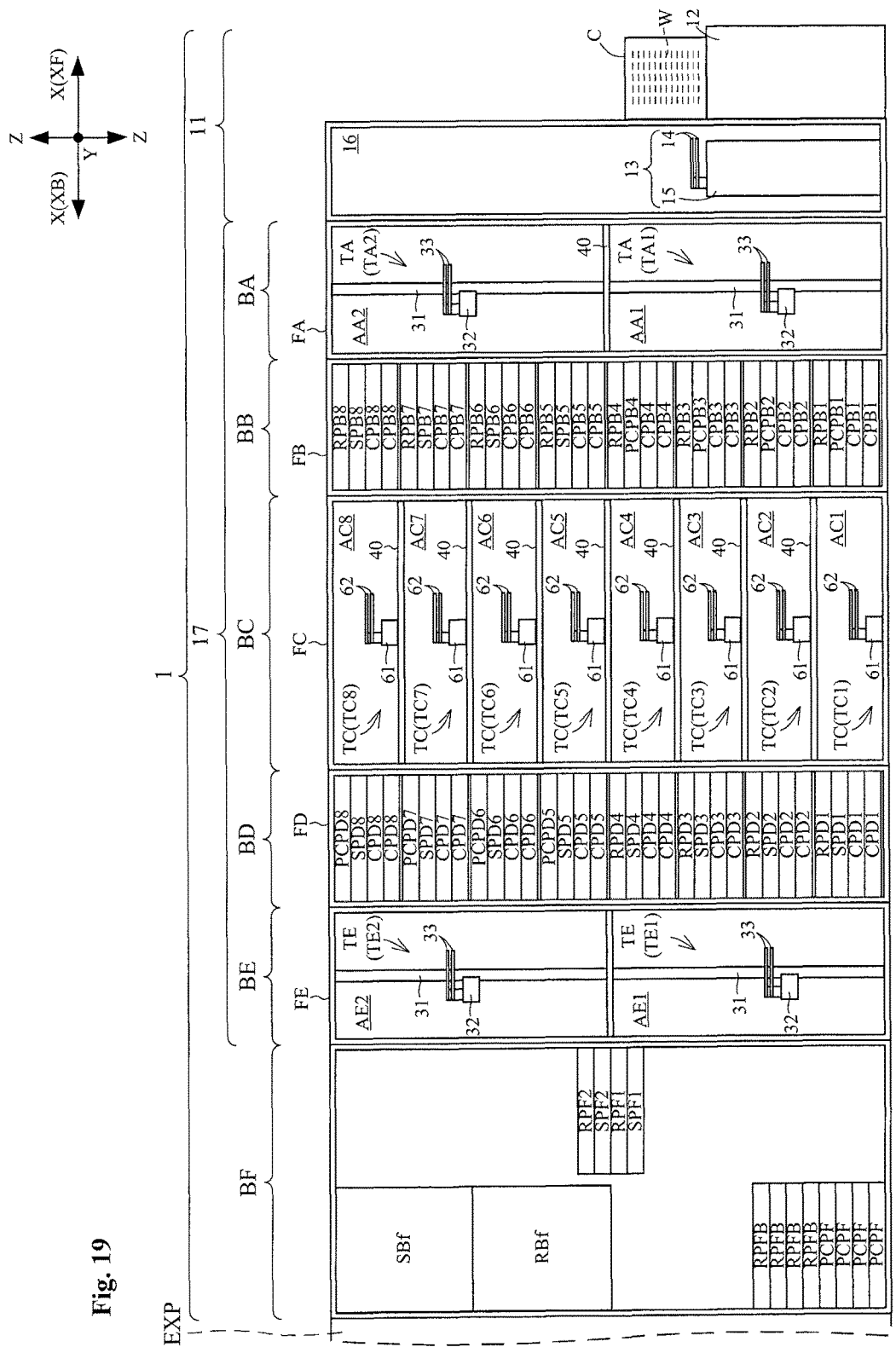
FIG. 19 is a side view taken on line b-b of FIG. 17.
Figure 20:
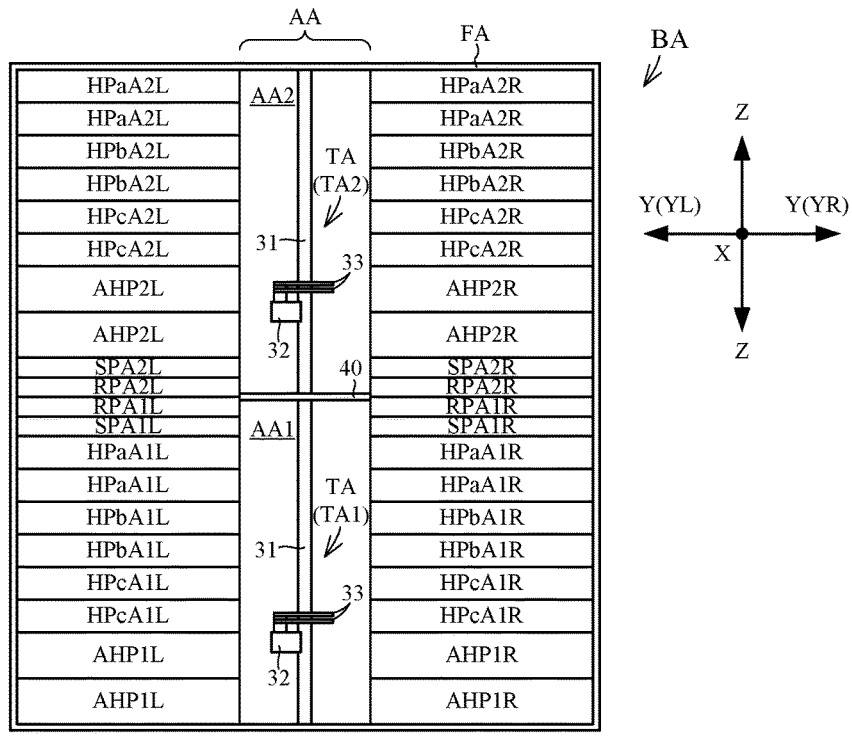
FIG. 20 is a front view of a front heat-treating block seen from an indexer section.

Reference is made to FIGS. 17 through 20. FIG. 18 is a side view taken on line a-a of FIG. 17. FIG. 19 is a side view taken on line b-b of FIG. 17. FIG. 20 is a front view of the front heat-treating block BA seen from the indexer section 11.

The front heat-treating block BA has a multistory structure including two stories arranged in the up-down direction Z. Specifically, the transporting space AA is separated into two divided transporting spaces AA1 and AA2. The divided transporting spaces AA1 and AA2 are arranged in the up-down direction Z. The divided transporting space AA1 and AA2 are arranged in this order from bottom upward.

The main transport mechanisms TA include a main transport mechanism TA1 and a main transport mechanism TA2. The main transport mechanism TA1 is installed in the divided transporting space AA1, while the main transport mechanism TA2 is installed in the divided transporting space AA2. The main transport mechanisms TA1 and TA2 are arranged in the up-down direction Z.

The front heat-treating block BA has heating units HPaA, HPbA and HPcA and hydrophobizing units AHP as heat-treating units. The front heat-treating block BA has receivers SPA and RPA. The elements HPaA, HPbA, HPcA, AHP, SPA and RPA are arranged laterally of the divided transporting spaces AA1 and AA2, respectively. In the following description, the sign of each element has attached thereto, as appropriate, a symbol indicating an installation location. The symbol indicating the installation location is a combination of number "1" or "2" which indicates a height position and "R" or "L" which indicates right side YR or left side YL. The elements opposed to the main transport mechanism TA1 is given number "1" indicating their height position. The elements opposed to the main transport mechanism TA2 is given number "2" indicating their height position. In other words, the elements arranged laterally of the divided transporting space AA1 are given number "1" indicating their height position, while the elements arranged laterally of the divided transporting space AA2 are given number "2" indicating their height position. For example, receiver SPA1R is a receiver SPA installed on the right side YR of the divided transporting space AA1, and heating unit HPaA2L is a heating unit HPaA installed on the left side YL of the divided transporting space AA2.

Each of the heating units HPaA, HPbA and HPcA heats wafers W. Each hydrophobizing unit AHP performs hydrophobic treatment for enhancing film adhesion to wafers W. Specifically, each hydrophobizing unit AHP performs temperature control of wafers W while supplying the wafers W with a treating gas including hexamethyldisilazane (HMDS).

Each heating unit HPaA has a local transport mechanism 25 besides the plate 21, chamber 23 and shutter 24 described in Embodiment 1 (see FIG. 15). The local transport mechanism 25 transports wafers W in the transverse direction Y, and places the wafers W on the plate 21. The other heating units HPbA and HPcA and the hydrophobizing units AHP also have local transport mechanisms 25.

The receivers SPA and RPA have the same construction as the receivers PA of Embodiment 1. The receivers SPA are used exclusively for receiving wafers W sent backward XB, for example. The receivers RPA are used exclusively for receiving wafers W sent forward XF, for example.

Each of the main transport mechanisms TA1 and TA2 has a guide shaft 31, a drive mechanism 32 and hands 33.

The main transport mechanism TA1 accesses each of the elements HPaA1R, HPbA1R, HPcA1R, AHP1R, SPA1R and RPA1R installed on the right side YR of the divided transporting space AA1, and each of the elements HPaA1L, HPbA1L, HPcA1L, AHP1L, SPA1L and RPA1L installed on the left side YL of the divided transporting space AA1.

The main transport mechanism TA2 accesses each of the elements HPaA2R, HPbA2R, HPcA2R, AHP2R, SPA2R and RPA2R installed on the right side YR of the divided transporting space AA2, and each of the elements HPaA2L, HPbA2L, HPcA2L, AHP2L, SPA2L and RPA2L installed on the left side YL of the divided transporting space AA2.

<Construction of Front Relay Block BB>

Figure 21:
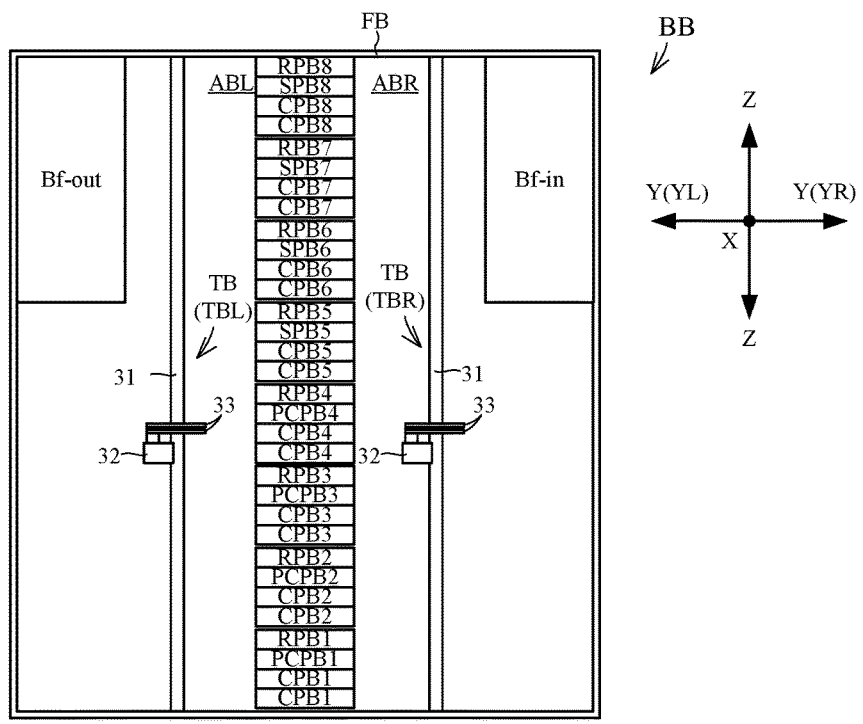
FIG. 21 is a front view of a front relay block seen from the indexer section.

Reference is made to FIGS. 17 through 19 and 21. FIG. 21 is a front view of the front relay block BB seen from the indexer section 11.

The front relay block BB has receivers SPB and RPB, cooling receivers PCPB and cooling units CPB. The cooling units CPB are one type of heat-treating units for cooling wafers W. The cooling receivers PCPB receive and also cool wafers W. The cooling receivers PCPB are one type of receivers and also one type of heat-treating units. Each cooling receiver PCPB has a plate 26 and a heat-absorbing device (not shown) for removing heat from the plate 26. The cooling receivers PCPB are open horizontally as are the receivers SPB and RPB.

The receivers SPB and RPB, cooling receivers PCPB and cooling units CPB are stacked in the up-down direction Z at the middle in the transverse direction Y of the front relay block BB.

The elements SPB, RPB, PCPB and CPB of the front relay block BB are classified into a first group located rearward XB of the divided transporting space AA1, and a second group located rearward XB of the divided transporting space AA2. The elements SPB, RPB, PCPB and CPB belonging to the first group are opposed to the main transport mechanism TA1. The elements SPB, RPB, PCPB and CPB belonging to the second group are opposed to the main transport mechanism TA2. Each of the elements SPB, RPB, PCPB and CPB belonging to the first group is given one of numbers "1", "2", "3" and "4" indicating its height position. Each of the elements SPB, RPB, PCPB and CPB belonging to the second group is given one of numbers "5", "6", "7" and "8" indicating its height position.

The solution treating block BC, as described hereinafter, has a plurality of divided transporting spaces AC1, AC2, . . . , AC8 arranged in the up-down direction Z, and transport mechanisms for solution treatment TC1, TC2, . . . , TC8 installed in the divided transporting spaces AC1, AC2, . . . , AC8, respectively. The elements SPB, RPB, PCPB and CPB of the front relay block BB are arranged such that at least one of the elements SPB, RPB, PCPB and CPB is located forward XF of each of the divided transporting spaces AC1, AC2, . . . , AC8. In other words, the elements SPB, RPB, PCPB and CPB are arranged such that at least one of the elements SPB, RPB, PCPB and CPB is opposed to each of the transport mechanisms for solution treatment TC1, TC2, TC8. The elements SPB, RPB, PCPB and CPB affixed with number "1" indicating the height position are opposed to the transport mechanism for solution treatment TC1. Similarly, the elements SPB, RPB, PCPB and CPB affixed with numbers "2", . . . "8" indicating the height positions are opposed to the transport mechanisms for solution treatment TC2, . . . TC8.

As shown in FIG. 19, a range in the up-down direction Z where the divided transporting spaces AC1-AC4 are formed is equivalent to a range in the up-down direction Z where the divided transporting space AA1 is formed. A range in the up-down direction Z where the divided transporting spaces AC5-AC8 are formed is equivalent to a range in the up-down direction Z where the divided transporting space AA2 is formed.

The front relay block BB has an in-buffer Bf-in and an out-buffer Bf-out. The in-buffer Bf-in accumulates wafers W having undergone none of the heat treatment, solution treatment and so on in the substrate treating apparatus 1. The out-buffer Bf-out accumulates wafers W having undergone a series of treatments in the substrate treating apparatus 1. The number of wafers W accumulable in each of the in-buffer Bf-in and out-buffer Bf-out is 50, for example.

The in-buffer Bf-in is disposed on the right side YR of the transporting space ABR (transport mechanism TBR). The out-buffer Bf-out is disposed on the left side YL of the transporting space ABL (transport mechanism TBL).

Each of the transport mechanisms TBR and TBL can access the elements SPB, RPB, PCPB and CPB. The transport mechanism TBR further accesses the in-buffer Bf-in, while the transport mechanism TBL further accesses the out-buffer Bf-out.

<Construction of Solution Treating Block BC>

Figure 22:
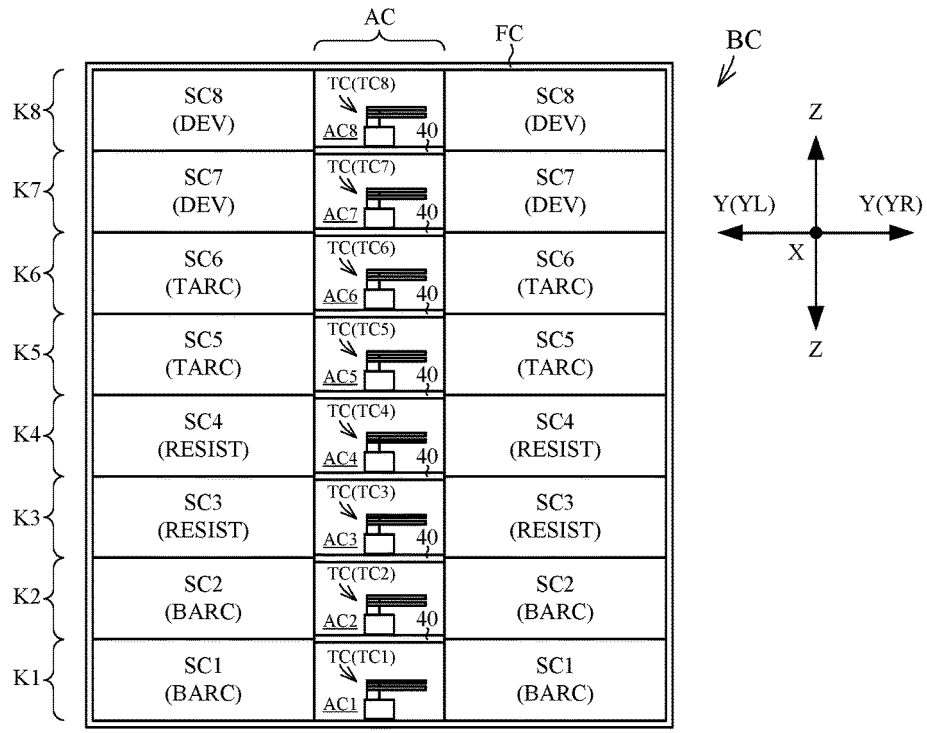
FIG. 22 is a front view of a solution treating block seen from the indexer section.

Reference is made to FIG. 17 through 19 and 22. FIG. 22 is a front view of the solution treating block BC seen from the indexer section 11.

The solution treating block BC has a multistory structure including eight stories K1, K2, . . . K8 arranged in the up-down direction Z. Specifically, a transporting space AC is separated into eight divided transporting spaces AC1, AC2, . . . , AC8. The divided transporting spaces AC1, AC2, . . . AC8 are arranged in the up-down direction Z. The divided transporting spaces AC1, AC2, . . . , AC8 are arranged in this order from bottom upward.

The transport mechanisms for solution treatment TC include transport mechanisms for solution treatment TC1, TC2, . . . , TC8. The transport mechanisms for solution treatment TC1, TC2, . . . , TC8 are installed in the divided transporting spaces AC1, AC2, . . . , AC8, respectively.

The solution treating units SC include solution treating units SC1, SC2, . . . , SC8. The solution treating units SC1, SC2, . . . , SC8 are installed laterally of the divided transporting spaces AC1, AC2, . . . , AC8, respectively.

The solution treating units SC1, SC2, . . . , SC6 are coating units. More particularly, the solution treating units SC1 and SC2 are antireflection film coating units (BARC), the solution treating units SC3 and SC4 are resist film coating units (RESIST), and the solution treating units SC5 and SC6 are protective film coating units (TARC). The antireflection film coating units SC1 and SC2 coat wafers W with an antireflection film material. The resist film coating units SC3 and SC4 coat wafers W with a resist film material. The protective film coating units SC5 and SC6 coat wafers W with a protective film material. The solution treating units SC7 and SC8 are developing units (DEV).

In Embodiment 2, as shown in FIGS. 17 and 18, two solution treating units SC are arranged on the right side YR of each transport mechanism for solution treatment TC, while two solution treating units SC are arranged on the left side YL of each transport mechanism for solution treatment TC. The two solution treating units SC installed on the right side YR of each transport mechanism for solution treatment TC share a nozzle 43/53 and a chamber 44/54. For example, the two solution treating units SC8 installed on the right side YR of the transport mechanism for solution treatment TC8 share a nozzle 53 and a chamber 54. Similarly, the two solution treating units SC installed on the left side YL of each transport mechanism for solution treatment TC also share a nozzle 43/53 and a chamber 44/54.

The transport mechanisms for solution treatment TC1, TC2, . . . , TC8 access the solution treating units SC1, SC2, . . . , SC8, respectively.

<Construction of Rear Relay Block BD>

Figure 23:
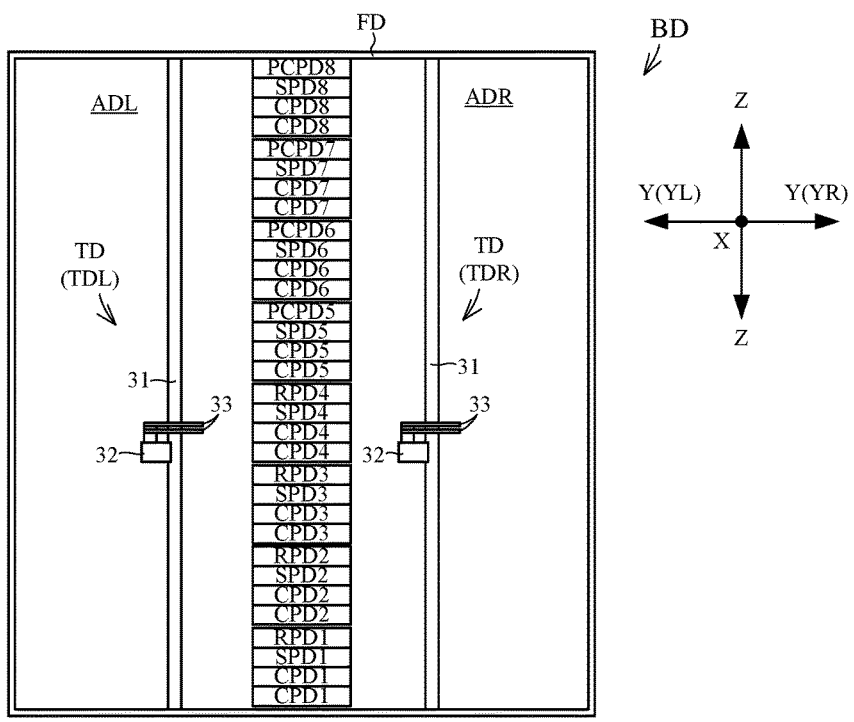
FIG. 23 is a front view of a rear relay block seen from the indexer section.

Reference is made to FIGS. 17 through 19 and 23. FIG. 23 is a front view of the rear relay block BD seen from the indexer section 11.

The rear relay block BD has receivers SPD and RPD, cooling receivers PCPD and cooling units CPD. The receivers SPD and RPD, cooling receivers PCPD and cooling units CPD are stacked in the up-down direction Z at the middle in the transverse direction Y of the rear relay block BD.

The elements SPD, RPD, PCPD and CPD of the rear relay block BD are arranged such that at least one of the elements SPD, RPD, PCPD and CPD is located rearward XB of each of the divided transporting spaces AC1, AC2, . . . , AC8. In other words, the elements SPD, RPD, PCPD and CPD are arranged such that at least one of the elements SPD, RPD, PCPD and CPD is opposed to each of the transport mechanisms for solution treatment TC1, TC2, . . . , TC8. The elements SPD, RPD, PCPD and CPD opposed to the transport mechanism for solution treatment TC1 are affixed with number "1" indicating their height position. Similarly, the elements SPD, RPD, PCPD and CPD opposed to the transport mechanisms for solution treatment TC2, . . . TC8 are affixed with numbers "2", . . . , "8" indicating their height positions.

Each of the transport mechanisms TDR and TDL can access the elements SPD, RPD, PCPD and CPD.

Buffers or the like (e.g. members corresponding to the in-buffer Bf-in and out-buffer Bf-out) are not installed on the right side YR of the transport mechanism TDR or the left side YL of the transport mechanism TDL. It is therefore possible to install pumps or the like, for example, in the right side and left side of the rear relay block BD for supplying the treating solutions to the solution treating block BC.

<Construction of Rear Heat-Treating Block BE>

Figure 24:
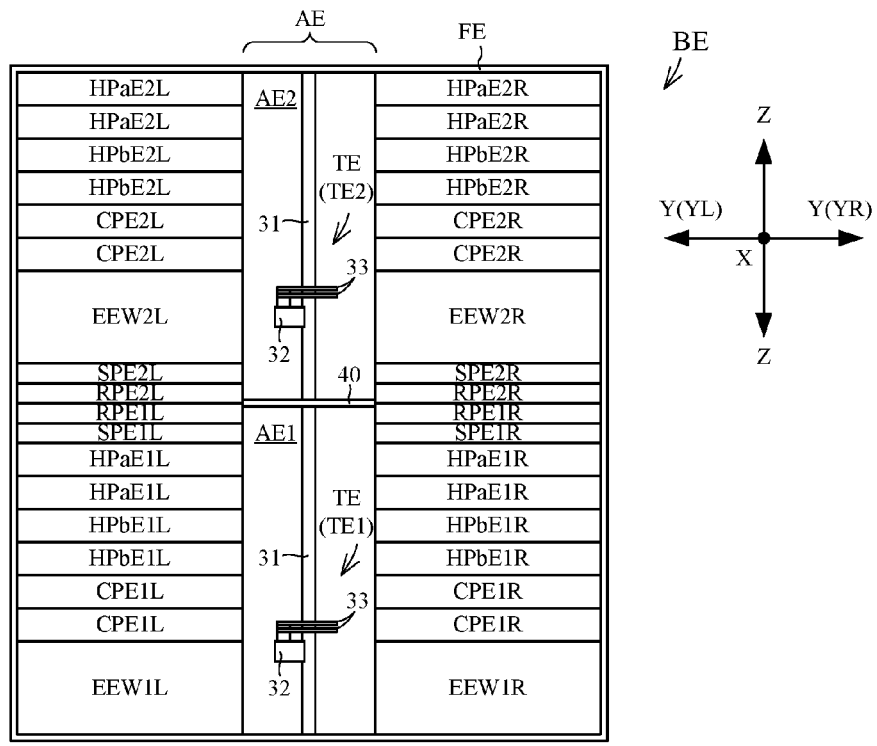
FIG. 24 is a front view of a rear heat-treating block seen from the indexer section.

Reference is made to FIGS. 17 through 19 and 24. FIG. 24 is a front view of the rear heat-treating block BE seen from the indexer section 11.

The rear heat-treating block BE has a multistory structure including two stories as does the front heat-treating block BA. Specifically, the transporting space AE is separated into divided transporting spaces AE1 and AE2.

The main transport mechanisms TE include a main transport mechanism TE1 and a main transport mechanism TE2. The main transport mechanism TE1 is installed in the divided transporting space AE1, while the main transport mechanism TE2 is installed in the divided transporting space AE2.

The transporting space AE1 is aligned in the fore-and-aft direction X with a first group of elements SPD, RPD, PCPD and CPD of the rear relay block BD. That is, the main transport mechanism TE1 is opposed to the elements SPD, RPD, PCPD and CPD belonging to the first group. The transporting space AE2 is aligned in the fore-and-aft direction X with a second group of elements SPD, RPD, PCPD and CPD of the rear relay block BD. That is, the main transport mechanism TE2 is opposed to the elements SPD, RPD, PCPD and CPD belonging to the second group. Here, the first group includes the elements SPD, RPD, PCPD and CPD each given one of numbers "1", "2", "3" and "4" indicating their height positions. The second group includes the elements SPD, RPD, PCPD and CPD each given one of numbers "5", "6", "7" and "8" indicating their height positions.

The rear heat-treating block BE has heating units HPaE and HPbE and cooling units CPE as heat-treating units. The rear heat-treating block BE also has receivers SPE and RPE and edge exposing units EEW. The edge exposing units EEW expose edge portions of the resist film on the wafers W.

The elements HPaE, HPbE, CPE, SPE, RPE and EEW are arranged laterally of the divided transporting spaces AE1 and AE2, respectively. In the following description, the sign of each element has attached thereto, as appropriate, a symbol indicating an installation location. The symbol indicating the installation location is a combination of number "1" or "2" which indicates a height position and "R" or "L" which indicates right side YR or left side YL. The elements opposed to the main transport mechanism TE1 is given number "1" indicating their height position. The elements opposed to the main transport mechanism TE2 is given number "2" indicating their height position.

<Construction of Interface Block BF>

Figure 25:
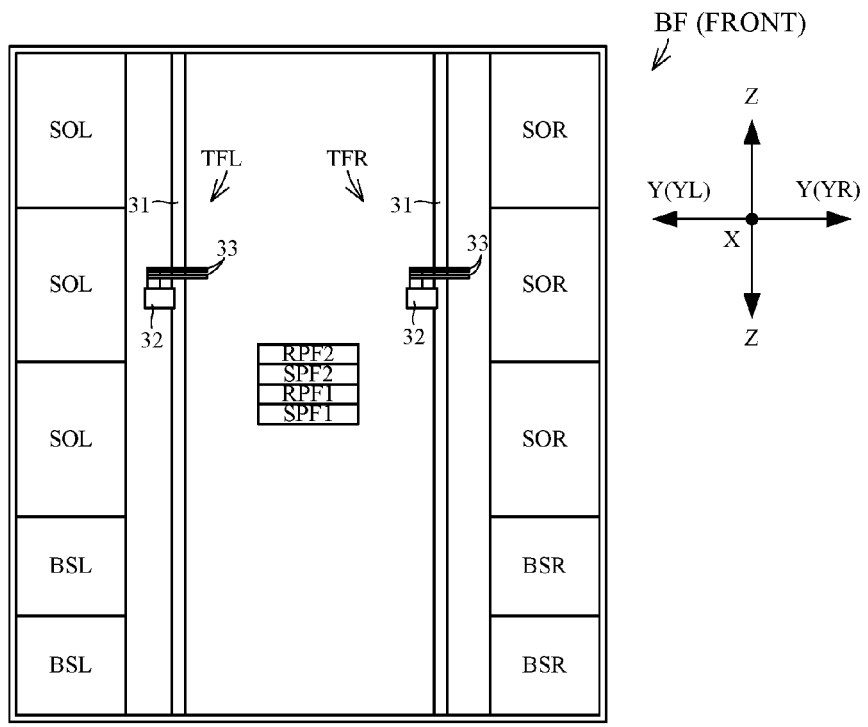
FIG. 25 is a front view of a front portion of an interface block seen from the indexer section.

Reference is made to FIGS. 17 through 19 and 25. FIG. 25 is a front view of a front portion of the interface block BF seen from the indexer section 11. Here, the front portion of the interface block BF is a portion of the interface block BF adjacent the treating section 17.

The front portion of the interface block BF has, installed therein, receivers SPF1, RPF1, SPF2 and RPF2, transport mechanisms TFR and TFL, pre-exposure cleaning units BSR and BSL, and post-exposure cleaning units SOR and SOL.

The pre-exposure cleaning units BSR and BSL clean and dry wafers W before exposing treatment. The pre-exposure cleaning units BSR and BSL clean the back surfaces and edges of the wafers W, for example. The post-exposure cleaning units SOR and SOL clean and dry wafers W after exposing treatment. Each of the pre-exposure cleaning units BSR and BSL and post-exposure cleaning units SOR and SOL has, for example, a substrate spin mechanism for spinning the wafers W, a cleaning liquid feed mechanism for feeding a cleaning liquid to the wafers W, and a cleaning instrument such as a brush for cleaning the wafers W (none of these shown).

The receivers SPF1, RPF1, SPF2 and RPF2 are arranged at the middle in the transverse direction Y of the interface block BF. The receivers SPF1, RPF1, SPF2 and RPF2 are arranged in the up-down direction Z. As shown in FIG. 19, the receivers SPF1 and RPF1 are arranged in a position opposed to the divided transporting space AE1 of the rear heat-treating block BE. The receivers SPF2 and RPF2 are arranged in a position opposed to the divided transporting space AE2 of the rear heat-treating block BE.

The transport mechanism TFR is disposed on the right side YR of the receivers SPF1, RPF1, SPF2 and RPF2. The pre-exposure cleaning units BSR and post-exposure cleaning units SOR are arranged on the right side YR of the transport mechanism TFR. The pre-exposure cleaning units BSR and post-exposure cleaning units SOR are arranged in the up-down direction Z.

The transport mechanism TFL is disposed on the left side YL of the receivers SPF1, RPF1, SPF2 and RPF2. The pre-exposure cleaning units BSL and post-exposure cleaning units SOL are arranged on the left side YL of the transport mechanism TFL. The pre-exposure cleaning units BSL and post-exposure cleaning units SOL are arranged in the up-down direction Z.

Figure 26:
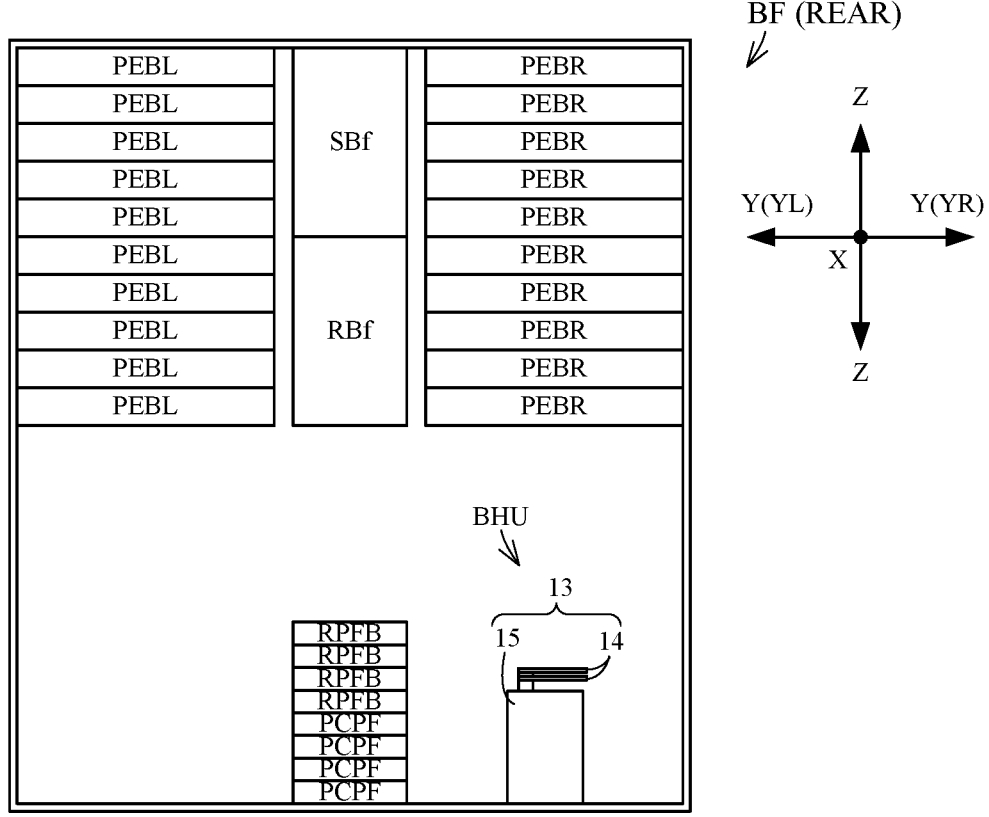
FIG. 26 is a front view of a rear portion of the interface block seen from the indexer section.

Reference is made to FIGS. 17 through 19 and 26. FIG. 26 is a front view of a rear portion of the interface block BF seen from the indexer section 11. Here, the rear portion of the interface block BF is a portion of the interface block BF adjacent the exposing machine EXP. The rear portion of the interface block BF has, installed therein, cooling receivers PCPF, receivers RPFB, a transport mechanism BHU, post-exposure heating units PEBR and PEBL, a feed buffer SBf and a return buffer RBf.

The post-exposure heating units PEBR and PEBL are one type of heat-treating units, and perform post-exposure bake for heating wafers W after exposing treatment. The feed buffer SBf accumulates wafers W before transportation to the exposing machine EXP. The return buffer RBf accumulates wafers W returned from the exposing machine EXP.

The cooling receivers PCPF and receivers RPFB are arranged at the middle in the transverse direction Y of the interface block BF. The cooling receivers PCPF and receivers RPFB are arranged in the up-down direction Z. The transport mechanism BHU is disposed on the right side YR of the cooling receivers PCPF and receivers RPFB.

The feed buffer SBf and return buffer RBf are arranged at the middle in the transverse direction Y of the interface block BF and above the cooling receivers PCPF and receivers RPFB. The feed buffer SBf and return buffer RBf are arranged in the up-down direction Z.

The post-exposure heating units PEBR are arranged on the right side YR of the feed buffer SBf and return buffer RBf. The plurality of post-exposure heating units PEBR are arranged in the up-down direction Z. The post-exposure heating units PEBL are arranged on the left side YL of the feed buffer SBf and return buffer RBf. The plurality of post-exposure heating units PEBL are arranged in the up-down direction Z.

The transport mechanism TFR accesses the receivers SPF1 and RPF1, pre-exposure cleaning units BSR, post-exposure cleaning units SOR, cooling receivers PCPF, receivers RPFB, post-exposure heating units PEBR, feed buffer SBf and return buffer RBf.

The transport mechanism TFL accesses the receivers SPF2 and RPF2, pre-exposure cleaning units BSL, post-exposure cleaning units SOL, cooling receivers PCPF, receivers RPFB, post-exposure heating units PEBL, feed buffer SBf and return buffer RBf.

The transport mechanism BHU accesses the cooling receivers PCPF and receivers RPFB. Further, the transport mechanism BHU transports wafers W to the exposing machine EXP, and receives wafers W from the exposing machine EXP.

<Relationship Between Indexer Section 11 and Block BA>

Reference is made to FIGS. 17 through 19. The indexer's transport mechanism 13 and the main transport mechanisms TA transport wafers W reciprocally. Specifically, the receivers SPA and RPA are open to the indexer section 11 (transporting space 16), whereby the indexer's transport mechanism 13 can access the receivers SPA and RPA. The indexer's transport mechanism 13 and the main transport mechanism TA1 transport wafers W reciprocally through the receivers SPA1R, SPA1L, RPA1R and RPA1L. The indexer's transport mechanism 13 and the main transport mechanism TA2 transport wafers W reciprocally through the receivers SPA2R, SPA2L, RPA2R and RPA2L.

<Relationship Between Front Heat-Treating Block BA and Front Relay Block BB>

The main transport mechanisms TA and the transport mechanisms TB can transport wafers W reciprocally.

Specifically, the transport mechanism TBR can access the receivers SPA1R, RPA1R, SPA2R and RPA2R arranged in the right side YR of the transporting space AA. Consequently, the main transport mechanism TA1 and the transport mechanism TBR can transport wafers W reciprocally through the receivers SPA and RPA1R. The main transport mechanism TA2 and the transport mechanism TBR can transport wafers W reciprocally through the receivers SPA2R and RPA2R.

Similarly, the transport mechanism TBL can access the receivers SPA1L, RPA1L, SPA2L and RPA2L arranged in the left side YL of the transporting space AA. Consequently, the main transport mechanism TA1 and the transport mechanism TBL can transport wafers W reciprocally through the receivers SPA1L and RPA1L. The main transport mechanism TA2 and the transport mechanism TBL can transport wafers W reciprocally through the receivers SPA2L and RPA2L.

The main transport mechanism TA1 can access the first group of elements SPB, RPB, PCPB and CPB of the front relay block BB. The main transport mechanism TA1 and the transport mechanisms TBR/TBL can therefore transport wafers W reciprocally through the first group of elements SPB, RPB, PCPB and CPB of the front relay block BB.

Similarly, the main transport mechanism TA2 can access the second group of elements SPB, RPB, PCPB and CPB of the front relay block BB. The main transport mechanism TA2 and the transport mechanisms TBR/TBL can therefore transport wafers W reciprocally through the second group of elements SPB, RPB, PCPB and CPB of the front relay block BB.

The transport mechanism TBR can further access the heat-treating units HPaA1R, HPbA1R, HPcA1R, AHP1R, HPaA2R, HPbA2R, HPcA2R and AHP2R arranged on the right side YR of the transporting space AA. The transport mechanism TBL can further access the heat-treating units HPaA1L, HPbA1L, HPcA1L, AHP1L, HPaA2L, HPbA2L, HPcA2L and AHP2L arranged on the left side YL of the transporting space AA.

<Relationship Between Indexer Section 11, Block BA, and Block BB>

The indexer's transport mechanism 13 and the transport mechanisms TB can transport wafers W reciprocally without using the main transport mechanisms TA.

Specifically, the indexer's transport mechanism 13 and the transport mechanism TBR can transport wafers W reciprocally through any one of the receivers SPA1R and RPA1R and receivers SPA2R and RPA2R. The indexer's transport mechanism 13 and the transport mechanism TBL can transport wafers W reciprocally through any one of the receivers SPA1L and RPA1L and receivers SPA2L and RPA2L.

<Relationship Between Block BB and Block BC>

The transport mechanisms TB and the transport mechanisms for solution treatment TC can transport wafers W reciprocally.

Specifically, the transport mechanism for solution treatment TC1 can access the receiver RPB1 and cooling receiver PCPB1 opposed to the transport mechanism solution treatment TC1. The transport mechanisms TBR/TBL and the transport mechanism for solution treatment TC1 can transport wafers W reciprocally through the receiver RPB1 or cooling receiver PCPB1. Similarly, each of the transport mechanisms for solution treatment TC2, TC3, . . . , TC8 can transfer wafers W to/from the transport mechanisms TBR/TBL through the receiver SPB or RPB or cooling receiver PCPB opposed the transport mechanism TC2, TC3, . . . , or TC8.

<Relationship Between Block BA, Block BB and Block BC>

The main transport mechanisms TA and the transport mechanisms for solution treatment TC can transport wafers W reciprocally without using the transport mechanisms TB. For example, the main transport mechanism TA1 and the transport mechanisms for solution treatment TC1/TC2/TC3/TC4 can transport wafers W reciprocally through the first group of elements SPB, RPB, PCPB and CPB of the front relay block BB. The main transport mechanism TA2 and the transport mechanisms for solution treatment TC5/TC6/TC7/TC8 can transport wafers W reciprocally through the second group of elements SPB, RPB, PCPB and CPB of the front relay block BB.

<Relationship Between Block BC and Block BD>

The relationship between the solution treating block BC and the rear relay block BD is the same as the relationship between the front relay block BB and the solution treating block BC. That is, each of the transport mechanisms for solution treatment TC1, TC2, . . . , TC8 can transfer wafers W to/from the transport mechanisms TDR/TDL.

<Relationship Between Block BD and Block BE>

The relationship between the rear relay block BD and the rear heat-treating block BE is the same as the relationship between the front relay block BB and the front heat-treating block BA.

Specifically, the transport mechanism TDR and the main transport mechanism TE1 can transport wafers W reciprocally through the receivers SPE1R and RPE1R. The transport mechanism TDR and the main transport mechanism TE2 can transport wafers W reciprocally through the receivers SPE2R and RPE2R. Similarly, transport mechanism TDL and the main transport mechanism TE1 can transport wafers W reciprocally through the receivers SPE1L and RPE1L. The transport mechanism TDL and the main transport mechanism TE2 can transport wafers W reciprocally through the receivers SPE2L and RPE2L. The transport mechanisms TDR/TDL and the main transport mechanism TE1 can transport wafers W reciprocally through the first group of elements SPD, RPD, PCPD and CPD of the rear relay block BD. The transport mechanisms TDR/TDL and the main transport mechanism TE2 can transport wafers W reciprocally through the second group of elements SPD, RPD, PCPD and CPD of the rear relay block BD.

The transport mechanism TDR can transport wafers W to the heating units HPaE1R, HPbE1R, HPaE2R and HPbE2R, the cooling units CPE1R and CPE2R and the edge exposing units EEW1R and EEW2R arranged on the right side YR of the transporting space AE. The transport mechanism TDL can transport wafers W to the heating units HPaE1L, HPbE1L, HPaE2L and HPbE2L, the cooling units CPE1L and CPE2L and the edge exposing units EEW1L and EEW2L arranged on the left side YL of the transporting space AE.

<Relationship Between Block BC, Block BD and Block BE>

The relationship between the solution treating block BC, the rear relay block BD and the rear heat-treating block BE is the same as the relationship between the solution treating block BC, the front relay block BB and the front heat-treating block BA. That is, the transport mechanisms for solution treatment TC and the main transport mechanisms TE can transport wafers W reciprocally without using the transport mechanisms TD.

<Relationship Between Block BE and Interface Block BF>

The main transport mechanisms TE and the transport mechanisms TF can transport wafers W reciprocally.

Specifically, the main transport mechanism TE1 can access the receivers SPF1 and RPF1. The main transport mechanism TE2 can access the receivers SPF2 and RPF2. The transport mechanism TFR can access the receivers SPE1R, RPE1R, SPE2R and RPE2R. The transport mechanism TFL can access the receivers SPE1L, RPE1L, SPE2L and RPE2L. Consequently, the main transport mechanism TE1 and the transport mechanism TFR can transport wafers W reciprocally through the receivers SPE1R, RPE1R, SPF1 and RPF1. The main transport mechanism TE2 and the transport mechanism TFR can transport wafers W reciprocally through the receivers SPE2R, RPE2R, SPF2 and RPF2. The main transport mechanism TE1 and the transport mechanism TFL can transport wafers W reciprocally through the receivers SPE1L, RPE1L, SPF1 and RPF1. The main transport mechanism TE2 and the transport mechanism TFL can transport wafers W reciprocally through the receivers SPE2L, RPE2L, SPF2 and RPF2.

The transport mechanism TFR can transport wafers W to the heating units HPaE1R, HPbE1R, HPaE2R and HPbE2R, the cooling units CPE1R and CPE2R and the edge exposing units EEW1R and EEW2R arranged on the right side YR of the transporting space AE. The transport mechanism TFL can transport wafers W to the heating units HPaE1L, HPbE1L, HPaE2L and HPbE2L, the cooling units CPE1L and CPE2L and the edge exposing units EEW1L and EEW2L arranged on the left side YL of the transporting space AE.

<Relationship Between Interface Block BF and Exposing Machine EXP>

The transport mechanism BHU transports wafers W to the exposing machine EXP, and receives wafers W from the exposing machine EXP.

<Substrate Transport Routes in Treating Section 17>

Figure 27:
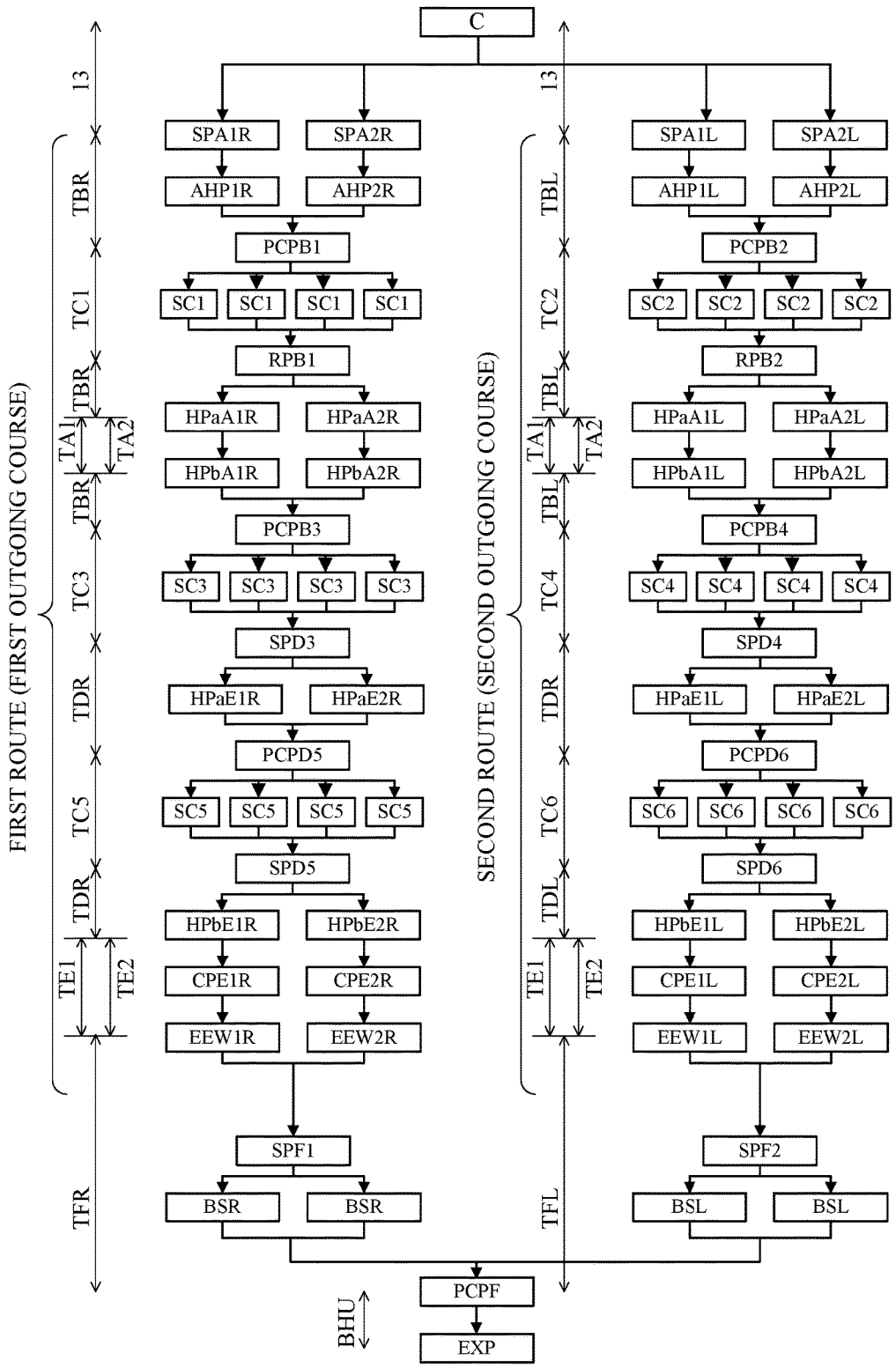
FIG. 27 is a view schematically showing outgoing transport routes for the substrates.
Figure 28:
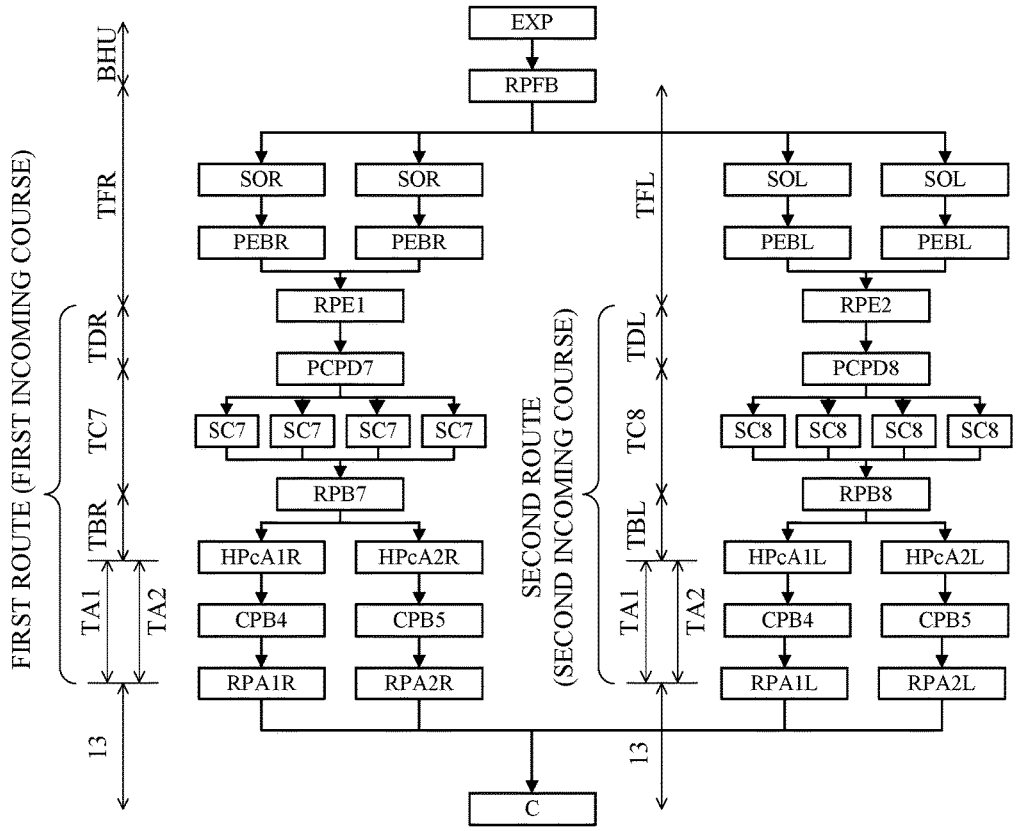
FIG. 28 is a view schematically showing incoming transport routes for the substrates.

FIG. 27 is a view schematically showing transport routes of outgoing wafers W. FIG. 28 is a view schematically showing transport routes of incoming wafers W. As shown in FIGS. 27 and 28, the number of transport routes of wafers W in the treating section 17 is two. Specifically, the treating section 17 has a first route and a second route. For expediency of description, the transport routes of wafers W in the treating section 17 are divided into outgoing courses and incoming courses. The first route includes a first outgoing course and a first incoming course. The second route includes a second outgoing course and a second incoming course.

There is no treating unit or receiver included in both the first route and the second route. That is, the first route and the second route are completely separated. Each element on the first route is an example of one of the first receiver, first heat-treating unit and first solution treating unit in this invention. Each element on the second route is an example of one of the second receiver, second heat-treating unit and second solution treating unit in this invention.

On the first route, a plurality of treating units that perform the same treatment are arranged in parallel, such as hydrophobizing treating units AHP1R or solution treating units SC1. On the second route also, various types of treating units are arranged in parallel, respectively.

A transport mechanism group for transporting wafers W along the first route includes transport mechanisms TA1, TA2, TBR, TC1, TC3, TC5, TC7, TDR, TE1 and TE2. A transport mechanism group for transporting wafers W along the second route includes transport mechanisms TA1, TA2, TBL, TC2, TC4, TC6, TC8, TDL, TE1 and TE2. The main transport mechanism TA1, for example, belongs to both the first transport mechanism group and the second transport mechanism group. Thus, there exist transport mechanisms common to the first transport mechanism group and the second transport mechanism. That is, the first transport mechanism group and the second transport mechanism group are not independent of each other.

<Examples of Operation of Substrate Treating Apparatus 1>

Figure 29:
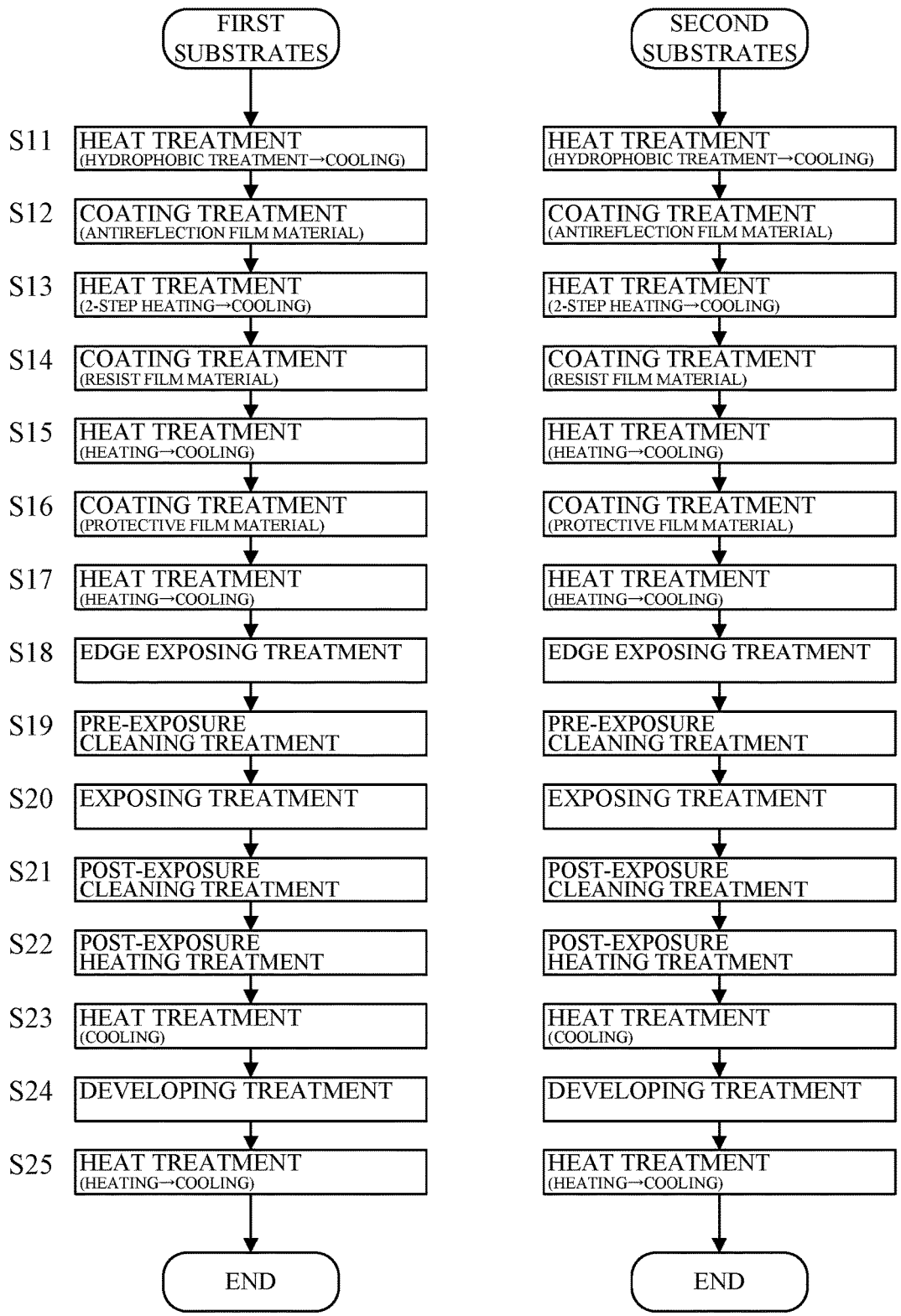
FIG. 29 is a flow chart showing a sequence of treatments given to the substrates.

Examples of operation of the substrate treating apparatus 1 in Embodiment 2 will be described with reference to FIGS. 27 through 30. FIG. 29 is a flow chart showing a sequence of treatment given to substrates. FIG. 30 is a view schematically showing examples of operation repeatedly carried out by the respective transport mechanisms.

<Operation of Indexer Section 11 for Feeding Wafers W to Treating Section 17>

The indexer's transport mechanism 13 transports wafers W from a carrier C to the receivers SPA. For example, the indexer's transport mechanism 13 transports wafers W to the receivers SPA1R, SPA1L, SPA2R and SPA2L in turn.

<Operation of Treating Section 17 (Outgoing Course)>

Since operation relating to the first outgoing course and operation relating to the second outgoing course are similar, the operation relating to the first outgoing course will be described for expediency, omitting description of the operation relating to the second outgoing course.

The transport mechanism TBR transports wafers W from the receivers SPA1R/SPA2R to the hydrophobizing units AHP1R/AHP2R.

When the feeding of wafers W from the indexer section 11 to the treating section 17 is stopped, no wafers W will be placed on the receivers SPA. In such a case, the transport mechanism TBR transports wafers from the in-buffer Bf-in to the hydrophobizing units AHP1R/AHP2R. Wafers W are accumulated beforehand in the in-buffer Bf-in.

The hydrophobizing units AHP1R/AHP2R perform hydrophobic treatment of wafers W. The transport mechanism TBR transports the wafers W from the hydrophobizing units AHP1R/AHP2R to the cooling receiver PCPB1. The cooling receiver PCPB1 cools the wafers W. The series of heat treatments by the hydrophobizing units AHP1R/AHP2R and cooling receiver PCPB1 corresponds to step S11 shown in FIG. 29.

The transport mechanism for solution treatment TC1 transports the wafers W from the cooling receiver PCPB1 to the solution treating units SC1. The solution treating units SC1 coat the wafers W with the antireflection film material (step S12). The transport mechanism for solution treatment TC1 transports the wafers W from the solution treating units SC1 to the receiver RPB1.

The transport mechanism TBR transports the wafers W from receiver RPB1 to the heating units HPaA1R and HPaA2R. The heating units HPaA1R and HPaA2R heat the wafers W. The main transport mechanism TA1 transports the wafer W from the heating unit HPaA1R to the heating unit HPbA1R. The main transport mechanism TA2 transports the wafer W from the heating unit HPaA2R to the heating unit HPbA2R. The heating units HPbA1R and HPbA2R heat the wafers W. For example, the temperature to which the heating units HPbA1R and HPbA2R heat the wafers W is higher than that of the heating units HPaA1R and HPaA2R. According to such two-step heating, the temperature of the wafers W can be increased promptly. The transport mechanism TBR transports the wafers W from the heating units HPbA1R and HPbA2R to the cooling receiver PCPB3. The cooling receiver PCPB3 cools the wafers W. The series of heat treatments by the heating units HPaA1R, HPbA1R, HPaA2R and HPbA2R and the cooling receiver PCPB3 corresponds to step S13 shown in FIG. 29.

The transport mechanism for solution treatment TC3 transports the wafers W from the cooling receiver PCPB3 to the solution treating units SC3. The solution treating units SC3 coat the wafers W with the resist film material (step S14).

The transport mechanism for solution treatment TC3 transports the wafers W from the solution treating units SC3 to the receiver SPD3. The transport mechanism TDR transports the wafers W from the receiver SPD3 to the heating units HPaE1R and HPaE2R. The heating units HPaE1R and HPaE2R heat the wafers W. The transport mechanism TDR transports the wafers W from the heating units HPaE1R and HPaE2R to the cooling receiver PCPD5. The cooling receiver PCPD5 cools the wafers W. The series of heat treatments by the heating units HPaE1R and HPaE2R and the cooling receiver PCPD5 corresponds to step S15 shown in FIG. 29.

The transport mechanism for solution treatment TC5 transports the wafers W from the cooling receiver PCPD5 to the solution treating units SC5. The solution treating units SC5 coat the wafers W with the protective film material (Step S16).

The transport mechanism for solution treatment TC5 transports the wafers W from the solution treating unit SC5 to the receiver SPD5. The transport mechanism TDR transports the wafers from the receiver SPD5 to the heating units HPbE1R and HPbE2R. The heating units HPbE1R and HPbE2R heat the wafers W. The main transport mechanism TE1 transports the wafer W from the heating unit HPbE1R to the cooling unit CPE1R. The main transport mechanism TE2 transports the wafer W from the heating unit HPbE2R to the cooling unit CPE2R. The cooling units CPE1R and CPE2R cool the wafers W. The series of heat treatments by the heating units HPbE1R and HPbE2R and the cooling units CPE and CPE2R corresponds to step S17 shown in FIG. 29.

The main transport mechanism TE1 transports the wafer W from the cooling unit CPE1R to the edge exposing unit EEW1R. The main transport mechanism TE2 transports the wafer W from the cooling unit CPE2R to the edge exposing unit EEW2R. The edge exposing units EEW1R and EEW2R expose edge regions of the wafers W (step S18).

The transport mechanism TFR transports the wafers W from the edge exposing units EEW1R and EEW2R to the interface block BF (receiver SPF1).

<Operation of Interface Block BF and Exposing Machine EXP>

The transport mechanism TFR transports the wafers W from the receiver SPF1 to the pre-exposure cleaning units BSR. The pre-exposure cleaning units BSR clean the wafers W (step S19).

The transport mechanism TFR transports the wafers W from the pre-exposure cleaning units BSR to the cooling receiver PCPF. The cooling receiver PCPF adjusts the wafers W to a predetermined temperature.

The transport mechanism BHU transports the wafers W from the cooling receiver PCPF to the exposing machine EXP. The exposing machine EXP performs exposing treatment of the wafers W (step S20).

The transport mechanism BHU transports wafers W from the exposing machine EXP to the receiver RPFB. The transport mechanism TFR transports the wafers W from the receiver RPFB to the post-exposure cleaning units SOR. The post-exposure cleaning units SOR clean the wafers W (step S21).

The transport mechanism TFR transports the wafers W from the post-exposure cleaning units SOR to the post-exposure heating units PEBR. The post-exposure heating units PEBR heat the wafers W (step S22).

The transport mechanism TFR transports the wafers W from the post-exposure heating units PEBR to the receiver RPE1.

<Operation of Treating Section 17 (Incoming Course)>

Since operation relating to the first incoming course and operation relating to the second incoming course are similar, the operation relating to the first incoming course will be described for expediency, omitting description of the operation relating to the second incoming course.

The transport mechanism TDR transports the wafers W from the receiver RPE1 to the cooling receiver PCPD7. The cooling receiver PCPD7 cools the wafers W (step S23).

The transport mechanism for solution treatment TC7 transports the wafers W from the cooling receiver PCPD7 to the solution treating units SC7. The solution treating units SC7 develop the wafers W (step S24).

The transport mechanism for solution treatment TC7 transports the wafers W from the solution treating units SC7 to the receiver RPB7. The transport mechanism TBR transports the wafers W from the receiver RPB7 to the heating units HPcA1R and HPcA2R. The heating units HPcA1R and HPcA2R heat the wafers W. The main transport mechanism TA1 transports the wafer W from the heating unit HPcA1R to the cooling unit CPB4. The main transport mechanism TA2 transports the wafer W from the heating unit HPcA2R to the cooling unit CPB5. The cooling units CPB4 and CPB5 cool the wafers W. The series of heat treatments by the heating units HPcA1R and HPcA2R and the cooling units CPB4 and CPB5 corresponds to step S25 shown in FIG. 29.

The main transport mechanism TA1 transports the wafer W from the cooling unit CPB4 to the receiver RPA1R. The main transport mechanism TA2 transports the wafer W from the cooling unit CPB5 to the receiver RPA2R.

<Operation of Indexer Section 11 for Collecting Wafers W from Treating Section 17>

The indexer's transport mechanism 13 transports wafers W from the receivers RPA1R/RPA2R to a carrier C.

When the operation of the indexer section 11 for collecting wafers W from the treating section 17 is stopped, the wafers W will remain on the receivers RPA to prevent new wafers W from being placed on the receivers RPA. In such a case, the wafers W may be transported from the cooling units CPB4/CPB5 to the out-buffer Bf-out. Consequently, the wafers W having undergone the series of treatments in the substrate treating apparatus 1 are accumulated in the out-buffer Bf-out. Here, the series of treatments in the substrate treating apparatus 1 is the series of treatments in steps S11 through S25 described above. The transport mechanisms TBR and TBL may be used to transport the wafers W to the out-buffer Bf-out.

<Effects of Embodiment 2>

As described above, the substrate treating apparatus 1 in Embodiment 2 produces effects similar to those of Embodiment 1.

In particular, the influence of the heating units HPa and hydrophobizing units AHP which emit hot heat or treating gas exerted on the solution treating units SC can be reduced. The influence of the heating units HPaE and HPbE which emit hot heat or treating gas exerted on the solution treating units SC can also be reduced.

The substrate treating apparatus 1 in Embodiment 2 can carry out various types of treatment of wafers W. For example, this apparatus 1 can form resist film, antireflection film and protective film on the wafers W.

In Embodiment 2, the main transport mechanisms TA1 and TA2 are arranged in the up-down direction Z. The main transport mechanism TA1 is opposed to the first group of elements SPB, RPB, PCPB and CPB of the front relay block BB. The main transport mechanism TA1 and transport mechanism TBR can therefore transport wafers W reciprocally to each other. The main transport mechanism TA2 is opposed to the second group of elements SPB, RPB, PCPB and CPB of the front relay block BB. The main transport mechanism TA2 and transport mechanism TBL can therefore transport wafers W reciprocally to with each other in a convenient way.

The front relay block BB has the in-buffer Bf-in. Therefore, even when the feeding of wafers W from the indexer section 11 to the treating section 17 is stopped, the treating section 17 can treat the wafers W accumulated in the in-buffer Bf-in.

The front relay block BB has the out-buffer Bf-out. Therefore, even when the delivery of wafers W from the treating section 17 to the indexer section 11 (in other words, the collection of wafers W by the indexer section 11) is stopped, the treating section 17 can accumulate the wafers W in the out-buffer Bf-out. These features can inhibit a reduction in production capacity of the substrate treating apparatus 1.

In the substrate treating apparatus 1 in Embodiment 2, the indexer section 11 and front heat-treating block BA are in direct connection, and the interface block BF and rear heat-treating block BE are in direct connection. Assume now that the apparatus having the indexer section 11 and rear heat-treating block BE in direct connection, and the interface block BF and front heat-treating block BA in direct connection is called "substrate treating apparatus 1R". Then, the substrate treating apparatus 1R will exert functions equivalent to those of the substrate treating apparatus 1 in Embodiment 2. It is therefore possible to assemble substantially the same apparatus by connecting the indexer section 11 to any one of blocks BA and BE. Substantially the same apparatus can be assembled by connecting the interface block BF to any one of block BA and BE. This feature can simplify an operation for assembling the substrate treating apparatus 1.

This invention is not limited to the foregoing embodiments, but may be modified as follows:

(1) In Embodiment 1 described hereinbefore, as shown in FIG. 14, both of a wafer W unloaded from a solution treating unit SC1 and a wafer W unloaded form a solution treating unit SC2 are transported to the rear heat-treating block BE. This is not limitative. That is, the wafer W unloaded from the solution treating unit SC1 may be transported to one of the front heat-treating block BA and rear heat-treating block BE, the wafer W unloaded from the solution treating unit SC2 to the other of the front heat-treating block BA and rear heat-treating block BE.

In other words, in Embodiment 1 described hereinbefore, the heat treatment in step 2 shown in FIG. 13 is performed in the rear heat-treating block BE, regardless of whether the wafer W is the first wafer W or the second wafer W. This is not limitative. For example, the heat treatment in step 2 may be performed for the first wafer W in one of the front heat-treating block BA and rear heat-treating block BE, and the heat treatment in step 2 may be performed for the second wafer W in the other of the front heat-treating block BA and rear heat-treating block BE.

Figure 31:
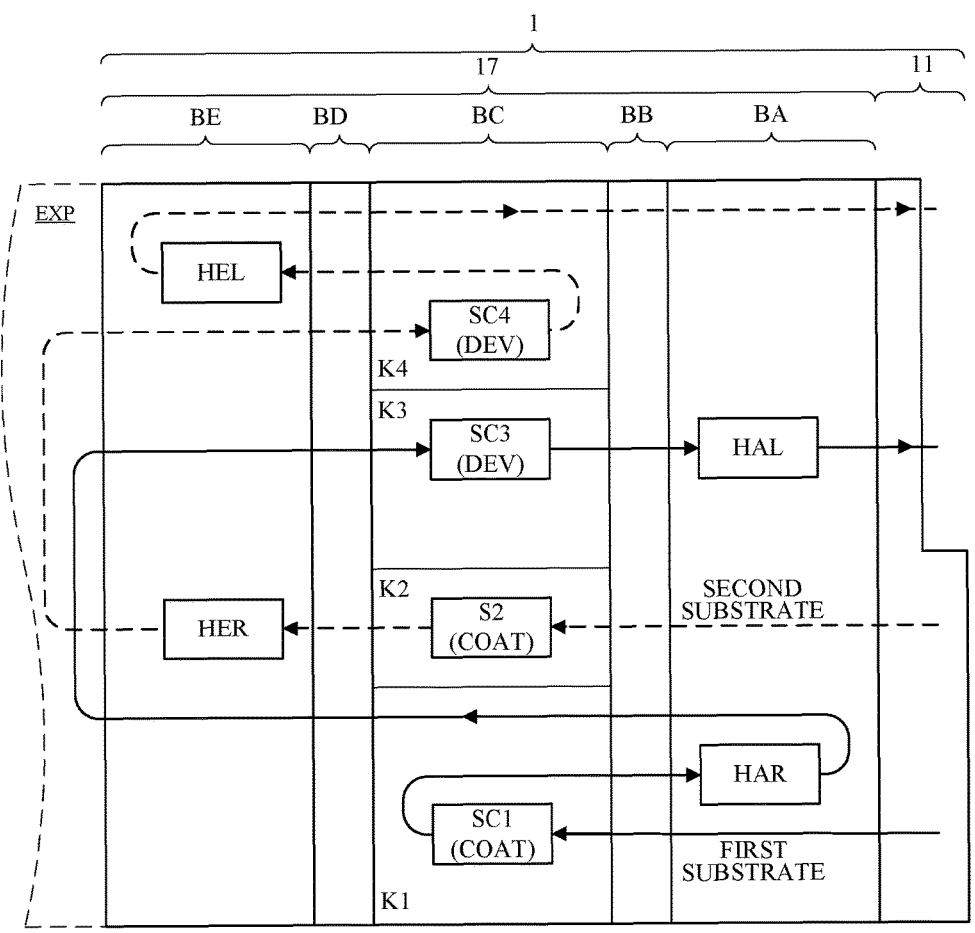
FIG. 31 is a conceptual diagram schematically showing how a first substrate and a second substrate move between the blocks in a modified embodiment.

Reference is made to FIG. 31. FIG. 31 is a conceptual diagram schematically showing how a first wafer W and a second wafer W move between blocks BA-BE in a modified embodiment. As shown, the first wafer W is transported from a solution treating unit SC1 to the front heat-treating block BA, and the second wafer W is transported from a solution treating unit SC2 to the rear heat-treating block BE. The first wafer W is heat-treated in a heat-treating unit HAR of the front heat-treating block BA (step S2). The second wafer W is heat-treated in a heat-treating unit HER of the rear heat-treating block BE (step S2).

The first wafer W is transported from a solution treating unit SC3 to the front heat-treating block BA, and the second wafer W from a solution treating unit SC4 to the rear heat-treating block BE. The first wafer W is heat-treated in a heat-treating unit HAL of the front heat-treating block BA (step S5). The second wafer W is heat-treated in a heat-treating unit HEL of the rear heat-treating block BE (Step S5). Such modified embodiment can also perform the same series of treatments for the first wafer W and second wafer W.

(2) In Embodiments 1 and 2 described hereinbefore, the construction of solution treating block BC may be changed as appropriate. For example, the number of stories K in the solution treating block BC may be changed. For example, the number of transport mechanisms for solution treatment TC in the solution treating block BC may be changed. For example, the number of solution treating units SC in the solution treating block BC may be changed. For example, the contents of treatment of the solution treating units SC in the solution treating block BC may be changed.

Figure 32A:
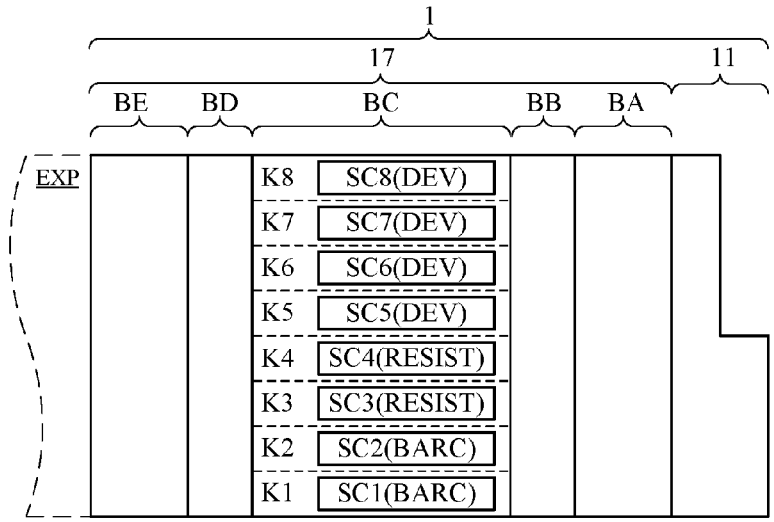
FIGS. 32A, 32B and 32C are side views schematically showing constructions of solution treating blocks according to modified embodiments, respectively.
Figure 32B:
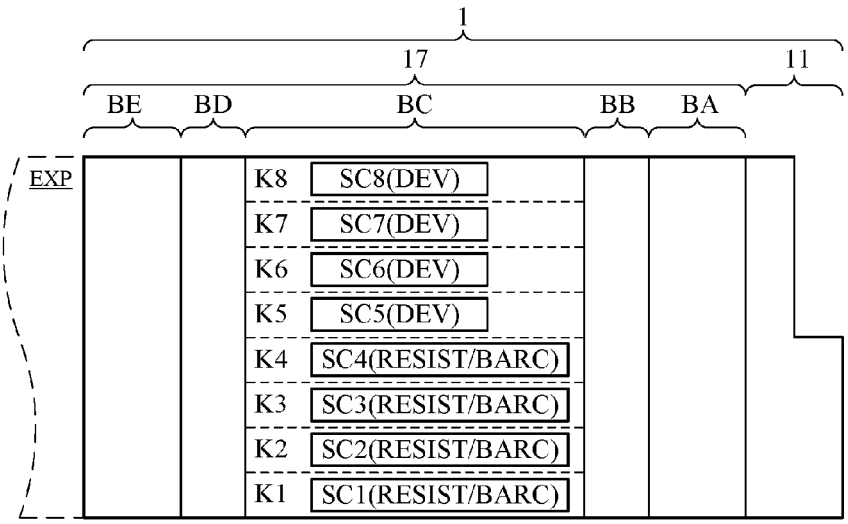
Figure 32C:
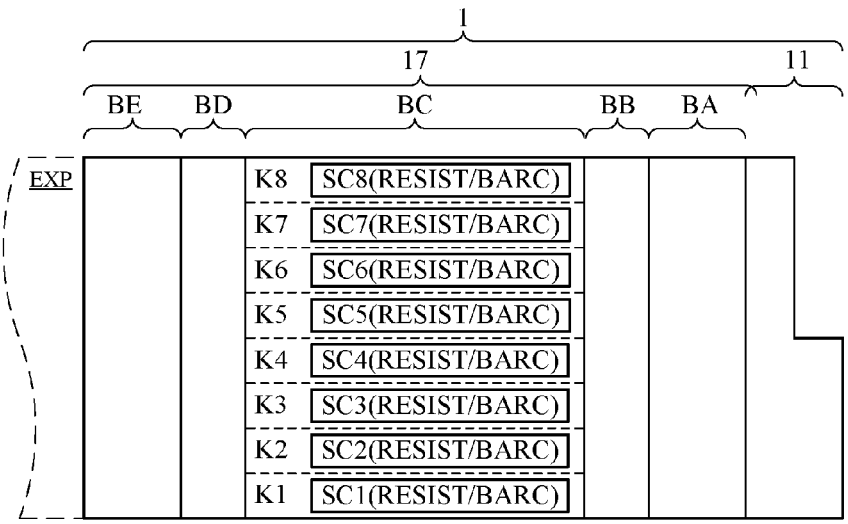

FIGS. 32A, 32B and 32C are side views schematically showing constructions of solution treating blocks according to modified embodiments, respectively.

In the modified embodiment shown in FIG. 32A, the solution treating block BC has eight stories K1, K2, ..., K8. Solution treating units SC1, SC2, ..., SC8 are provided for the respective stories K1, K2, ..., K8. The solution treating units SC1 and SC2 on the stories K1 and K2 are antireflection film coating units (BARC). The solution treating units SC3 and SC4 on the stories K3 and K4 are resist film coating units (RESIST). The solution treating units SC5-SC8 on the stories K5-K8 are developing units (DEV).

In the modified embodiment shown in FIG. 32B, solution treating units SC1 on a story K1 are coating units (RESIST/BARC) which apply the antireflection film material and resist film material. For example, a plurality of solution treating units SC1 are provided on the story K1, in which part of the solution treating units SC1 are antireflection film coating units (BARC), and the other solution treating units SC1 are resist film coating units (RESIST). Similarly, solution treating units SC2-SC4 on stories K2-K4 are coating units (RESIST/BARC) which apply the antireflection film material and resist film material, respectively. Solution treating units SC5-SC8 on stories K5-K8 are developing units.

In the modified embodiment shown in FIG. 32C, solution treating units SC1-SC8 on stories K1-K8 are coating units (RESIST/BARC) which apply the antireflection film material and resist film material, respectively. For example, a plurality of solution treating units SC1 are provided for the story K1, in which part of the solution treating units SC1 are antireflection film coating units (BARC), and the other solution treating units SC1 are resist film coating units (RESIST).

(3) In Embodiments 1 and 2 described hereinbefore, the treating solutions used in the solution treating units SC may be changed as appropriate. For example, treating liquids may be a cleaning liquid and chemical solutions. In Embodiments 1 and 2 described hereinbefore, the series of treatments performed for the wafers W may be changed as appropriate.

(4) In Embodiments 1 and 2 described hereinbefore, the blocks BD and BE may be omitted. Such modified embodiment can also reduce the influence of the heat-treating units HA in the front heat-treating block BA exerted on the solution treating units SC.

(5) Changes may be made to combine the various components of the foregoing embodiments and modified embodiments as appropriate.

This invention may be embodied in other specific forms without departing from the spirit or essential attributes thereof and, accordingly, reference should be made to the appended claims, rather than to the foregoing specification, as indicating the scope of the invention.

What is claimed is:
1. A substrate treating apparatus comprising:
an indexer section;
a treating section; and
a controller;
the treating section including:
   a front heat-treating block;
   a front relay block;
   a solution treating block;
   a rear relay block; and
   a rear heat-treating block;
the front heat-treating block including:
   heat-treating units configured to heat-treat substrates; and
   main transport mechanisms configured to transport the substrates to the heat-treating units of the front heat-treating block;
the front relay block including:
   receivers configured to receive the substrates; and
   transport mechanisms configured to transport the substrates to the receivers of the front relay block;
the solution treating block including:
   solution treating units configured to perform solution treatment of the substrates; and
   transport mechanisms for solution treatment configured to transport the substrates to the solution treating units;
the rear relay block including:
   receivers configured to receive the substrates; and
   transport mechanisms configured to transport the substrates to the receivers of the rear relay block;
the rear heat-treating block including:
   heat-treating units configured to heat-treat the substrates; and
   main transport mechanisms configures to transport the substrates to the heat-treating units of the rear heat-treating block;
wherein
the indexer section and the treating section are connected to be able to transport the substrates reciprocally;
the front heat-treating block and the front relay block are connected to be able to transport the substrates reciprocally;
the front relay block and the solution treating block are connected to be able to transport the substrates reciprocally;
the front relay block is disposed between the solution treating block and the front heat-treating block;

the solution treating block a rear relay block are connected to be able to transport the substrates reciprocally;
the rear relay block and the rear heat-treating block are connected to be able to transport the substrates reciprocally;
the rear relay block disposed between the solution treating block and the rear heat-treating block; and
the controller controls operation of the main transport mechanisms of the front heat-treating block, the transport mechanisms of the front relay block, the transport mechanisms of the solution treating block, the transport mechanisms of the rear relay block and the main transport mechanisms of the rear heat-treating block.

2. The substrate treating apparatus according to claim 1, wherein, in plan view, the front heat-treating block, the front relay block and the solution treating block are aligned in this order.

3. The substrate treating apparatus according to claim 1, wherein:
the front heat-treating block has a transporting space in which the main transport mechanisms of the front heat-treating block are installed;
the solution treating block has a transporting space in which the transport mechanisms for solution treatment are installed; and
the receivers of the front relay block are arranged between the transporting space of the front heat-treating block and the transporting space of the solution treating block.

4. The substrate treating apparatus according to claim 1, wherein:
the main transport mechanisms of the front heat-treating block include:
a first main transport mechanism configured to transport the substrates to the heat-treating units of the front heat-treating block; and
a second main transport mechanism configured to transport the substrates to the heat-treating units of the front heat-treating block;
the transport mechanisms of the front relay block include:
a first transport mechanism configured to transport the substrates to the receivers of the front relay block; and
a second transport mechanism configured to transport the substrates to the receivers of the front relay block;
the transport mechanisms for solution treatment of the solution treating block include:
a first transport mechanism for solution treatment configured to transport the substrates to the solution treating units; and
a second transport mechanism for solution treatment configured to transport the substrates to the solution treating units;
the first main transport mechanism of the front heat-treating block, the first transport mechanism of the front relay block and the first transport mechanism for solution treatment of the solution treating block transport first substrates; and
the second main transport mechanism of the front heat-treating block, the second transport mechanism of the front relay block and the second transport mechanism for solution treatment of the solution treating block transport second substrates different from the first substrates.

5. The substrate treating apparatus according to claim 1, wherein:
the heat-treating units of the front heat-treating block include:
a plurality of first heat-treating units configured to heat-treat first substrates; and
a plurality of second heat-treating units configured to heat-treat second substrates different from the first substrates;
the receivers of the front relay block include:
at least one first receiver configured to receive the first substrates; and
at least one second receiver configured to receive the second substrates; and
the solution treating units include:
a plurality of first solution treating units configured to perform solution treatment of the first substrates; and
a plurality of second solution treating units configured to perform solution treatment of the second substrates.

6. The substrate treating apparatus according to claim 1, wherein, in plan view, the front heat-treating block, the front relay block, the solution treating block, the rear relay block and the rear heat-treating block are aligned in this order.

7. The substrate treating apparatus according to claim 1, wherein:
the front heat-treating block has a transporting space in which the main transport mechanisms of the front heat-treating block are installed;
the solution treating block has a transporting space in which the transport mechanisms for solution treatment are installed;
the rear heat-treating block has a transporting space in which the main transport mechanisms of the rear heat-treating block are installed;
the receivers of the front relay block are arranged between the transporting space of the front heat-treating block and the transporting space of the solution treating block; and
the receivers of the rear relay block are arranged between the transporting space of the solution treating block and the transporting space of the rear heat-treating block.

8. The substrate treating apparatus according to claim 1, wherein:
the main transport mechanisms of the front heat-treating block include:
a first main transport mechanism configured to transport the substrates to the heat-treating units of the front heat-treating block; and
a second main transport mechanism configured to transport the substrates to the heat-treating units of the front heat-treating block;
the transport mechanisms of the front relay block include:
a first transport mechanism configured to transport the substrates to the receivers of the front relay block; and
a second transport mechanism configured to transport the substrates to the receivers of the front relay block;
the transport mechanisms for solution treatment of the solution treating block include:
a first transport mechanism for solution treatment configured to transport the substrates to the solution treating units; and
a second transport mechanism for solution treatment configured to transport the substrates to the solution treating units;

the transport mechanisms of the rear relay block include:
  a first transport mechanism configured to transport the substrates to the receivers of the rear relay block; and
  a second transport mechanism configured to transport the substrates to the receivers of the rear relay block;
the main transport mechanisms of the rear heat-treating block include:
  a first main transport mechanism configured to transport the substrates to the heat-treating units of the rear heat-treating block; and
  a second main transport mechanism configured to transport the substrates to the heat-treating units of the rear heat-treating block;
the first main transport mechanism of the front heat-treating block, the first transport mechanism of the front relay block, the first transport mechanism for solution treatment of the solution treating block, the first transport mechanism of the rear relay block and the first main transport mechanism of the rear heat-treating block transport first substrates; and
the second main transport mechanism of the front heat-treating block, the second transport mechanism of the front relay block, the second transport mechanism for solution treatment of the solution treating block, the second transport mechanism of the rear relay block and the second main transport mechanism of the rear heat-treating block transport second substrates different from the first substrates.

9. The substrate treating apparatus according to claim 1, wherein:
the heat-treating units of the front heat-treating block include:
  a plurality of first heat-treating units configured to heat-treat first substrates; and
  a plurality of second heat-treating units configured to heat-treat second substrates;
the receivers of the front relay block include:
  at least one first receiver configured to receive the first substrates; and
  at least one second receiver configured to receive the second substrates;
the solution treating units include:
  a plurality of first solution treating units configured to perform solution treatment of the first substrates; and
  a plurality of second solution treating units configured to perform solution treatment of the second substrates;
the receivers of the rear relay block include:
  at least one first receiver configured to receive the first substrates; and
  at least one second receiver configured to receive the second substrates; and
the heat-treating units of the rear heat-treating block include:
  a plurality of first heat-treating units configured to heat-treat the first substrates; and
  a plurality of second heat-treating units configured to heat-treat the second substrates.

10. A substrate treating apparatus comprising:
an indexer section;
a treating section; and
a controller;
the treating section including:
  a front heat-treating block;
  a front relay block; and
  a solution treating block;
the front heat-treating block including:
  heat-treating units configured to heat-treat substrates; and
  main transport mechanisms configured to transport the substrates to the heat-treating units of the front heat-treating block;
the front relay block including:
  receivers configured to receive the substrates; and
  transport mechanisms configured to transport the substrates to the receivers of the front relay block;
the solution treating block including:
  solution treating units configured to perform solution treatment of the substrates; and
  transport mechanisms for solution treatment configured to transport the substrates to the solution treating units;
wherein
the indexer section and the treating section are connected to be able to transport the substrates reciprocally;
the front heat-treating block and the front relay block are connected to be able to transport the substrates reciprocally;
the front relay block and the solution treating block are connected to be able to transport the substrates reciprocally;
the front relay block is disposed between the solution treating block and the front heat-treating block;
the controller controls operation of the main transport mechanisms of the front heat-treating block, the transport mechanisms of the front relay block and the transport mechanisms of the solution treating block;
the plurality of receivers of the front relay block are arranged in an up-down direction;
the plurality of transport mechanisms of the front relay block are arranged laterally of the receivers of the front relay block;
the plurality of transport mechanisms for solution treatment are arranged in the up-down direction; and
the receivers of the front relay block are arranged so that each of the transport mechanisms for solution treatment is opposed to at least one of the receivers of the front relay block.

11. The substrate treating apparatus according to claim 10, wherein:
the plurality of main transport mechanisms of the front heat-treating block are arranged in one of the up-down direction and a transverse direction; and
the receivers of the front relay block are arranged so that each of the main transport mechanisms of the front heat-treating block is opposed to at least one of the receivers of the front relay block.

12. The substrate treating apparatus according to claim 11, wherein at least one of the receivers of the front relay block is disposed in a position opposed to both of at least one of the main transport mechanisms of the front heat-treating block and at least one of the transport mechanisms for solution treatment of the solution treating block.

13. The substrate treating apparatus according to claim 11, wherein:
the front heat-treating block includes a plurality of receivers configured to receive the substrates;
the plurality of receivers of the front heat-treating block are arranged in the up-down direction laterally of the main transport mechanisms of the front heat-treating block; and
the receivers of the front heat-treating block are arranged so that each of the transport mechanisms of the front relay block is opposed to at least one of the receivers of the front heat-treating block.

14. The substrate treating apparatus according to claim 13, wherein:
the receivers of the front heat-treating block are open to an indexer section connected to the front heat-treating block; and
the main transport mechanisms of the front heat-treating block and the indexer section transport the substrates reciprocally through the receivers of the front heat-treating block.

15. The substrate treating apparatus according to claim 13, wherein at least one of the receivers of the front heat-treating block is opposed to at least one of transport mechanisms of the front relay block, and is open to an indexer section connected to the front heat-treating block.

16. The substrate treating apparatus according to claim 10, wherein the solution treating units include coating units configured to coat the substrates with a coating film material, and developing units configured to supply a developer to the substrates.

17. The substrate treating apparatus according to claim 10, wherein the front relay block includes an in-buffer configured to accumulate substrates to be treated in the substrate treating apparatus, and an out-buffer configured to accumulate substrates having undergone a series of treatments in the substrate treating apparatus.

\* \* \* \* \*